United States Patent
Yoshihara et al.

(10) Patent No.: US 6,909,132 B2
(45) Date of Patent: Jun. 21, 2005

(54) SEMICONDUCTOR DEVICE AND ITS MANUFACTURING METHOD

(75) Inventors: Ikuo Yoshihara, Mie (JP); Wataro Futo, Mie (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/350,420

(22) Filed: Jan. 24, 2003

(65) Prior Publication Data

US 2003/0132525 A1 Jul. 17, 2003

Related U.S. Application Data

(63) Continuation of application No. 09/689,392, filed on Oct. 12, 2000, now abandoned.

(30) Foreign Application Priority Data

Oct. 13, 1999 (JP) .......................... P11-291066
Sep. 12, 2000 (JP) ........................ P2000-275912

(51) Int. Cl.$^7$ ...................... H01L 21/108; H01L 31/119
(52) U.S. Cl. ...................... 257/296; 257/382; 257/760; 257/68; 257/69; 257/74
(58) Field of Search ................................ 257/296, 382, 257/760, 68, 69, 74

(56) References Cited

U.S. PATENT DOCUMENTS

| 5,550,076 | A | * | 8/1996 | Chen ......................... 437/52 |
| 5,767,541 | A | * | 6/1998 | Hanagasaki ................ 257/295 |
| 6,018,180 | A | * | 1/2000 | Cheek et al. ............... 257/344 |
| 6,104,059 | A | * | 8/2000 | Ono ............................. 257/320 |

FOREIGN PATENT DOCUMENTS

| JP | 7-130873 | 5/1995 |
| JP | 10-79430 | 3/1998 |

OTHER PUBLICATIONS

Hagiwara, "Microelectronics for Home Entertainment," Society ESSCIR2001, Villach, Austria, Sep. 9, 2001 (9 pages).

* cited by examiner

Primary Examiner—Allan R. Wilson
Assistant Examiner—Joseph Nguyen
(74) Attorney, Agent, or Firm—Sonnenschein, Nath & Rosenthal LLP

(57) ABSTRACT

In a contact structure having a large aspect ratio in a LSI device incorporating DRAM cells and logics, for the purpose of preventing over-etching of a device isolation insulating film and an impurity diffusion layer and thereby minimizing junction leakage, a first etching stopper layer covering a peripheral MOS transistor and a second etching stopper layer overlying a capacitor section of a DRAM memory cell are formed. An impurity diffusion layer of the peripheral MOS transistor is connected to a metal wiring layer formed in an upper level of the capacitor section by an electrode layer extending through the first and second etching stopper layers. At least one of such impurity diffusion layers is connected to the electrode layer at its boundary with the device isolation insulating film, and depth of the bottom of the electrode layer formed on the device isolation insulating film from the surface of the impurity diffusion layer is shorter than the junction depth of the impurity diffusion layer.

16 Claims, 39 Drawing Sheets

$t_s$: DEPTH OF BOTTOM OF ELECTRODE FORMED ON DEVICE ISOLATION INSULATING FILM $t_J$: JUNCTION DEPTH OF IMPURITY DIFFUSED LAYER $t_S$: DEPTH OF BOTTOM OF ELECTRODE FORMED ON DEVICE ISOLATION INSULATING FILM $t_L$: DEPTH OF BOTTOM OF DEVICE ISOLATION INSULATING FILM

RATIO OF TOTAL THICKNESS OF SILICON NITRIDE FILM
(= THICKNESS OF SIDE WALL NITRIDE +
   THICKNESS OF FIRST ETCHING STOPPER)
TO PITCH OF WORD TRANSISTOR OF DRAM MEMORY CELL $t_1$: THICKNESS OF FIRST ETCHING STOPPER LAYER $t_s$: DEPTH OF BOTTOM OF ELECTRODE FORMED ON DEVICE ISOLATION INSULATING FILM $t_J$: JUNCTION DEPTH OF IMPURITY DIFFUSED LAYER $t_S$: DEPTH OF BOTTOM OF ELECTRODE FORMED ON DEVICE ISOLATION INSULATING FILM $t_L$: DEPTH OF BOTTOM OF DEVICE ISOLATION INSULATING FILM

SEMICONDUCTOR DEVICE AND ITS MANUFACTURING METHOD

CROSS-REFERENCE TO RELATED APPLICATIONS

This application is based upon and claims priority of U.S. patent application Ser. No. 09/689,392 filed on Oct. 12, 2000 now abandoned that claims priority of Japanese Patent Applications No. P11-291066, filed in Oct. 13, 1999, and Japanese Patent Application No. P2000-275912 filed in Sep. 12, 2000, the contents being incorporated herein by reference.

BACKGROUND OF THE INVENTION

1. Field of the Invention

This invention relates to a semiconductor device and its manufacturing method and, more particularly, to a device structure and its manufacturing method for reliably making a contact connecting a metal wiring layer formed in an upper level of a capacitor of DRAM to an impurity diffusion layer and a gate electrode formed on a semiconductor substrate without increasing the junction leakage.

2. Description of the Related Art

A conventional LSI device incorporating DRAM cells and logics is explained below with reference to FIGS. 1, 2, 3A and 3B.

FIG. 2 is an enlarged cross-sectional view of a single MOS transistor and a portion around it. As shown in FIG. 2, a contact hole 94 is formed on a semiconductor substrate 91 to connect a metal wiring layer (not shown) formed in an upper level of a DRAM cell to an impurity diffusion layer 93 and a gate electrode 92 formed on the semiconductor substrate 91. For making a high-density structure, a capacitor of a DRAM memory cell must be high in dimension in order to keep a large capacity without increasing the area occupied by the capacitor. For this purpose, a very deep contact has to be made, requiring a long etching process. During a long etching process, the contact hole 94 is liable to be excessively etched.

As shown in FIG. 2, aspect ratio of the contact hole 94 ("depth of the contact" to "diameter of the contact hole") is 5 to 10, and it is very difficult to make it without undesirably etching the impurity diffusion layer 93 and a device isolation film (not shown) of the semiconductor substrate 91. At worst, an aperture is made beyond the junction interface, inviting an increase of the junction leakage.

Taking it into consideration, Japanese Patent Laid-Open Publication No. Hei 10-79430 discloses a technique, as an improvement, which makes an impurity diffusion layer by making a silicon nitride film as an etching stopper layer in a contact opening on a semiconductor substrate, without scraping it, and thereby prevents an increase of the junction leakage.

On the other hand, as shown in FIG. 1, in an LSI device incorporating DRAM cells and logics, it is not possible to keep a large margin for facilitating alignment between the impurity diffusion layer 93 and the contact hole 94 connected thereto. Thus, as shown in FIG. 1, the contact hole 94 might open at the boundary between the impurity diffusion layer 93 and a device isolation insulating film 95.

In this case, if the etching stopper layer formed just above the impurity diffusion layer 93 does not have a sufficient thickness, the device isolation insulating film 95 will be also etched. And, if it is etched deeply beyond the surface of the impurity region, it causes junction leakage. In order to prevent junction leakage, a thick etching stopper has to be made.

However, as shown in FIGS. 3A and 3B, if the etching stopper layer 96 is thick, it invites generation of a void (empty space) 98 in an inter-layer insulating film 97 stacked later. Alternatively, if a nitride film is used as the etching stopper film 96, it results in increasing the inter-wiring capacitance as much as its high dielectric constant, and ultimately prevents improvement of the device speed. FIGS. 3A and 3B are diagrams explaining problems involved in the conventional technique, and they schematically show cross-sectional configurations of a major part of the device.

As shown in FIG. 3A, insulating film side walls 910 are formed at opposite sides of each gate electrode 99. If the etching stopper film (silicon nitride film) 96 formed thereafter over the entire surface is thin, the space between gate electrodes can be readily buried by ordinary CVD (chemical vapor deposition). Also when the inter-layer insulating film 97 is formed above the etching stopper film, ample space remains between the gate electrodes 99.

However, in the case where the thickness of the etching stopper film 96 is increased as shown in FIG. 3B for the purpose of enhancing its function, the gap between the gate electrode 99 is extremely narrowed like a slit. Therefore, when the inter-layer insulating film 97 is made later by CVD, a void 98 is produced, and the gap cannot be buried even by a heating reflow technique. Once a void 98 is made in the inter-layer insulating film 97 due to a thick etching stopper film 96, poly-silicon electrodes in self-aligned contact portions in DRAM cells are short-circuited via the void 98, seriously degrading the production yield.

Although the earlier Japanese Patent Laid-Open Publication No. Hei 10-79430 does not teach making the etching stopper layer 96 as an intermediate layer of the inter-layer insulating film 97, Japanese Patent Laid-Open Publication No. Hei 7-13087 discloses a technique for making a stopper layer against isotropic etching conducted upon making a cylinder-type capacitor. By combining these two earlier techniques, it would be easy to invent making an etching stopper layer as an intermediate layer. However, there is no teaching about a multi-layered configuration of the etching layer, and even if it is merely divided into two layers, when the lowest first etching stopper layer is thick, voids are produced in the above-mentioned DRAM-cell burying process, e.g, upon making an inter-layer insulating film.

OBJECT AND SUMMARY OF THE INVENTION

It is therefore an object of the invention to prevent junction leakage in an LSI device incorporating DRAM cells and logics by preventing undesirable etching of a device isolation insulating film and an impurity diffusion layer upon making a contact hole with a large aspect ratio for connecting a metal layer to the impurity diffusion layer and a gate electrode formed on a semiconductor substrate, even if there is an alignment error of the hole relative to the impurity diffusion layer. It is a further object of the invention to prevent generation of voids in a DRAM cell burying process for making a first etching stopper layer.

According to the invention, there is provided a semiconductor device including a DRAM memory cell and a peripheral MOS transistor, including an insulating film being formed as a first etching stopper layer to cover a surface including a gate electrode of the peripheral MOS transistor. The device also includes a second etching stopper layer formed in at least one of upper and lower levels of a capacitor section of the DRAM memory cell. The impurity diffusion layer and the gate electrode of the peripheral MOS transistor are connected to a metal wiring layer formed in an upper level of the capacitor section of the DRAM memory cell by an electrode layer extending through the first etching stopper layer and the second etching stopper. Further, at least one of such impurity diffusion layers are connected to the electrode layer at a boundary between the impurity diffusion layer and a device isolation insulating film, and the depth of a bottom portion of the electrode layer formed on the device isolation insulating film from a surface of the impurity diffusion layer is shorter than one of a junction depth of the impurity diffusion layer and thickness of the first etching stopper layer. Alternatively, the multi-layered film of the side wall forming layer of the peripheral MOS transistor and the first etching stopper layer having a thickness ranging from ¼ to ½ of the minimum distance between word transistors in the region for the DRAM memory cell.

According to the invention, there is further provided a semiconductor device including a DRAM memory cell and a peripheral MOS transistor including an insulating film formed as a first etching stopper layer to cover an impurity diffusion region and a gate electrode in a peripheral MOS transistor region. The device also includes a second etching stopper layer formed in an upper level and/or a lower level of a capacitor section of the DRAM memory cell. The impurity diffusion layer and the gate electrode of the peripheral MOS transistor are connected to a metal wiring layer formed in an upper level of the capacitor section of the DRAM memory cell by an electrode layer extending through the first etching stopper layer and the second etching stopper. Further, at least one of such impurity diffusion layers is connected to the electrode layer at a boundary between the impurity diffusion layer and a device isolation insulating film, and the depth of a bottom portion of the electrode layer formed on the device isolation insulating film from a surface of the impurity diffusion layer is shorter than junction depth of the impurity diffusion layer.

In another embodiment of the semiconductor device according to the invention, at least one of such impurity diffusion layers is connected to the electrode layer at a boundary between the impurity diffusion layer and a device isolation insulating film. In this embodiment, the depth of a bottom portion of the electrode layer formed on the device isolation insulating film from a surface of the impurity diffusion layer is shorter than the thickness of the first etching stopper layer.

In yet another embodiment of the semiconductor device according to the invention, the multi-layered film of the side wall forming layer of the peripheral MOS transistor and the first etching stopper layer has a thickness ranging from ¼ to ½ of the minimum distance between word transistors in the region for the DRAM memory cell.

In another embodiment of the semiconductor device according to the invention, the multi-layered film of the side wall forming layer of the peripheral MOS transistor and the first etching stopper layer has a thickness ranging from ¼ to ⅓ of the minimum distance between word transistors in the region for the DRAM memory cell.

In still another embodiment of the semiconductor device according to the invention, at least one of the gate electrodes of the peripheral MOS transistor is connected to the electrode layer extending through the first etching stopper layer and the second etching stopper layer at a boundary between the gate electrode and a side wall insulating film formed on a side wall of the gate electrode. In this embodiment, the depth of a bottom portion of the electrode layer formed on the side wall insulating film from the upper surface of the device isolation insulating film is shorter than the depth of a bottom portion of the device isolation insulating film.

According to the invention, there is further provided a semiconductor device including a DRAM memory cell and a peripheral MOS transistor including an insulating film being formed as a first etching stopper layer to cover an impurity diffusion region. The device also includes a gate electrode in a peripheral MOS transistor region and a second etching stopper layer formed in an upper level and/or a lower level of a capacitor section of the DRAM memory cell. At least one of the electrode layers connected to a bit line of the DRAM memory cells through the second etching stopper layer is located on a device isolation insulating film. Further, the depth of a bottom portion of the electrode layer from a surface of the device isolation insulating film is shorter than the thickness of the device isolation insulating film.

In another embodiment of the semiconductor device according to the invention, at least one of electrode layers connected to a bit line of the DRAM memory cells through the second etching stopper layer is located on an impurity diffusion region and the depth of a bottom portion of an electrode layer reaching the impurity diffusion region through the first etching stopper layer among the electrodes placed on the impurity diffusion region from a surface of the impurity diffusion region is shorter than the junction depth of the impurity diffusion region. Further, the impurity diffusion layer connected to the electrode layer and a bit line of the DRAM memory cell are equal in potential.

According to the invention, there is further provided a method of manufacturing a semiconductor having a DRAM memory cell and a peripheral MOS transistor by making a word transistor of the DRAM memory cell and the peripheral MOS transistor on a semiconductor substrate having formed a device isolation insulating film and device forming regions, stacking an inter-layer insulating film different from the first etching stopper layer on the first etching stopper layer to smooth the entirety by burying a space between work transistors of the DRAM memory cells and forming a second etching stopper layer on the inter-layer insulating film. The method also includes forming a capacitor of the DRAM memory cell on the second etching stopper layer, forming an insulating film on the capacitor and forming an aperture on the insulating film by etching and interrupting the etching at the second etching stopper layer. The method further includes removing the second etching stopper layer and the inter-layer insulating film from the aperture by etching and interrupting the etching at the first etching stopper layer, removing the first etching stopper layer from the aperture by etching and forming at least one of such apertures on a boundary between the impurity diffusion layer and the device isolation insulating film. The method also includes adjusting the depth of the bottom of the aperture from an upper surface of the device isolation insulating film to be smaller than the junction depth of the impurity diffusion layer or smaller than a depth of the first stopper layer. The method also includes forming an electrode layer inside the aperture and forming a metal wiring layer connected to the electrode layer.

According to the invention, there is further provided a method of manufacturing a semiconductor having a DRAM memory cell and a peripheral MOS transistor by making a gate electrode of a word transistor of the DRAM memory cell and a gate electrode of the peripheral MOS transistor on a semiconductor substrate having formed a device isolation insulating film and device forming regions, stacking an insulating film which covers the gate electrode of the word transistor of the DRAM memory cell and the gate electrode of the peripheral MOS transistor and becomes a side wall forming layer, then conducting anisotropic of the side wall forming region only in a region for making the peripheral MOS transistor to form a side wall on a gate side wall of the peripheral MOS transistor and to maintain the side wall forming layer in a region for making the DRAM memory cell. The method also includes forming an insulating film to be used as a first etching stopper layer on an impurity diffusion region and a gate electrode in the region of the peripheral MOS transistor region such that the thickness of a multi-layered film of the side wall forming layer and the first etching stopper layer becomes a thickness ranging from ¼ to ½ of the minimum distance between word transistors of the DRAM memory cells. The method also includes stacking an inter-layer insulating film different from the first etching stopper layer on the first etching stopper layer to smooth the entirety by burying a space between word transistors of the DRAM memory cell, forming a second etching stopper layer on the inter-layer insulating film and forming a capacitor of the DRAM memory cell on the second etching stopper layer. The method also includes forming an insulating film on the capacitor, forming an aperture on the insulating film by etching, interrupting the etching at the second etching stopper layer and removing the second etching stopper layer and the inter-layer insulating film from the aperture by etching, and interrupting the etching at the first etching stopper layer. The method further includes removing the first etching stopper layer from the aperture by etching, forming an electrode layer inside the aperture and forming a metal wiring layer connected to the electrode layer.

In another embodiment of the manufacturing method according to the invention, the insulating film formed as the first etching stopper layer is formed so that the thickness of the multi-layered film made by the side wall forming layer and the first etching stopper layer is in the range of ¼ to ⅓ of the minimum distance between word transistors of the DRAM memory cells.

In another embodiment of the manufacturing method according to the invention, at least one of such apertures is formed on a boundary between the gate electrode and the side wall insulating film, and the depth of the bottom of the aperture formed on the side wall insulating film from an upper surface of the device isolation insulating film is smaller than the depth of the device isolation insulating film.

In yet another embodiment of the manufacturing method according to the invention, the method includes forming a capacitor of the DRAM memory cell on the second etching stopper layer, forming an insulating film on the capacitor and forming a first aperture on the insulating film to the gate electrode of the peripheral MOS transistor. The method also includes once interrupting the etching at the second etching stopper layer, removing the second etching stopper layer and the inter-insulating film from the first aperture, and once stopping the etching at the first etching stopper layer. The method further includes removing the first etching stopper layer from the first aperture, forming a second aperture on the insulating film on the capacitor and on an impurity diffusion region of the peripheral MOS transistor, and once stopping the etching at the second etching stopper layer. The method further includes removing the second etching stopper layer and the inter-layer insulating film from the second aperture, once stopping the etching at the etching stopper layer and removing the first etching stopper layer from the second aperture. The method further includes forming an electrode layer in the first aperture and the second aperture and forming a metal wiring layer connected to the electrode layer.

In still another embodiment of the manufacturing method according to the invention, the method includes forming an insulating film removable by isotropic etching on the second etching stopper layer, selectively forming an aperture in the insulating film removable by isotropic etching, and forming a capacitor lower electrode of the DRAM memory cell inside a guide aperture. The method also includes removing the insulating film removable by isotropic etching, using the second etching stopper layer as a stopper of isotropic etching, forming a capacitor dielectric film and a capacitor upper electrode on the capacitor lower electrode and forming an insulating film on the capacitor upper electrode. The method further includes forming an aperture on the insulating film, once stopping the etching at the second etching stopper layer, removing the second etching stopper layer and the inter-layer insulating film from the aperture by etching, and once stopping the etching at the first etching stopper layer. The method further includes removing the first etching stopper layer from the aperture by etching, forming an electrode layer in the aperture and forming a metal wiring layer connected to the electrode layer.

In another embodiment of the manufacturing method according to the invention, the method includes forming an electrode layer connected to an impurity diffusion region of the DRAM memory cell, forming an inter-layer insulating film covering the electrode layer, and forming a second etching stopper layer on the inter-insulating film. The method also includes forming an aperture in a location of the second etching stopper layer on the electrode layer connected to the impurity diffusion region of the DRAM memory cell, forming an etching mask having a smaller contact hole diameter than the aperture by forming a side wall on side walls of the aperture, and forming an aperture on the electrode layer connecting to the impurity diffusion region of the DRAM memory cell by etching using the etching mask. The method further includes forming a DRAM capacitor connected to the impurity diffusion region of the DRAM memory cell through the aperture on the electrode layer, forming an insulating film on the capacitor, forming an aperture in the insulating film on the capacitor, and in that process, once stopping the etching at the second etching stopper layer. The method further includes removing the second etching stopper layer and the inter-insulating film from the aperture, once stopping the etching at the first etching stopper layers removing the first etching stopper layer from the aperture by etching, forming an electrode layer in the aperture and forming a metal wiring layer connected to the electrode layer.

In another embodiment of the manufacturing method according to the invention, the method includes forming a capacitor dielectric film and a capacitor upper electrode on a capacitor lower electrode of the DRAM memory cell, and removing at least a part of the second etching stopper layer in the etching process of the capacitor upper electrode. The method also includes forming a third etching stopper layer on the capacitor lower electrode of the DRAM memory cell, forming an insulating film on the third etching stopper layer, forming an aperture on the insulating film, and once stopping the etching at the third etching stopper layer. The method further includes removing the third etching stopper layer and the inter-layer insulating film from the aperture, once stopping the etching at the first etching stopper layer, removing the first etching stopper layer from the aperture, forming an electrode layer in the aperture and forming a metal wiring layer connected to the electrode layer.

In the semiconductor device (LSI device) incorporating a DRAM cell and a logic, and its manufacturing method, a contact connecting a metal wiring layer formed in an upper level of the DRAM cell to an impurity diffusion layer and a gate electrode formed on a semiconductor substrate is once interrupted at a second etching stopper layer formed under a capacitor forming layer of the DRAM cell memory cell, and etching is stopped at a first etching stopper layer formed on the impurity diffusion layer and the gate electrode. Thereby, over-etching of the semiconductor substrate is prevented, and junction leakage is minimized.

A contact connecting a metal wiring layer formed in an upper level of a DRAM cell to the impurity diffusion layer and a gate electrode formed on a semiconductor substrate is once interrupted at a second etching stopper layer formed in a lower level of a capacitor forming region of the DRAM memory cell. As a result, fluctuation in thickness of the inter-layer insulating film can be reset once. Since the remainder inter-layer insulating films becomes uniform and thin in thickness, a first etching stopper layer formed on the impurity diffusion layer and the gate electrode can be made thinner than a second etching stopper layer. Therefore, upon burying the DRAM cell to make the first etching stopper layer, voids in the buried inter-layer insulating film can be prevented in the DRAM cell particularly between word transistors.

The etching stopper formed under the DRAM cell can be commonly used as an etching mask upon making a contact for connecting a capacitor of the DRAM cell to the substrate. Further, the etching stopper under the DRAM cell can be commonly used also as an etching stopper upon making a cylinder-type capacitor.

DETAILED DESCRIPTION OF THE PREFERRED EMBODIMENTS

An embodiment of the semiconductor device according to the invention is explained below with reference to FIGS. 4 through 7B. The semiconductor device according to the invention includes DRAM memory cells and peripheral MOS transistors.

Figure 4:
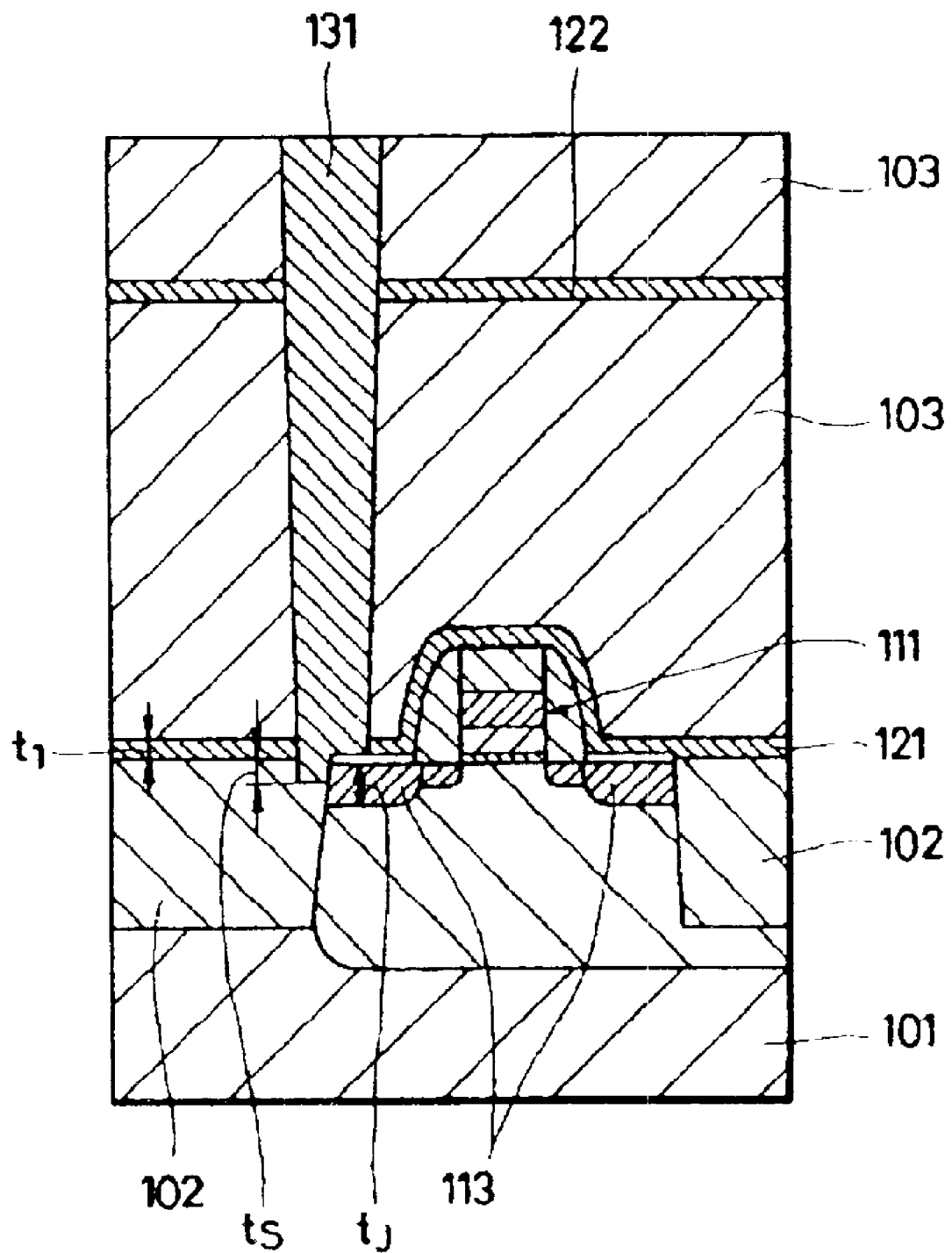
FIG. 4 is a cross-section of one embodiment of the device of the invention.

As shown in FIG. 4, a DRAM memory cell and a peripheral MOS transistor are formed in device-forming regions separated by a device isolation insulating film 102 on a semiconductor substrate 101. A first etching stopper layer 121 made of an insulating film is formed over a gate electrode 111 and impurity diffusion regions 113 of the MOS transistor region. At least one of the impurity diffusion regions 113 maybe a unitary impurity diffusion region. The first etching stopper layer 121 is made of, for example, a silicon nitride film. A second etching stopper layer 122 is formed in an upper level of a capacitor portion of the DRAM memory cell. The second etching stopper layer 122 is made of silicon nitride film, for example. Alternatively, although not shown, the second etching stopper layer 122 may be formed in a lower level of the capacitor portion of the DRAM memory cell, or in the upper and lower levels of the capacitor portion of the DRAM memory cell. Inter-layer insulating films 103 are formed between adjacent layers of the DRAM memory cell and the peripheral MOS transistor.

The impurity diffusion layers 113 of the peripheral MOS transistor are connected to a metal wiring layer (not shown) formed in an upper level of the capacitor portion of the DRAM memory cell by an electrode layer 131 extending through the second etching stopper layer 122 and the first etching stopper layer 121. Although not shown, a gate electrode of the peripheral MOS transistor is connected to the metal wiring layer by an electrode layer extending through the second etching stopper layer 122 and the first etching stopper layer 121.

For at least one of the impurity diffusion layers 113, the electrode layer 131 is connected on the boundary between this impurity diffusion layer 113 and the device isolation insulating film 102. Depth $t_s$ of the bottom of the electrode layer 131 formed on that device isolation insulating film 102 from the surface of the impurity diffusion layer 113 is smaller than depth $t_j$ of the junction of the impurity diffusion layer 113.

Since the first etching stopper layer 121 is stacked thinner than the impurity diffusion layer 113, that depth $t_s$ may be smaller than thickness $t_1$ of the first etching stopper layer 121.

Figure 5:
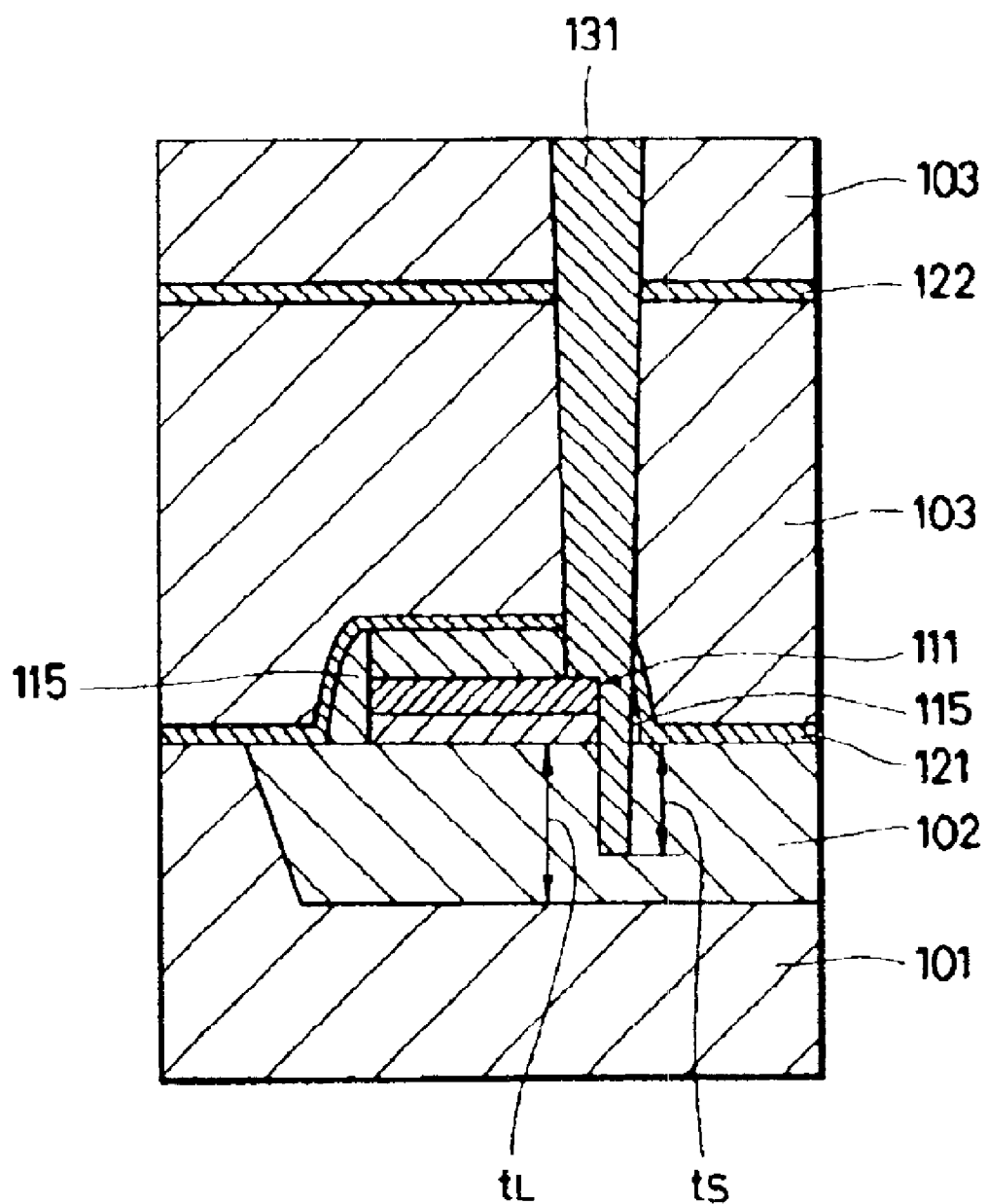
FIG. 5 is a cross-section of another embodiment of the device of the invention.

In the embodiment shown in FIG. 5, the semiconductor device includes DRAM memory cells and peripheral MOS transistors.

As shown in FIG. 5, a DRAM memory cell and a peripheral MOS transistor are formed in device-forming regions separated by a device isolation insulating film 102 on a semiconductor substrate 101. A first etching stopper layer 121 made of an insulating film is formed over a gate electrode 111, side walls 115 formed on the gate electrode 111 and impurity diffusion regions (not shown) of the MOS transistor region. The first etching stopper layer 121 is made of a silicon nitride film, for example. A second etching stopper layer 122 is formed in an upper level of a capacitor portion of the DRAM memory cell. The second etching stopper layer 122 is made of a silicon nitride film, for example. Alternatively, although not shown, the second etching stopper layer 122 may be formed in the lower level of the capacitor portion of the DRAM memory cell, or in the upper and lower levels of the capacitor portion of the DRAM memory cell. Inter-layer insulating films 103 are formed between adjacent layers of the DRAM memory cell and the peripheral MOS transistor.

A side wall forming layer of the peripheral MOS transistor and the first etching stopper layer 121 are stacked on a word transistor (not shown) in the DRAM memory cell region. For at least one of gate electrodes 111 of the peripheral MOS transistor, the electrode layer 131 is connected on the boundary between that gate electrode 111 and a side wall insulating film 115 made of the side wall forming layer. Depth $t_s$ of the bottom of the electrode layer 131 is formed on that side wall insulating film 115 from the surface of the device isolation insulating film 102 is smaller than depth $t_L$ of the bottom of the device isolation insulating film 102.

In the semiconductor devices explained with reference to FIGS. 4 and 5, it is possible to make the contact connecting the metal wiring layer to the impurity diffusion layer 113, gate electrode 111, and so on, by once interrupting it at the second etching stopper layer 122 and stopping the etching at the first etching stopper layer 121. Thereby, over-etching of the semiconductor substrate 101 and junction leakage is prevented.

Further, in any of those semiconductor devices, thickness of the multi-layered film of the side wall forming layer of the peripheral MOS transistor and the first etching stopper layer 121 ranges from ¼ to ½, or preferably ¼ to ⅓, of the minimum distance of word transistors in the DRAM memory cell region.

As explained above, since the second etching stopper layer 122 if formed, etching for making the contact connecting the metal wiring layer in an upper level of the DRAM cell to the impurity diffusion layer and the gate electrode formed on the semiconductor substrate stops once at the second etching stopper layer. As a result, fluctuation in thickness of the inter-layer insulating film can be reset once. Since thickness of the remainder inter-layer insulating film becomes more uniform and thinner, the first etching stopper layer 121 can be made thinner than the second etching stopper layer 122. Therefore, in the process of burying DRAM cells using the first etching stopper layer 121, generation of voids in the buried inter-layer insulating film especially between word transistors in DRAM cells can be prevented.

Additionally, a common film can be used both as the etching stopper formed under the DRAM cell and as an etching mask for making the contact connecting the capacitor of the DRAM cell and the semiconductor substrate 101. Further, the etching stopper under the DRAM cell can be commonly used as an etching stopper for making a cylinder-type capacitor as well.

Moreover, if an oxide film that can flow when heated is formed on the first etching stopper layer 121 in the DRAM memory cell region as an inter-layer insulating film, generation of voids in the buried inter-layer insulating film especially between word transistors can be prevented.

Figure 6A:
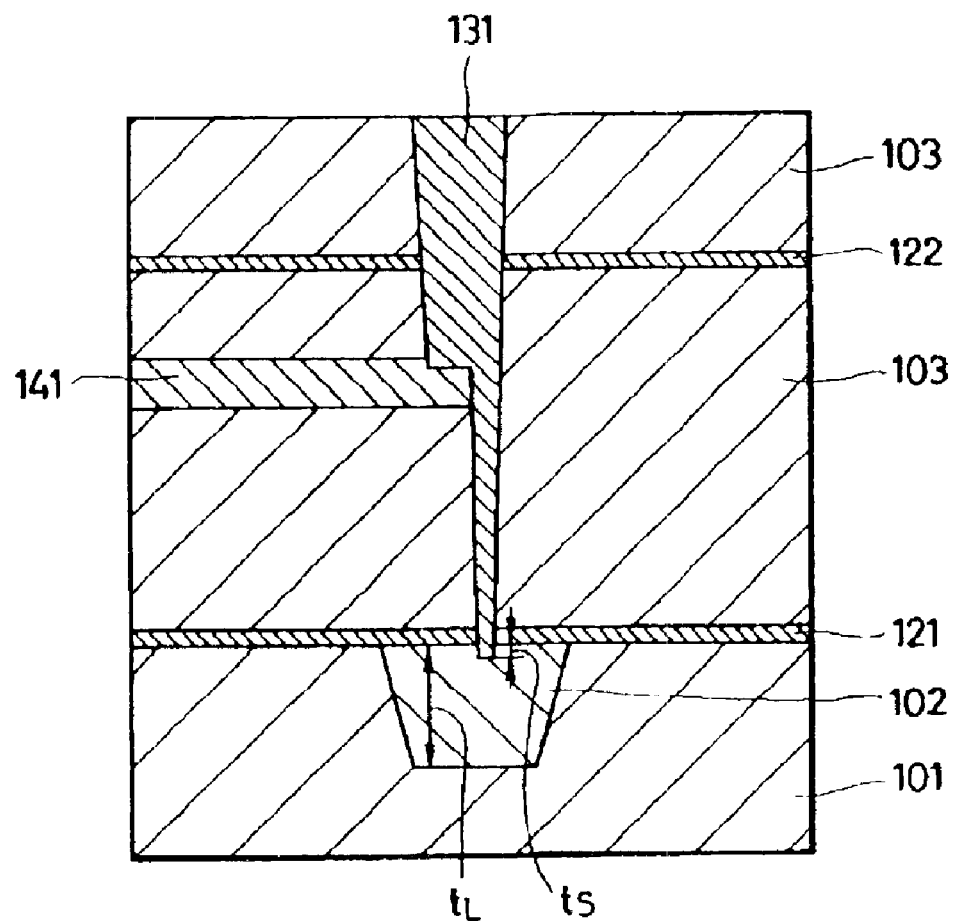
FIGS. 6A and 6B are a cross-section and a plan view of another embodiment of the device of the invention.
Figure 6B:
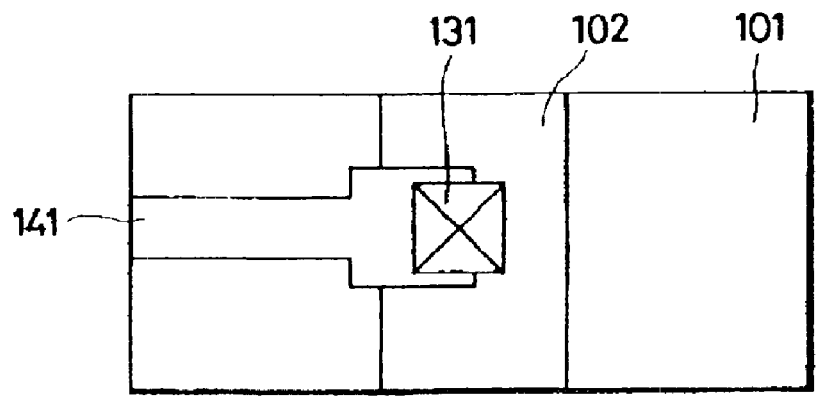

In the embodiment illustrated in FIGS. 6A and 6B, the semiconductor device includes DRAM memory cells and peripheral MOS transistors. As shown in FIGS. 6A and 6B, a DRAM memory cell and a peripheral MOS transistor are formed in device-forming regions separated by a device isolation insulating film 102 on a semiconductor substrate 101. A first etching stopper layer 121 made of an insulating film is formed to cover the peripheral MOS transistor. The first etching stopper layer 121 is made of a silicon nitride film, for example. A bit line 141 is formed in the DRAM memory cell region. A second etching stopper layer 122 made of a silicon nitride film, for example, is formed in an upper level of a capacitor portion of the DRAM memory cell. Alternatively, although not shown, the second etching stopper layer 122 may be formed in the lower level of the capacitor portion of the DRAM memory cell, or in the upper and lower levels of the capacitor portion of the DRAM memory cell. Inter-layer insulating films 103 are formed between adjacent layers of the DRAM memory cell and the peripheral MOS transistor.

Furthermore, an electrode layer 131 connected to the bit line 141 in the DRAM memory cell region through the second etching stopper layer 122 is placed on the device isolation insulating film 102. This electrode layer 131 is preferably formed only on the bit line 141. However, due to alignment error upon exposure, process errors, etc., the electrode layer 131 often spreads beyond the area of the bit line 141 as illustrated. In order to make contact even under this situation, the electrode layer 131 is located on the device isolation insulating film 102, and depth $t_s$ is smaller than depth $t_L$ of the bottom of the device isolation insulating film 102, as already explained.

Figure 7A:
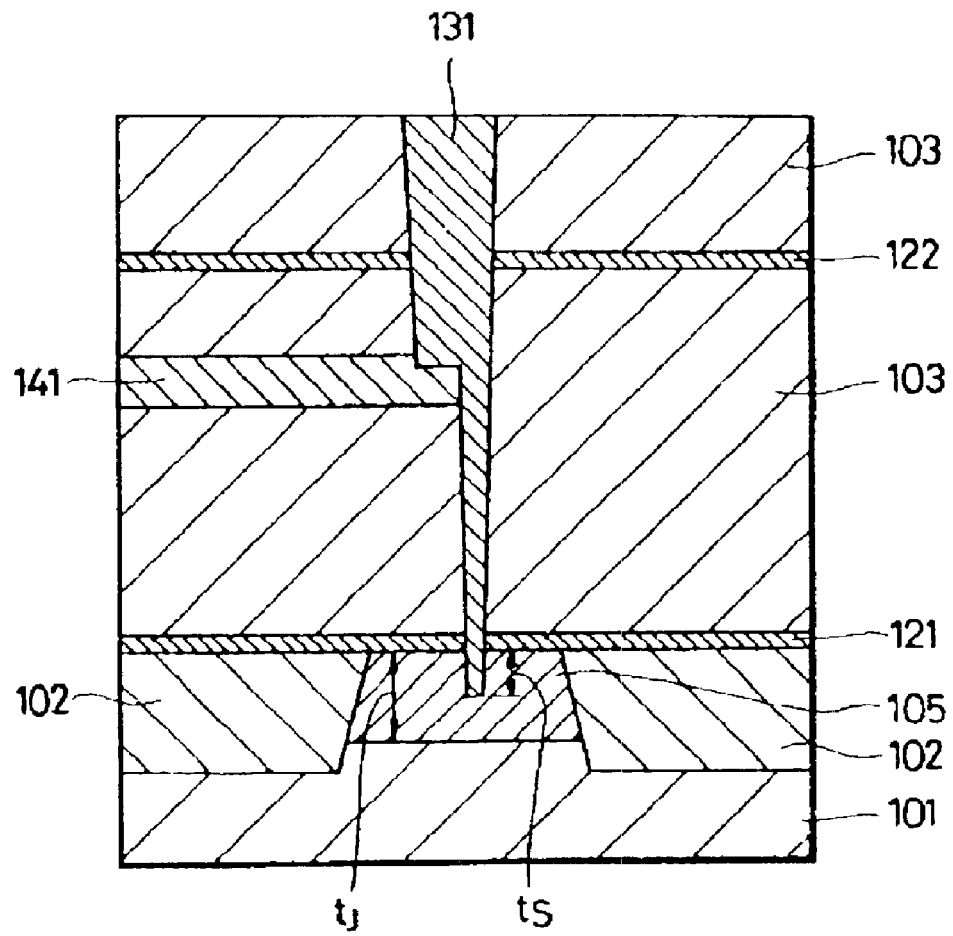
FIGS. 7A and 7B are a cross-section and a plan view of another embodiment of the device of the invention.
Figure 7B:
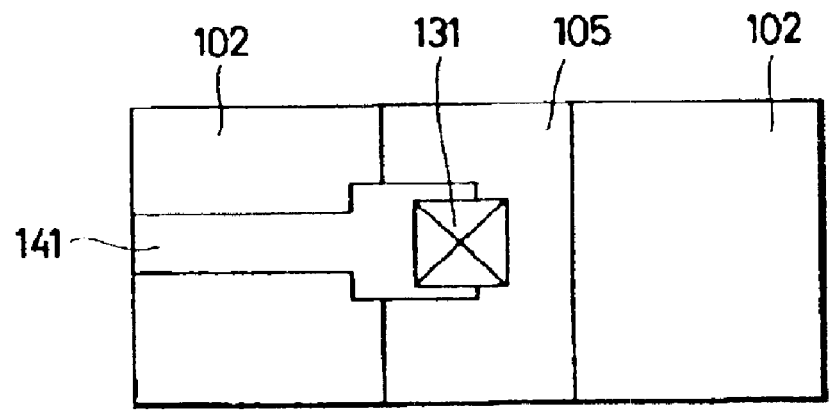

In another embodiment illustrated in FIGS. 7A and 7B the semiconductor device includes DRAM memory cells and peripheral MOS transistors. As shown in FIGS. 7A and 7B, an impurity diffusion region 105 separated by the device isolation insulating film 102 is formed on the semiconductor substrate 101. The first etching stopper layer 121 made of an insulating film is formed to cover the peripheral MOS transistor. The first etching stopper layer 121 is made of a silicon nitride film, for example. A bit line 141 is formed in the DRAM memory cell region. A second etching stopper layer 122 is made of a silicon nitride film, for example, is formed in an upper level of the capacitor section of the DRAM memory cell. Alternatively, although not shown, the second etching stopper layer 122 may be formed in the lower level of the capacitor portion of the DRAM memory cell, or in the upper and lower levels of the capacitor portion of the DRAM memory cell Inter-layer insulating films 103 are formed between adjacent layers of the DRAM memory cell and the peripheral MOS transistor.

Furthermore, an electrode layer 131 connected to the bit line 141 in the DRAM memory cell region through the second etching stopper layer 122 is placed on the device isolation insulating film 102. This electrode layer 131 is preferably formed only on the bit line 141. However, due to an alignment error upon exposure, process errors, etc., the electrode layer 131 often spreads beyond the area of the bit line 141 as illustrated. In order to make contact even in this situation, the electrode layer 131 is located on the impurity diffusion region 105 equal to the bit line 141 in potential, and depth $t_s$ is smaller than the junction depth $t_j$ of the impurity diffusion region 105.

In the semiconductor devices illustrated in FIGS. 6A through 7B, it is possible to once stop the bit contact at the second etching stopper layer 122 and stop the etching at the first etching stopper layer 121 even when the bit line 141 outspreads. Therefore, over-etching of the semiconductor substrate 101 and junction leakage is prevented.

Furthermore, in the semiconductor device shown in FIGS. 6A and 6B, the electrode layer 131 is located on the impurity diffusion region 105 equal to the bit line 141 in potential, and depth $t_s$ is shorter than the junction depth $t_j$ of the impurity diffusion region 105. Therefore, the bit contact is never formed to penetrate to the semiconductor substrate 101, and the electrode layer 131 is reliably formed to terminate at least within the impurity diffusion region 105. Additionally, since the impurity diffusion region 105 is equal to the bit line 141 in potential, even if the bit contact connects to the impurity diffusion region 105, no electric influence occurs.

In the semiconductor device shown in FIGS. 7A and 7B, the electrode 131 is located on the device isolation insulating film 102, and depth $t_s$ is shorter than the depth $t_L$ of the bottom of the device isolation insulating film 102. Therefore, the bit contact is never formed to penetrate to the semiconductor substrate 101, and the electrode layer 131 is reliably formed to terminate at least within the device isolation insulating film 102.

An embodiment of the semiconductor device manufacturing method according to the invention is illustrated sequentially in FIGS. 8 through 36.

Figure 8:
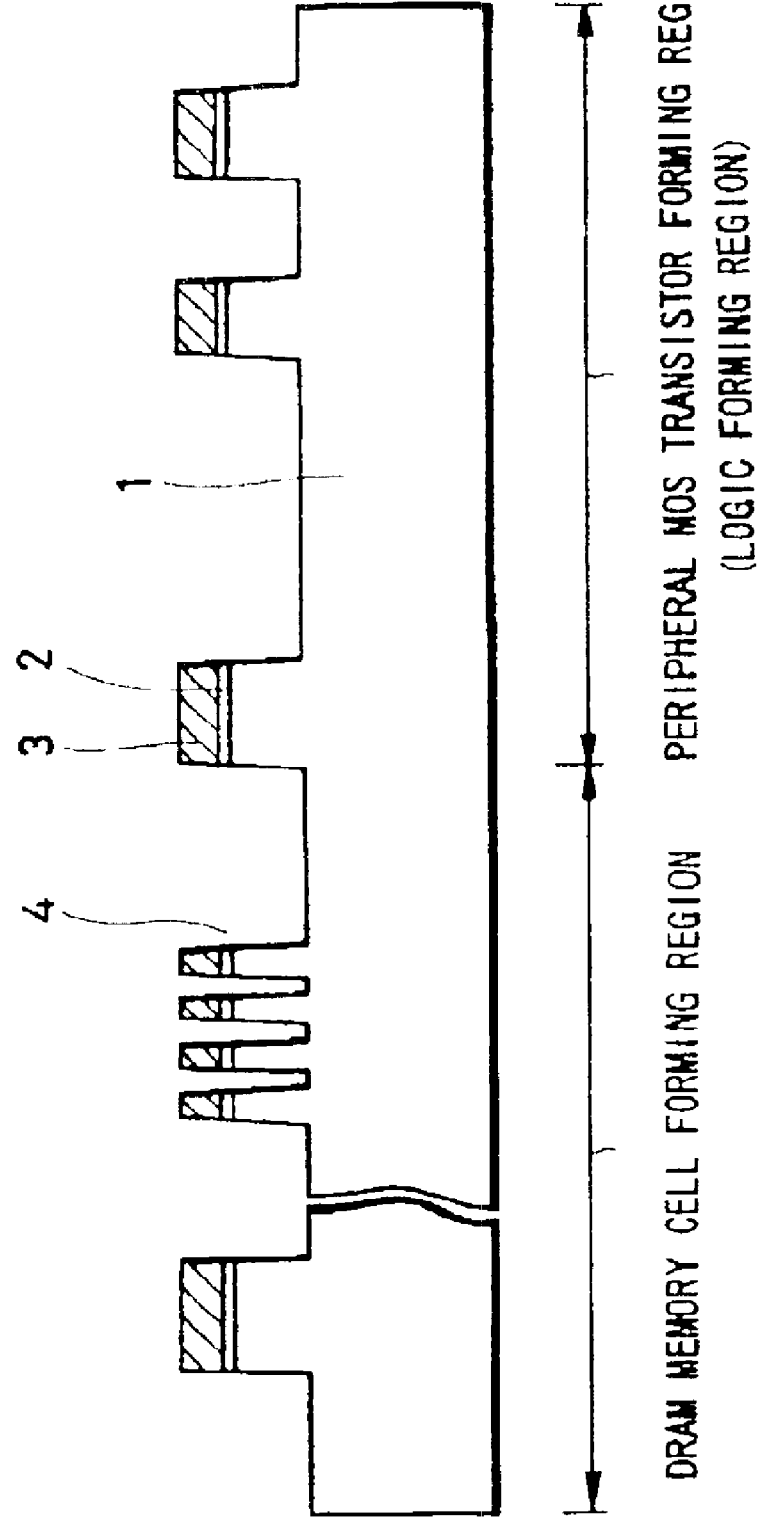
FIG. 8 is a cross-section of a device during one embodiment of the manufacturing method of the invention (step 1)

As shown in FIG. 8, after making a silicon oxide film 2 of between 50 nm and 200 nm (100 nm is shown), for example, on a p-type silicon substrate 1, a silicon nitride film 3 is stacked to a thickness of between 100 nm and 200 nm (150 nm is shown) by CVD (chemical vapor deposition). The silicon oxide film 2 functions to relax the stress between the silicon nitride film 3 and the silicon substrate 1. A photo resist pattern (not shown) is selectively formed in the device-forming regions for MOS transistors and others on the silicon nitride film 3. The silicon nitride film 3, silicon oxide film 2 and silicon substrate 1 are sequentially etched to make grooves 4 to be used as semiconductor device isolating regions. Depth of the grooves 4 may be 250 nm to 500 nm (350 nm is shown), for example.

Figure 9:
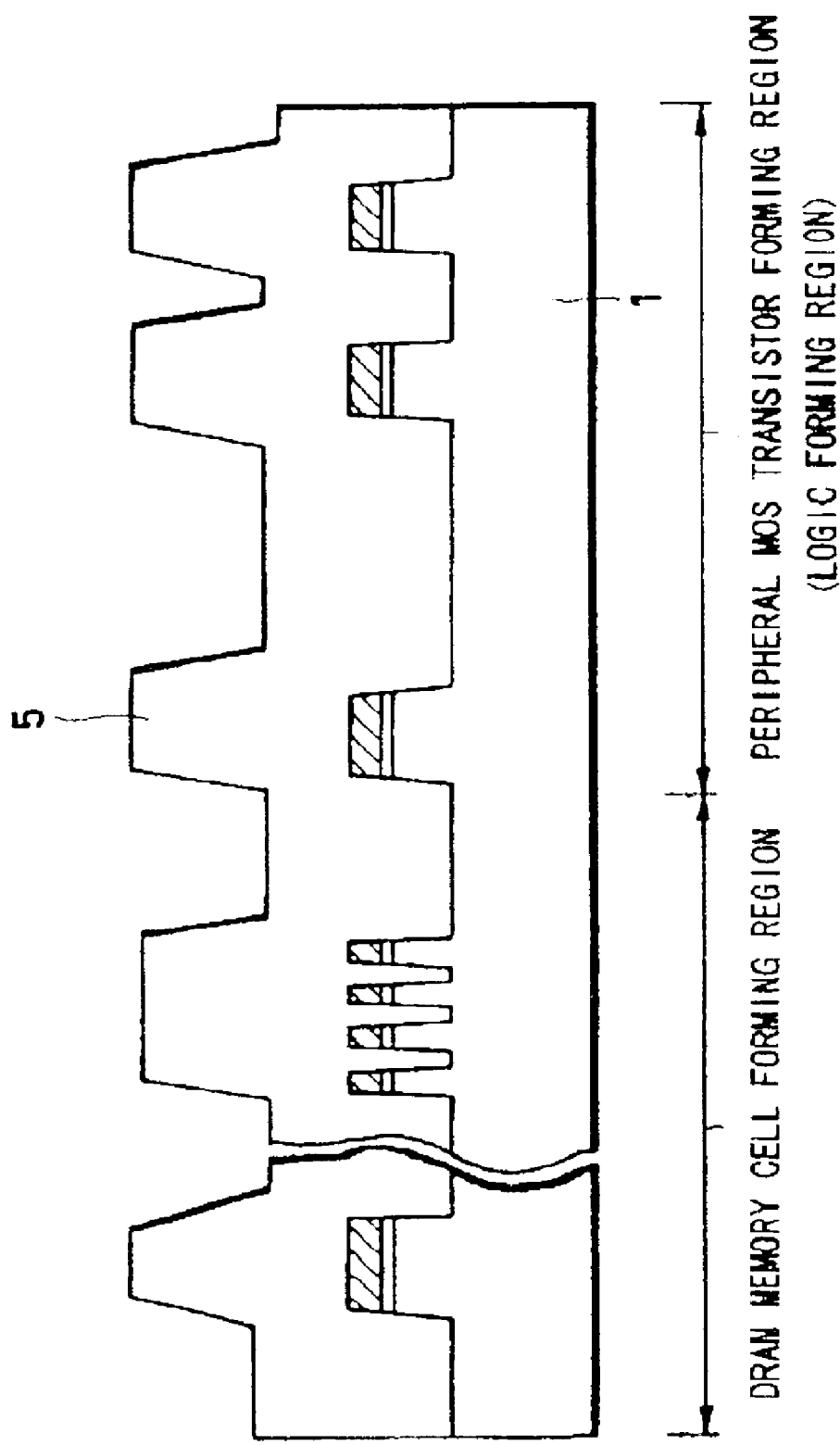
FIG. 9 is a cross-section of the device during one embodiment of the manufacturing method of the invention (step 2)

As shown in FIG. 9, a silicon oxide film 5 of a thickness from 500 nm to 1000 nm (750 nm is shown), for example, is formed to cover the grooves 4 and the silicon nitride film 3 by HDP (high-density plasma) CVD (chemical vapor deposition). Before making the silicon oxide film 5, a silicon oxide film (not shown) with a thickness around 50 nm through 200 nm (100 nm is shown), for example may be formed by thermal oxidation for the purpose of relaxing the stress.

Figure 10:
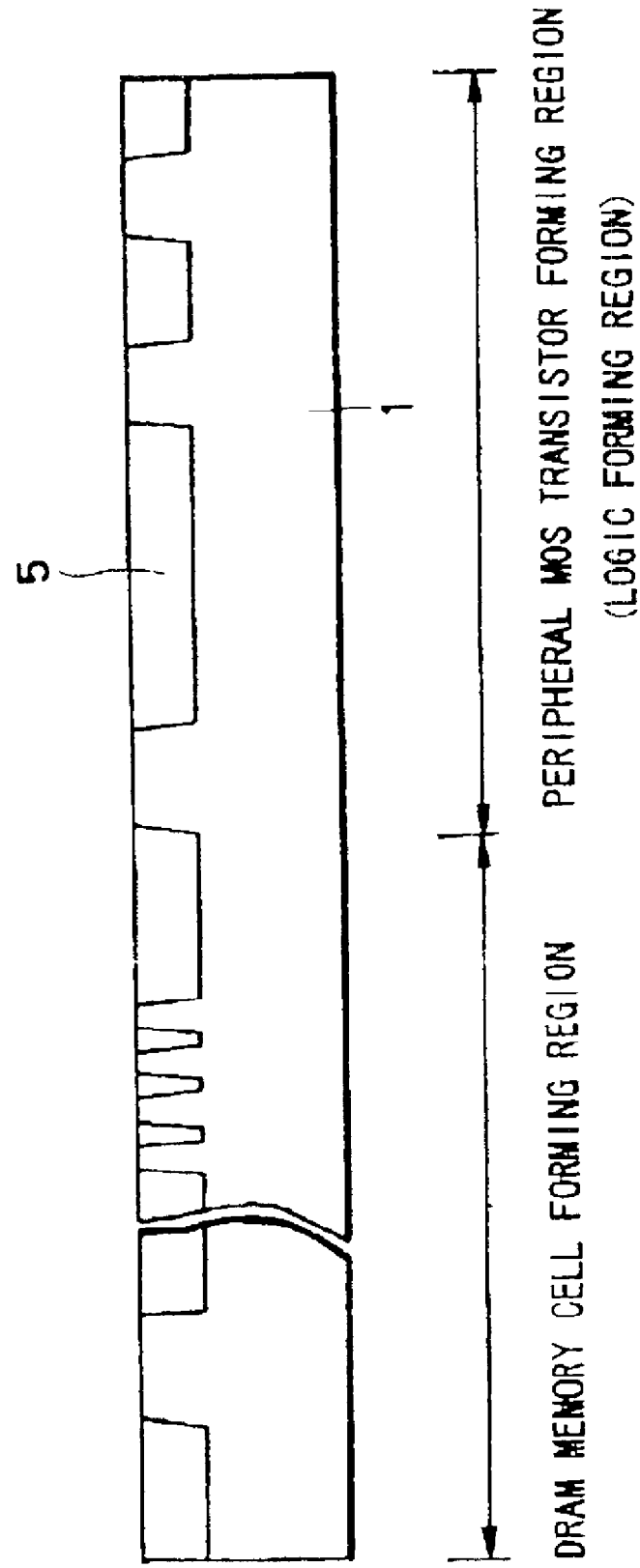
FIG. 10 is a cross-section of the device during one embodiment of the manufacturing method of the invention (step 3)

As shown in FIG. 10, the silicon oxide film 5 buried in the grooves to be used as device isolating regions is polished and smoothed by CMP (chemical mechanical polishing). After the polishing, the silicon nitride film 3 and the silicon oxide film 2 are removed by etching. Although this particular embodiment makes the device isolating regions by using a technique for burying the grooves, conventionally used LOCOS (selective oxidation) may be used as well.

Figure 11:
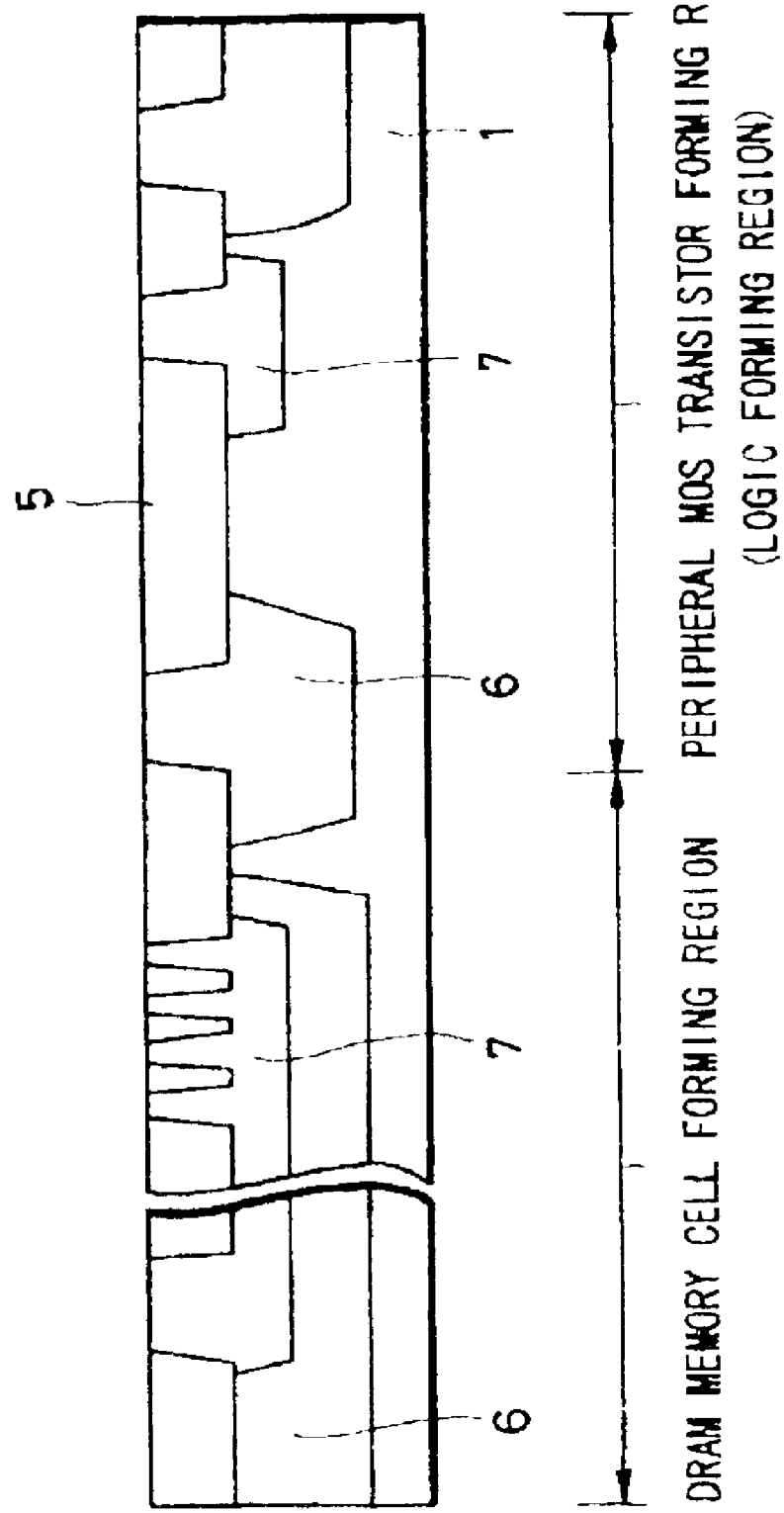
FIG. 11 is a cross-section of the device during one embodiment of the manufacturing method of the invention (step 4)

As shown in FIG. 11, a silicon oxide film of 50 nm through 200 nm (100 nm is shown), for example, is formed (not shown). This silicon oxide film is used as so-called sacrificial oxide film, and it is entirely removed after ion injection shown in FIG. 11. An n-type impurity, such as phosphorus, is doped into DRAM memory cell forming regions of the p-type semiconductor substrate to form N well regions 6, and boron is ion-implanted inside the N well regions 6 to make P well regions 7. Simultaneously, it is made around memory cells, and N well regions and P well regions are formed also in regions for peripheral MOS that function as logic circuits connecting to memory functions. Ion implantation is further conducted that determines threshold voltages of N-channel MOS transistors, P-channel MOS transistors and word transistors of DRAM memory cells.

Figure 12:
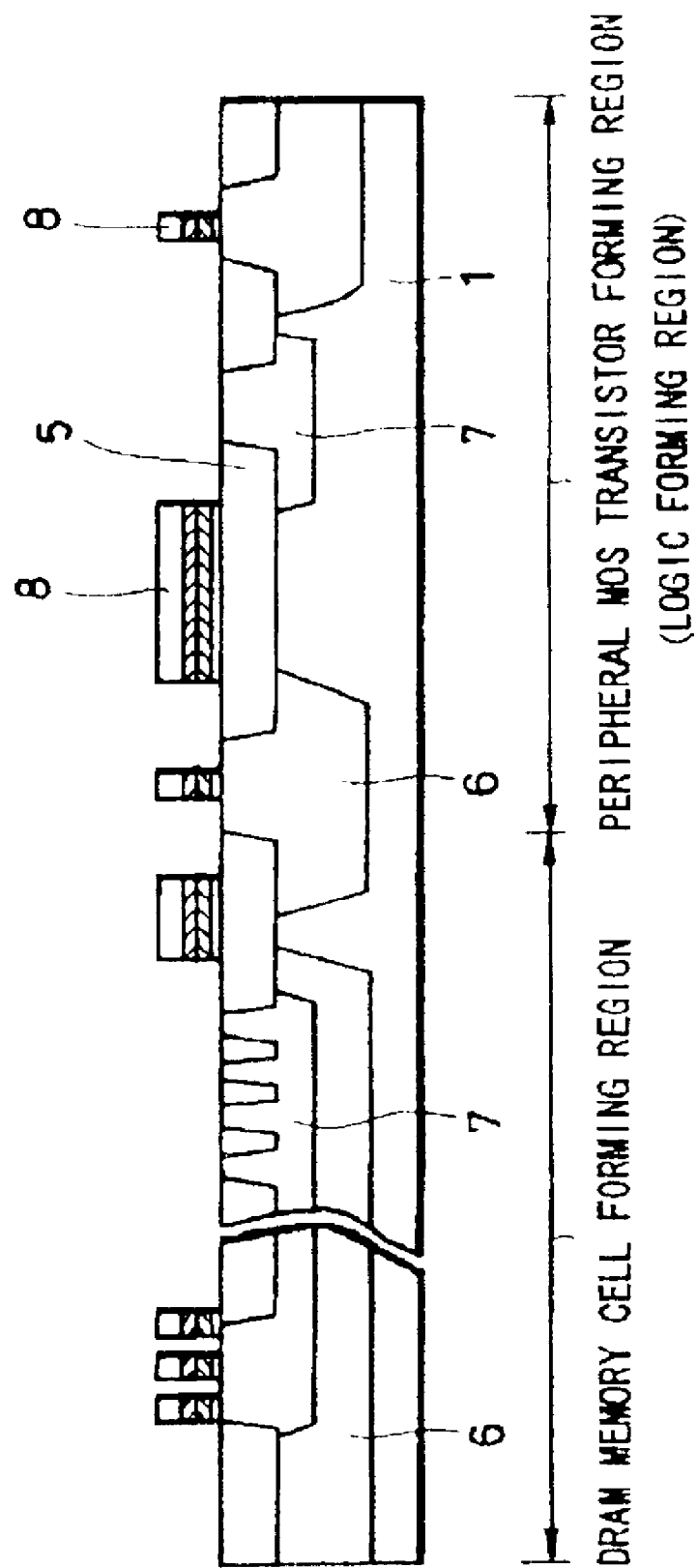
FIG. 12 is a cross-section of the device during one embodiment of the manufacturing method of the invention (step 5)

As shown in FIG. 12, after removing the silicon oxide film (sacrificial oxide film) of 50 nm through 200 nm (100 nm is shown), a gate oxide film is formed to a thickness of 2 through 10 nm. In this case, thickness of the gate oxide film is changed, depending upon the use of the transistors. For example, in a region for making a peripheral MOS transistors in which a high current driving performance and a low off-current are required, a gate oxide film as thin as 2 nm through 5 nm (3 nm is shown) is formed. On the other hand, in a region for making a peripheral MOS transistor required to operate under a high voltage, a gate oxide film with a thickness from 5 nm to 10 nm is formed. For word transistors of DRAM memory cells, a gate oxide film in accordance with the data holding capacity of cells can be made. Variation in thickness of the gate oxide film can be made by first making a thick gate oxide film on the entire surface, selectively removing the gate oxide film from regions requiring a thinner gate oxide film by etching, and repeated oxidizing.

As gate electrodes, a poly-silicon layer or amorphous silicon layer is stacked to a thickness of 50 nm through 150 nm (100 nm is shown) by CVD or sputtering. In this case, if a dual gate structure is employed in which both of N-channel MOS transistors and P-channel MOS transistors are made as surface-channel MOS, regions for N-channel MOS transistors are doped with phosphorus, for example, and n-type impurity, and regions for p-channel MOS transistors are doped with boron, for example. On the poly-silicon layer or amorphous layer, a tungsten silicide layer, for example, which is a metal silicide layer with a high melting point, is formed to a thickness of 50 nm through 150 nm (100 nm is shown) by CVD or sputtering.

Next, a silicon nitride film or silicon oxide film is formed with a thickness of 100 nm through 200 nm (150 nm is shown) by CVD, which is used as an offset film upon making self-aligned contacts of DRAM memory cells. After making a gate electrode photo resist pattern, the offset film, high-melting-point metal silicide layer and poly-silicon or amorphous silicon layer are sequentially etched by anisotropic etching to make out a pattern of the gate electrodes 8.

Figure 13:
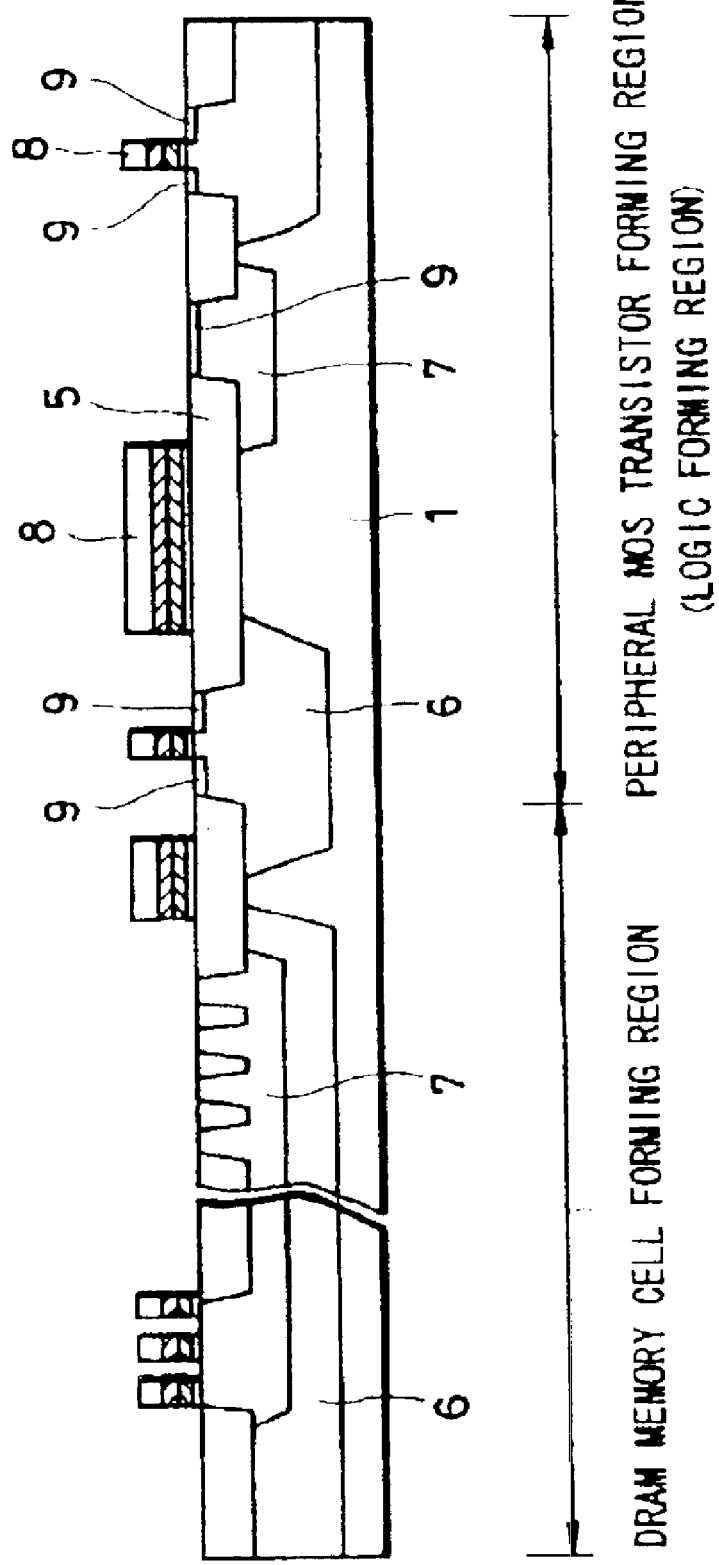
FIG. 13 is a cross-section of the device during one embodiment of the manufacturing method of the invention (step 6)

As shown in FIG. 13, an LDD (lightly doped drain) impurity diffusion layer 9 is formed in the peripheral MOS transistor forming region. In the N-channel MOS transistor forming region, a N-type impurity such arsenic is ion-implanted, and in the P-channel MOS transistor forming region, boron ($BF_2^+$), for example, is ion-implanted. By conducting pocket ion implantation between channel regions and LDD impurity diffusion layers 9, the short-channel effect can be prevented. For example, in the N-channel MOS transistor forming region, a p-type impurity such as boron is ion-implanted, and in the p-channel MOS transistor forming region, arsenic, for example, is ion-implanted.

Figure 14:
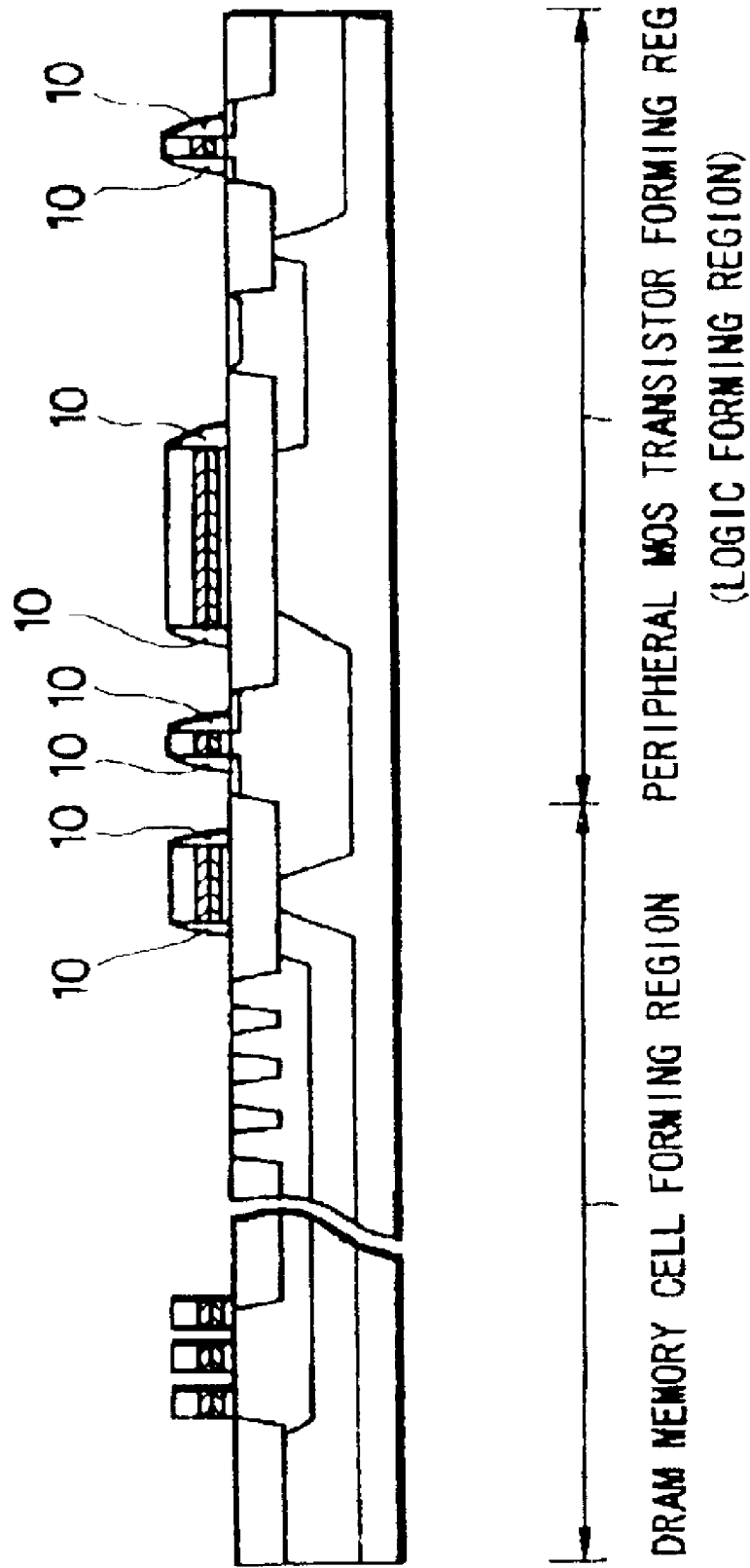
FIG. 14 is a cross-section of the device during one embodiment of the manufacturing method of the invention (step 7)

As shown in FIG. 14, a silicon nitride film is once formed to a thickness from 400 nm to 100 nm (60 nm is shown), for example, on the entire surface of the substrate. After that, a photo resist pattern (not shown) is formed having an opening only in the peripheral MOS transistor forming region. Then, unnecessary part of the silicon nitride film is removed by anisotropic etching over the entire surface to make up side wall layers 10 of a silicon nitride film on side walls of gate electrodes in the peripheral MOS transistor forming region.

Figure 15:
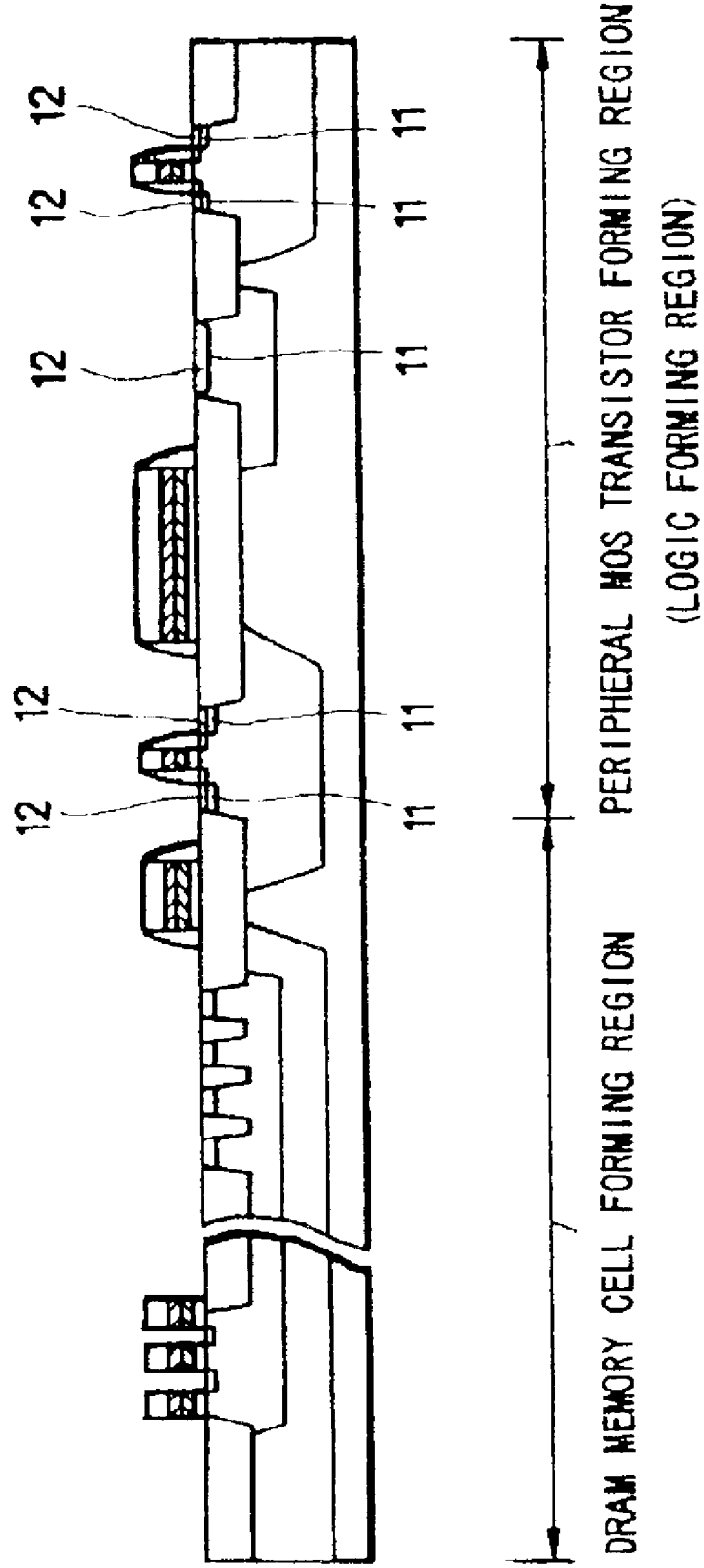
FIG. 15 is a cross-section of the device during one embodiment of the manufacturing method of the invention (step 8)

As shown in FIG. 15, a source/drain impurity diffusion layer 11 is formed in the peripheral MOS transistor forming region. In the N-channel MOS transistor forming region, an n-type impurity such as arsenic is ion-implanted, and in the P-channel MOS transistor forming region, boron, for example, is ion-implanted. After that, a cobalt layer and a titanium nitride film are sequentially formed on the silicon substrate by sputtering, and then annealed to make up cobalt silicide layer 12 in self alignment in apertures of the side wall silicon nitride film. Non-reacted part of the cobalt layer (not shown) on the side wall silicon nitride films and the offset film is removed.

Figure 16:
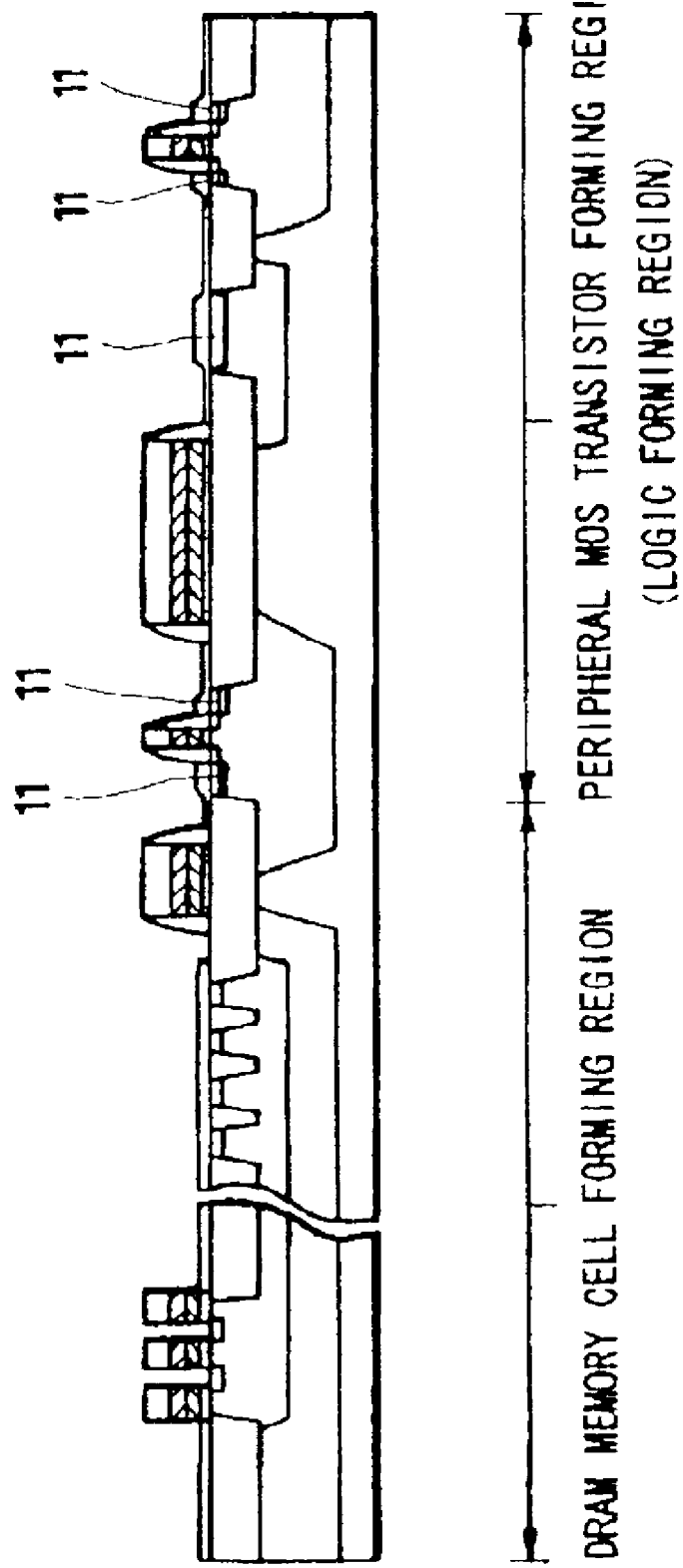
FIG. 16 is a cross-section of the device during one embodiment of the manufacturing method of the invention (step 9)
Figure 37:
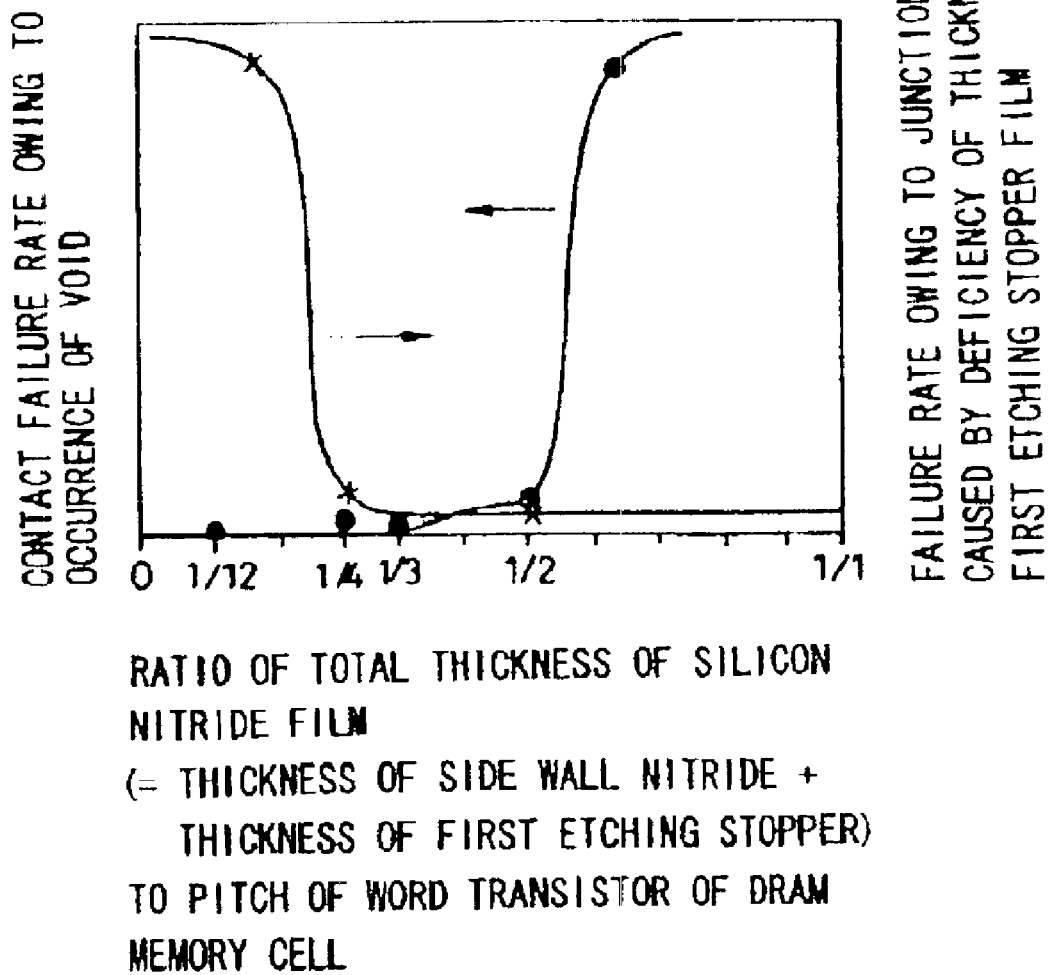
FIG. 37 is a graph showing contact failure rates.

As shown in FIG. 16, a silicon nitride film (not shown) to be used as the first etching stopper layer is stacked to a thickness from 10 nm to 50 nm (20 nm is shown) on the entire surface. At that time, the total thickness of the silicon nitride film and the 20 nm to 100 nm thick silicon nitride side wall layer forming the underlying side walls is 30 nm through 150 nm (100 nm is shown). Total thickness of the silicon nitride film to be used as the first etching stopper layer and the silicon nitride film forming the underlying side walls is preferably in the range from ¼ to ½, or ¼ to ⅓ of 120 through 450 nm, which is the distance between word transistors in the DRAM memory cell forming region. FIG. 37 shows effects obtained by having the total thickness of the silicon nitride film to be used as the first etching stopper layer and the silicon nitride film forming the underlying side walls to be in the range from ¼ to ½, or in the range from ¼ to ⅓ of the distance between word transistors in the DRAM memory cell forming region.

As shown in FIG. 37, ratio of the total thickness of the silicon nitride film to be used as the first etching stopper layer and the silicon nitride film forming the underlying side walls relative to the distance between word transistors in the DRAM memory cell forming region is shown on the abscissa, and incidence of contact defects by voids generated in the buried smoothing film between word transistors in the DRAM memory cell forming region and incidence of defects by junction leakage caused by an insufficient thickness of the first etching stopper layer are shown in the ordinate. Incidence of defects is normally determined by the absolute thickness of the first etching stopper layer. However, what is defined in the present invention is the total thickness of the silicon nitride film to be used as the first etching stopper layer and the silicon nitride film forming the underlying side walls. Therefore, for an inter-word-transistor distance of 120 nm through 450 nm distance of word transistors, a total thickness of the first etching stopper layer and the film forming the underlying side walls of ¼ of the inter-word-transistor distance, or more, is necessary.

Figure 17:
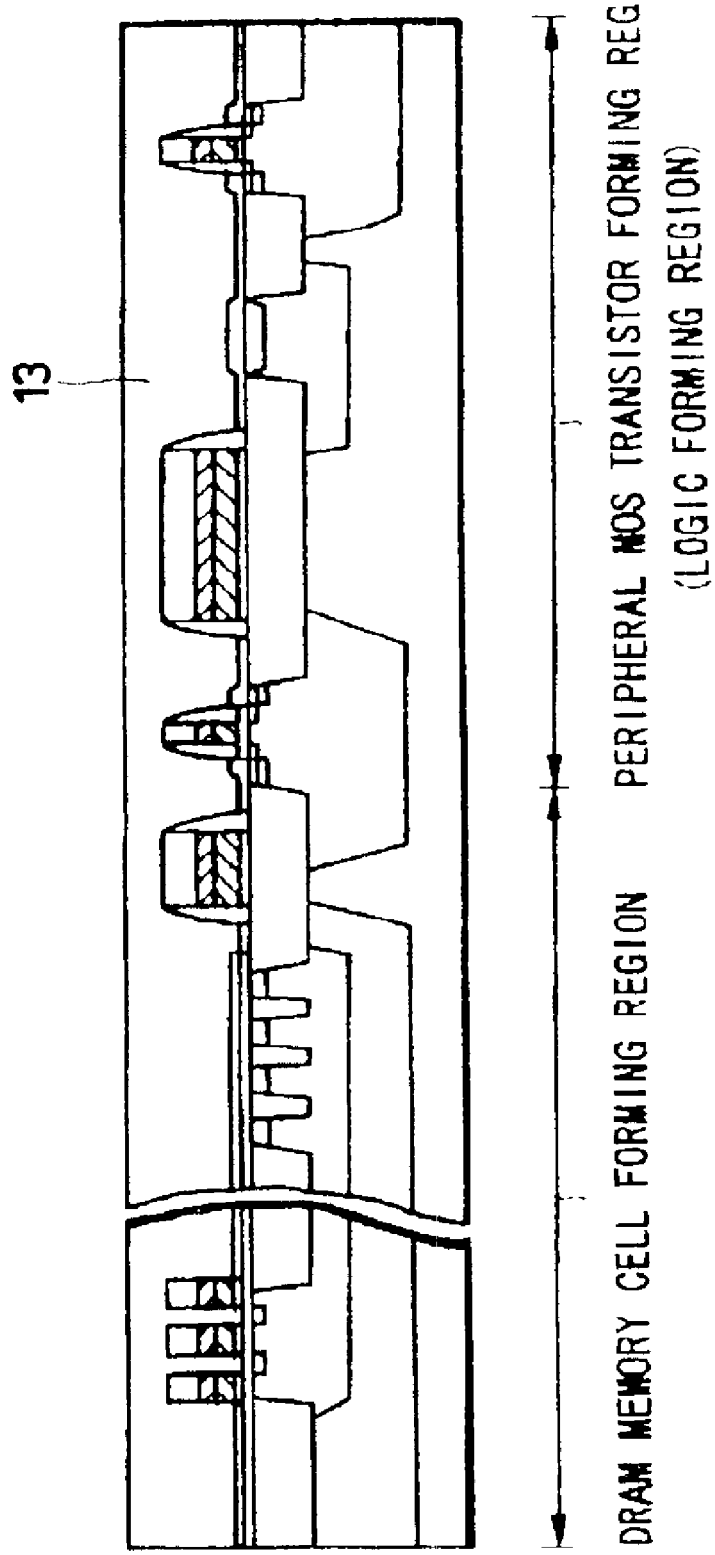
FIG. 17 is a cross-section of the device during one embodiment of the manufacturing method of the invention (step 10)

As shown in FIG. 17, a BPSG (boron phosphorus silicate glass) layer to be used as the first inter-layer insulating film 13 is stacked on the first etching stopper layer with a thickness around 500 nm through 1000 nm (1000 nm is shown) by CVD, and the first inter-layer insulating film is re-flowed and smoothed by annealing at a temperature around 650° C. through 800° C. (here is chosen 700° C.). At that time, since an optimum thickness is selected as the total thickness of the silicon nitride film to be used as the first etching stopper layer formed in the DRAM memory cell forming region and the silicon nitride film forming the underlying side walls, generation of voids is prevented in the smoothing process of the BPSG film as the first inter-layer insulating film 13.

The first inter-layer insulating film may be a HDP (high-density plasma) CVD film or SOG (spin-on-glass; coated silicon oxide film). After that, the BPSG film as the first inter-layer insulating film 13 is polished to a thickness of 200 nm through 900 nm (400 nm is shown) by CMP (chemical mechanical polishing) to enhance the smoothness.

In this smoothing process, all-area etch-back technique, for example, may be used.

Figure 18:
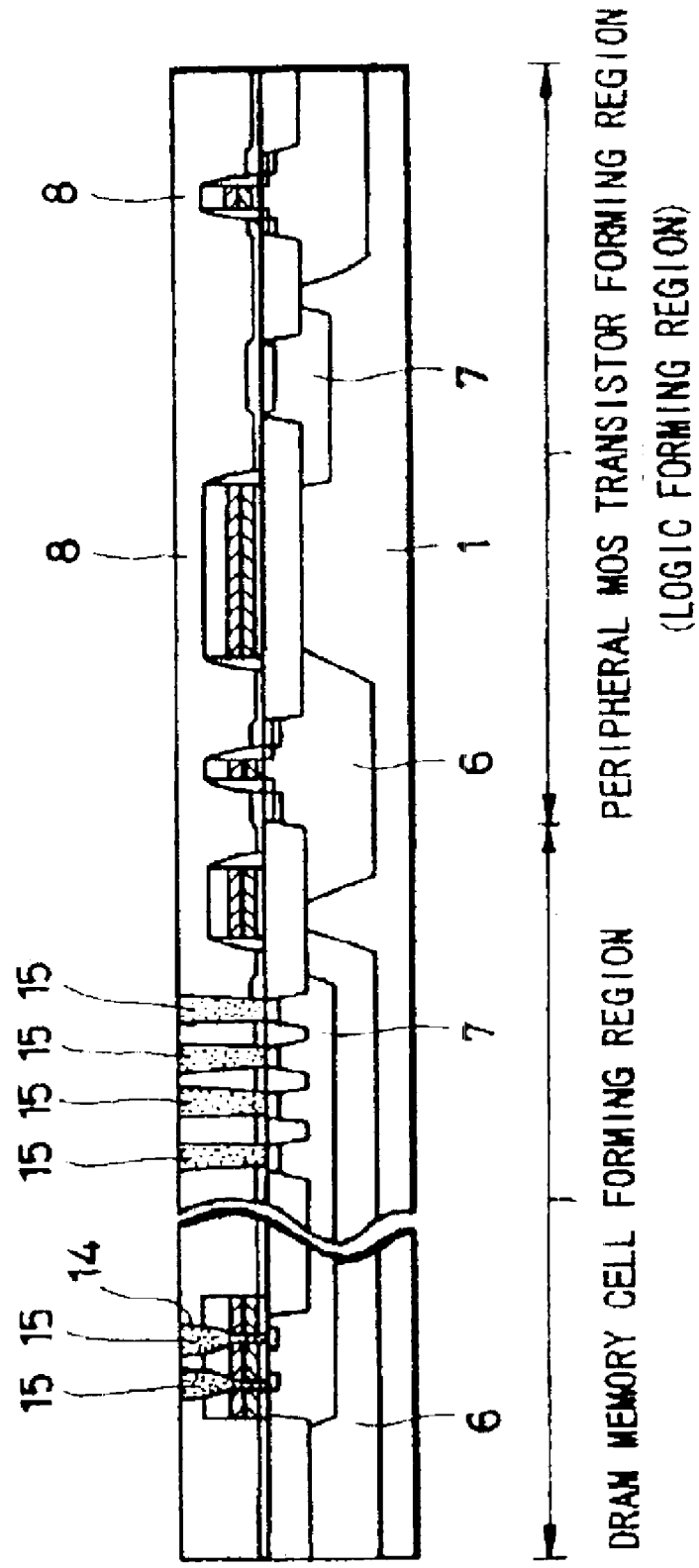
FIG. 18 is a cross-section of the device during one embodiment of the manufacturing method of the invention (step 11)

As shown in FIG. 18, a photo resist opening pattern is selectively made on the first inter-layer insulating film 13 in the DRAM memory cell forming region. Etching is then conducted and once interrupted. The etching exhibits a selectivity relative to the thickness of the stacked film of the silicon nitride film to be used as the first etching stopper layer and the silicon nitride film forming the underlying side walls. After that, the stacked film of the silicon nitride films is etched, thereby making contact holes 14 in self alignment between word lines of DRAM memory cells. This step is conducted by using conventional, self-aligned contact technique.

A poly-silicon layer or amorphous silicon layer is formed in contact holes 14, and the first silicon electrode layer 15 is maintained only inside the contact holes by CMP. In this embodiment, a CMP method is used, but the first silicon electrode layer 15 may be left inside the contact holes 14 by selective growth technique or etch-back technique. Technique for introducing an impurity into the first silicon electrode layer 15 may be one that introduces it simultaneously with CVD of the first silicon electrode layer, or may be one that introduces it by ion implantation after CVD. In this embodiment, since the first silicon electrode layer 15 is formed to connect to the impurity diffusion layers of word transistors made of N-channel MOS of DRAM memory cells, phosphorus which is an N-type impurity is introduced into the first silicon electrode layer 15.

Figure 19:
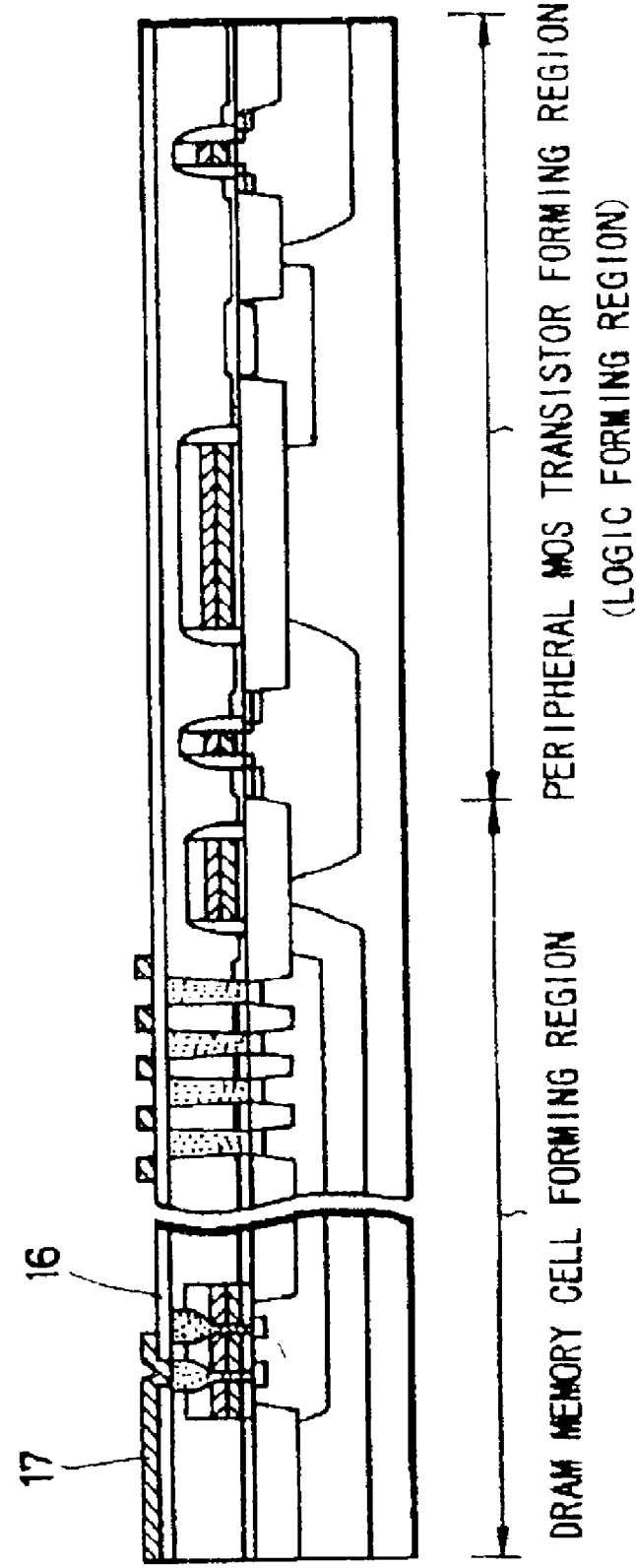
FIG. 19 is a cross-section of the device during one embodiment of the manufacturing method of the invention (step 12)

As shown in FIG. 19, after making the second inter-layer insulating film 16 made of a silicon oxide film with a thickness of 50 nm through 200 nm (100 nm is shown), apertures are selectively formed in locations, corresponding to bit contacts of the first silicon electrode layer formed in the DRAM memory cell forming region, and a bit line 17 connected to the first silicon electrode layer through the apertures is formed. In this embodiment, a multi-layered wiring stacking tungsten 50 nm through 200 nm thick (150 nm is shown), and 50 nm thick TiN barrier metal may be used as the bit line 17. However, a polyline structure made by stacking another appropriate high-melting-point metal or high-melting-point metal silicide layer and poly-silicon may be used for wiring. The bit line may be made with a width below the resolution limit of photolithography by using a known trimming technique.

Figure 20:
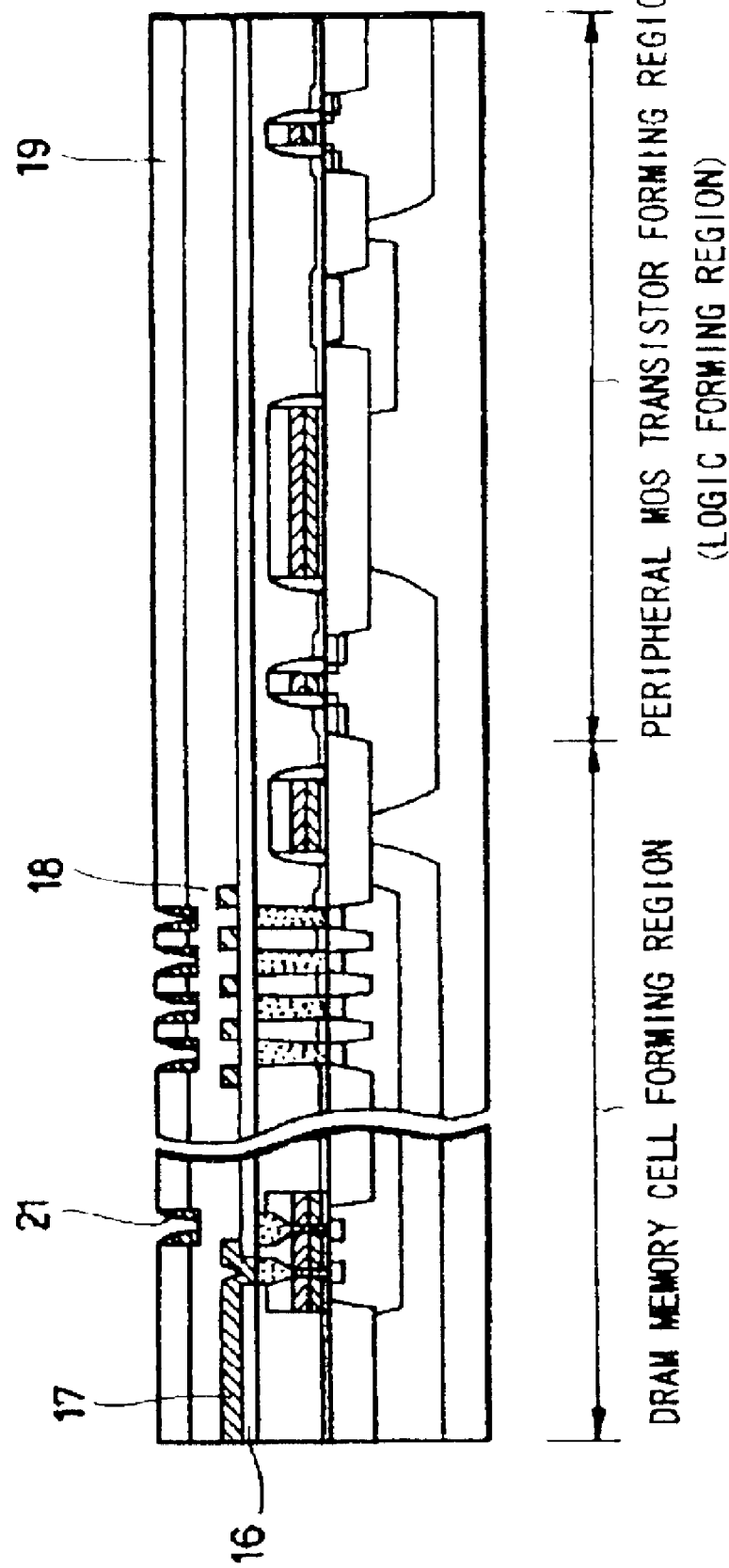
FIG. 20 is a cross-section of the device during one embodiment of the manufacturing method of the invention (step 13)

As shown in FIG. 20, after making a third inter-layer insulating film 18 made of a silicon oxide film with a thickness of 500 nm through 1500 nm (1000 nm is shown), it is smoothed by using a technique such as CMP or all-area etch-back technique, for example. After that, a silicon nitride film to be used as the second etching stopper 19 is stacked to a thickness of 50 nm through 500 nm (300 nm is shown). At that time, the second etching stopper layer 19 can be made thicker than the first etching stopper layer made in a lower level.

Apertures are selectively formed in selective locations of the first silicon electrode layer formed in the DRAM memory cell forming region, which lie above the first silicon electrode layers connecting to capacitor electrodes. A material such as poly-silicon layer or amorphous silicon layer, which exhibits an etching selectivity relative to the fourth inter-layer insulating film and the second etching stopper layer, is stacked to a thickness of 50 nm through 200 nm (80 nm is shown) over the entire surface to cover the apertures. The poly-silicon layer or amorphous silicon layer is selectively removed by anisotropic etching to form side wall etching mask layers made of a poly-silicon layer or amorphous silicon layer on side walls of apertures in the second etching stopper layer.

Figure 21:
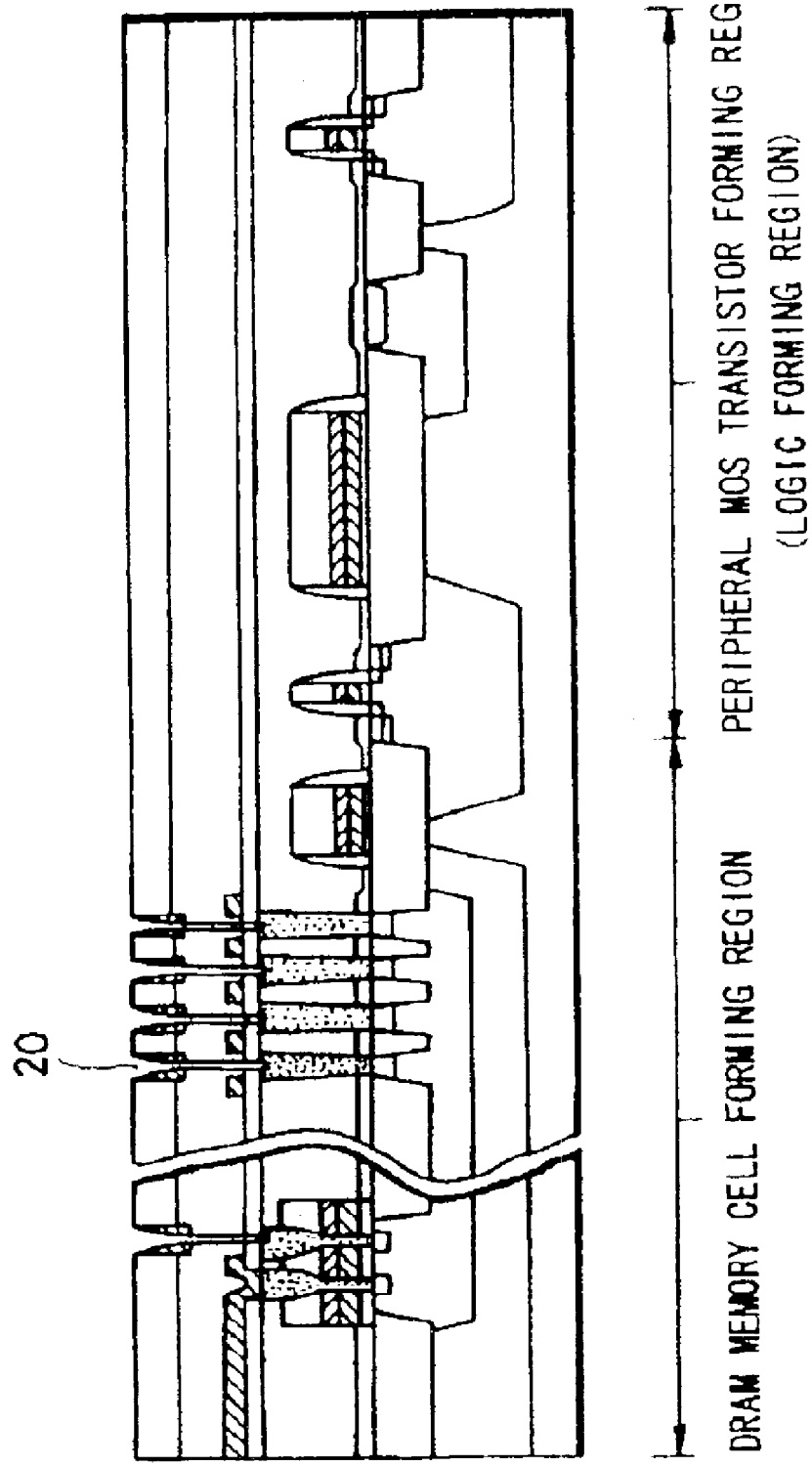
FIG. 21 is a cross-section of the device during one embodiment of the manufacturing method of the invention (step 14)

As shown in FIG. 21, using the second etching stopper layer 19 and the side wall etching mask layer 21 as an etching mask, the third inter-layer insulating film 18 is etched to make contact holes 20 in selective locations of the first silicon electrode layer 15 formed in the DRAM memory cell forming region, which connect to capacitor electrodes. Since these contact holes 20 are made by etching using the second etching stopper layer 19 and the side wall etching mask layer 21 formed in self alignment in the apertures of the second etching stopper layer 19, contact holes with a contact diameter beyond the limit of lithographic techniques can be made. As a result, even when the above-mentioned bit line forming technique using trimming, the contact does not fall from the bit line, and resistance to pressure between the contact holes 20 and the bit line can be ensured easily.

Figure 22:
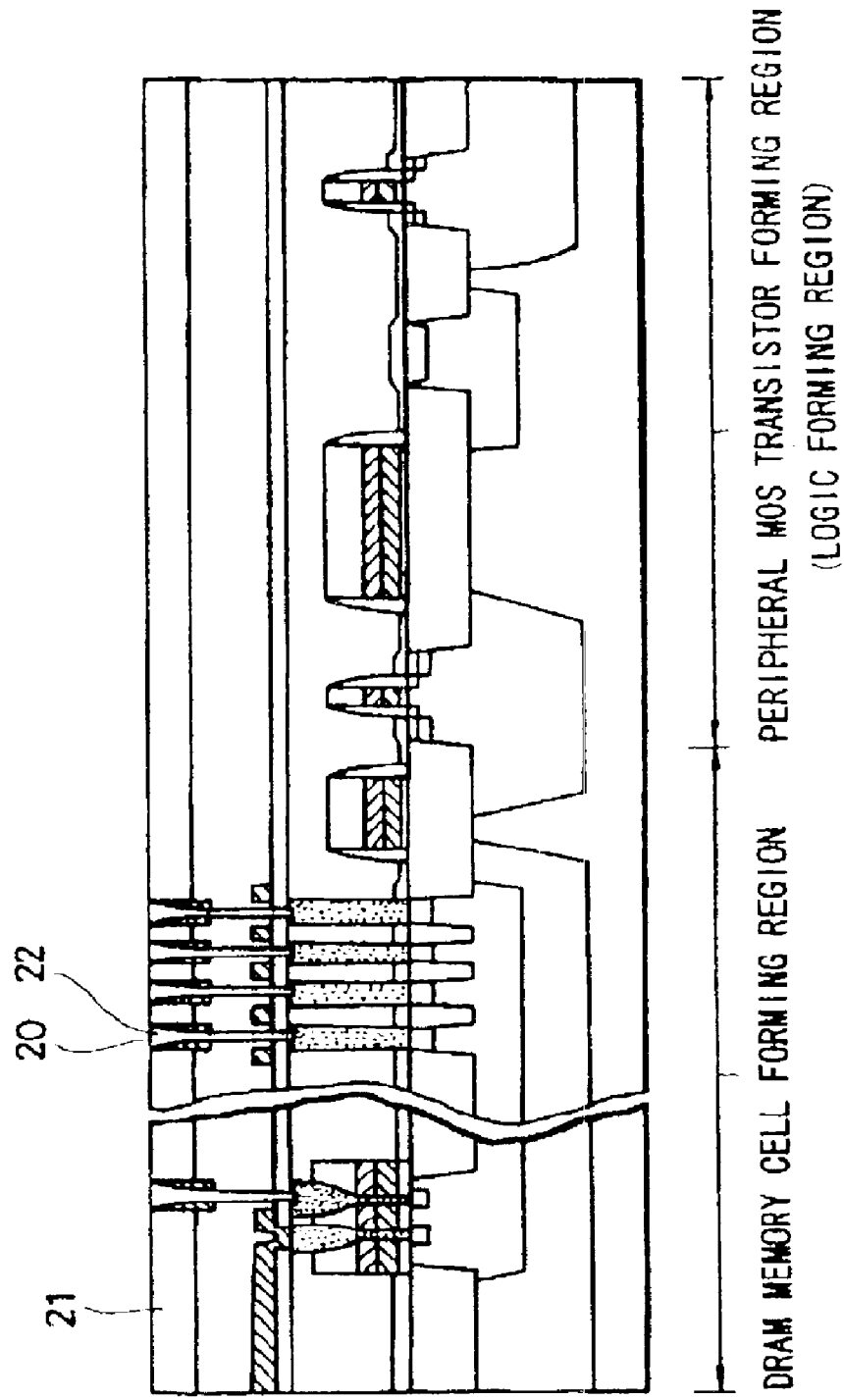
FIG. 22 is a cross-section of the device during one embodiment of the manufacturing method of the invention (step 15)

As shown in FIG. 22, a poly-silicon layer or amorphous silicon layer is formed inside the contact holes 20, and the second silicon electrode layer 22 is maintained only inside the contact holes 20 by CMP. In this particular embodiment, a method by CMP is used, but the second silicon electrode layer 22 may be left inside the contact holes 20 by selective growth technique or etch-back technique. The technique for introducing an impurity into the second silicon electrode layer 22 may be one that introduces it simultaneously with CVD of the first silicon electrode layer, or may be one that introduces it by ion implantation after CVD. In this embodiment, since the second silicon electrode layer 22 is formed on the first silicon electrode layer 15 formed to connect to the impurity diffusion layers of word transistors made of N-channel MOS of DRAM memory cells, phosphorus which is an N-type impurity is introduced into the second silicon electrode layer 22.

Figure 23:
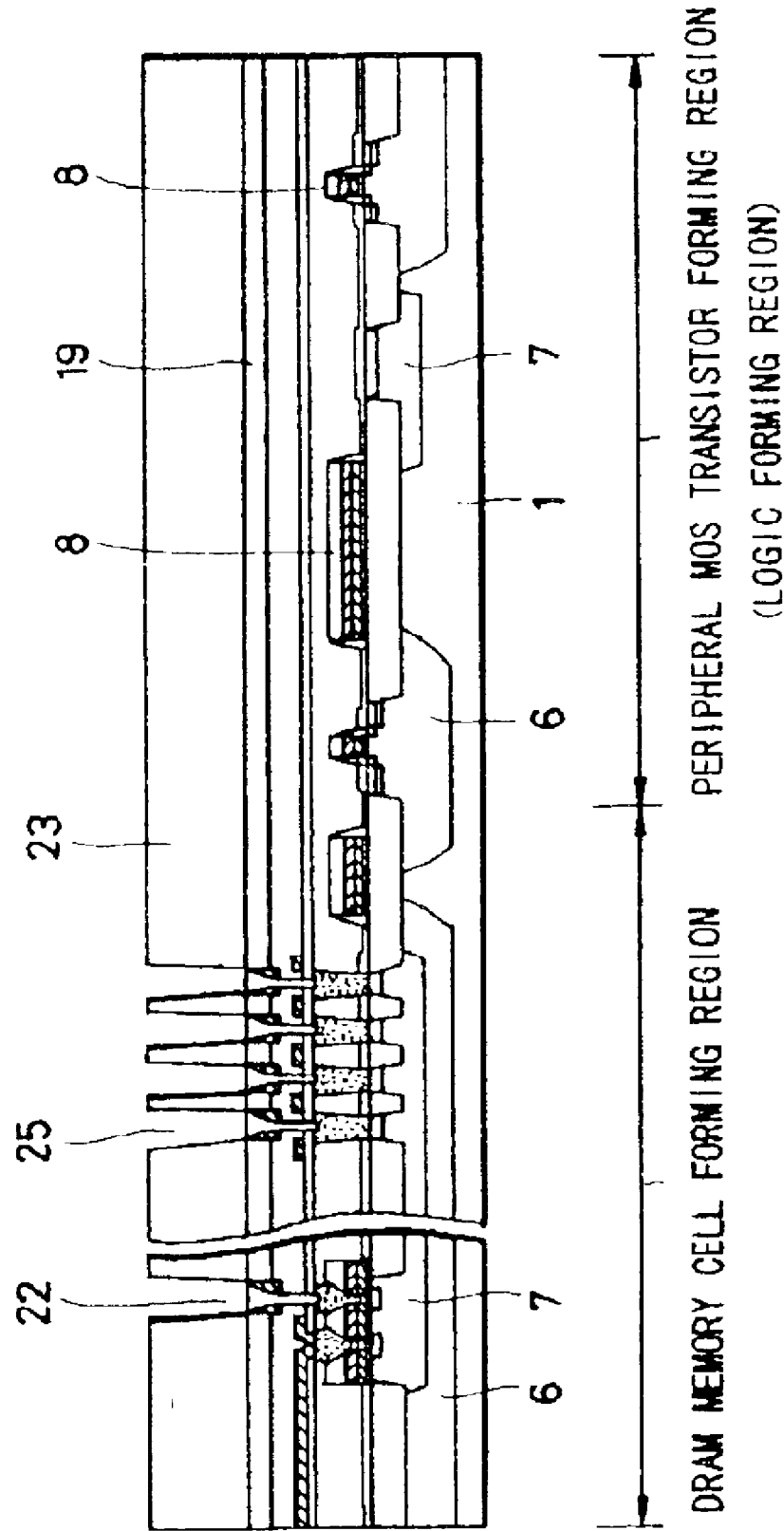
FIG. 23 is a cross-section of the device during one embodiment of the manufacturing method of the invention (step 16)

As shown in FIG. 23, an insulating film 23 of BPSG, for example, which exhibits an etching selectivity relative to the second etching stopper layer and the first silicon electrode layer 22 is stacked with a thickness of 500 nm to 1500 nm (1000 nm is shown) on the second etching stopper layer 19 to make apertures 25 on the second silicon electrode layer 22.

Figure 24:
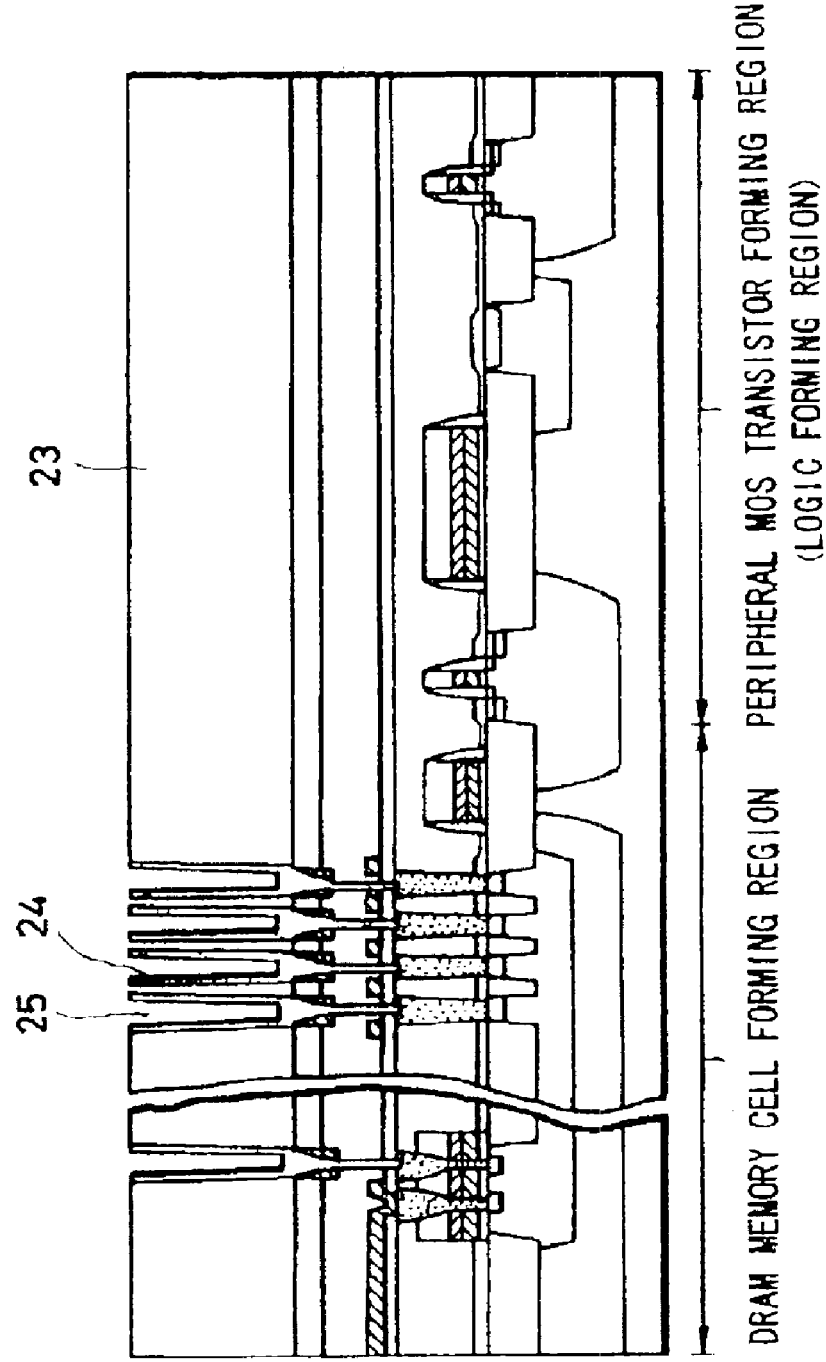
FIG. 24 is a cross-section of the device during one embodiment of the manufacturing method of the invention (step 17)

As shown in FIG. 24, a poly-silicon layer or amorphous silicon layer is formed in the apertures, and the third silicon electrode 24 to be used as capacitor lower electrodes only inside the contact holes (apertures) 25 by CMP. In this process, this embodiment uses CMP, but the third silicon electrode layer 24 may be processed by an etch-back technique such as reactive ion etching (RIE), for example, to remain only inside the contact holes 25. The technique for introducing an impurity into the third silicon electrode 24 may be one that introduces it simultaneously with CVD of the third silicon electrode layer 24, or may be one that introduces it by ion implantation after CVD. In this embodiment, phosphorus, an n-type impurity, is introduced into the third silicon electrode layer 24.

Figure 25:
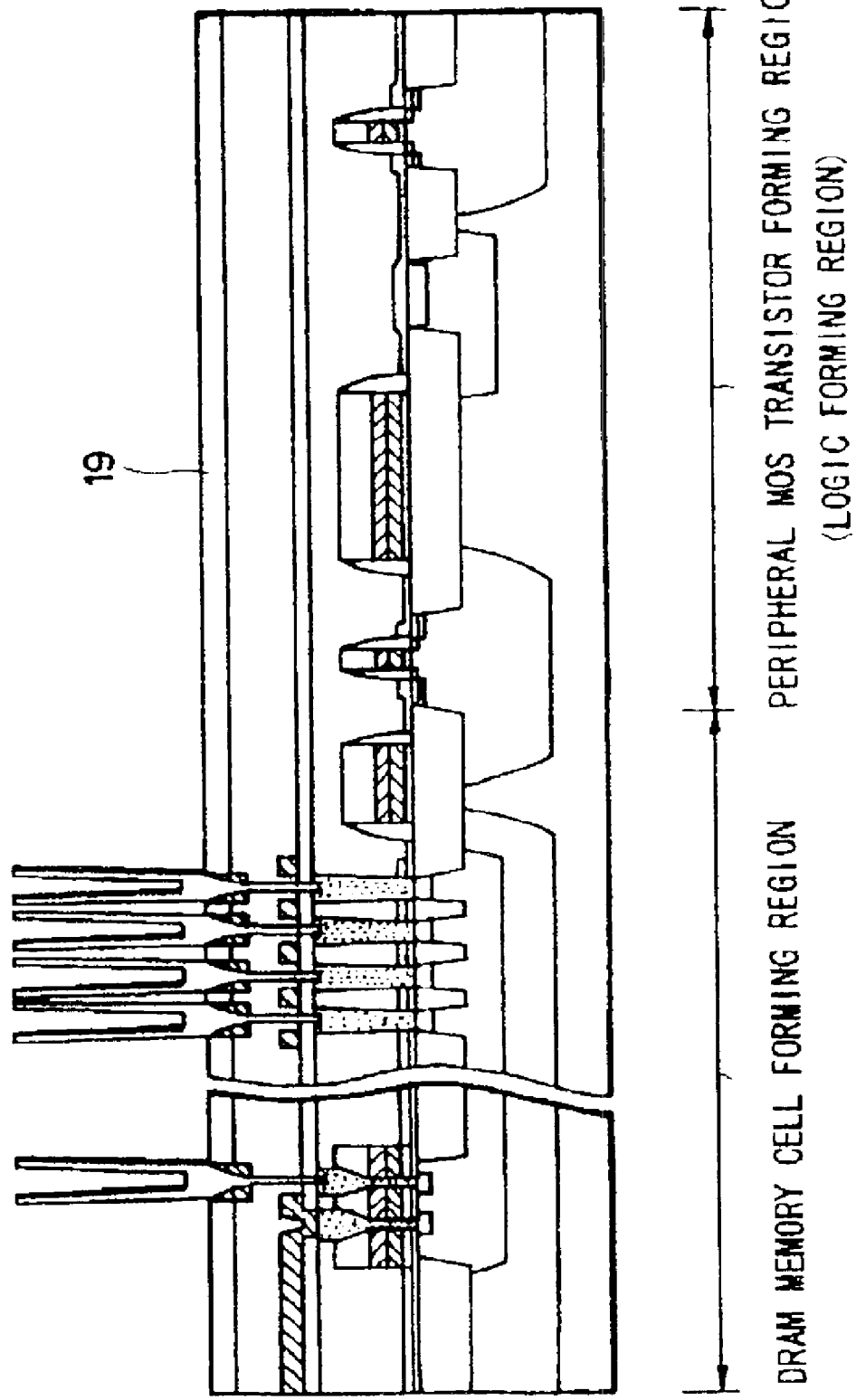
FIG. 25 is a cross-section of the device during one embodiment of the manufacturing method of the invention (step 18)

As shown in FIG. 25, the insulating film 23 of BPSG, for example, is removed by isotropic etching exhibiting a selectivity relative to the second etch-back stopper layer 19, such as wet etching using fluoric acid, to thereby make a structure in which the third silicon electrode layer 24 stands straight.

Figure 26:
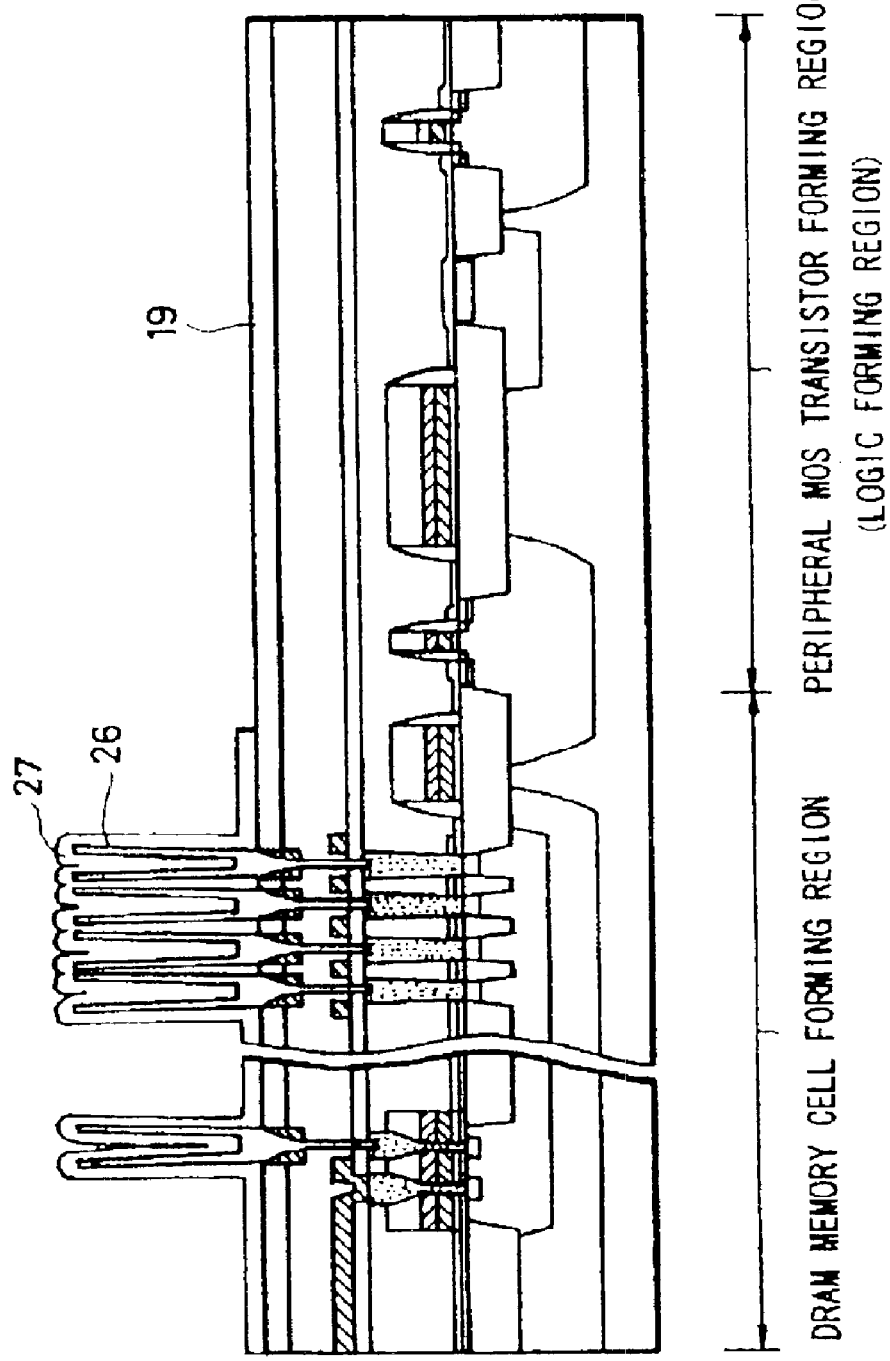
FIG. 26 is a cross-section of the device during one embodiment of the manufacturing method of the invention (step 19)

As shown in FIG. 26, an ONO film (silicon oxide film—silicon nitride film—silicon oxide film) is stacked as a dielectric film 26 to a thickness of 3 nm to 10 nm (5 nm is shown). Additionally, by stacking a poly-silicon layer or amorphous silicon layer, a fourth silicon electrode layer 27 to be used as capacitor upper electrodes is formed. The technique for introducing an impurity into the fourth silicon electrode layer 27 may be one configured to introduce it simultaneously with CVD of the fourth silicon electrode layer 27, or one configured to introduce it by ion implantation after CVD. In this embodiment, phosphorus, an n-type impurity, is introduced into the fourth silicon electrode layer 27.

In the embodiment shown here, silicon electrodes are used as capacitor electrodes. However, metal electrodes may also be used. Further, although the embodiment uses an ONO film as the capacitor dielectric film 26, a tantalum oxide film or a ferroelectric film of BST, for example, may be used. Furthermore, the embodiment shown here makes cylinder-structured capacitors. However, it is applicable to simply-stacked capacitors or fin-structured capacitor electrodes. In the process of removing the insulating film 23 of BPSG, for example, under the third silicon electrode layer 24 by isotropic etching exhibiting a selectivity relative to the second etching stopper layer, and in the process of making the pattern for the fourth silicon electrode layer 27 by etching, the second etching stopper layer 19 is also etched and decreased in thickness. If the control of the lost amount of film is difficult, after removing a part or all of the thickness of the second etching stopper layer 19 by etching upon making the pattern for the fourth silicon electrode layer 27 by etching, a new third etching stopper layer may be made. This is yet another embodiment of the manufacturing method according to the invention.

Figure 27:
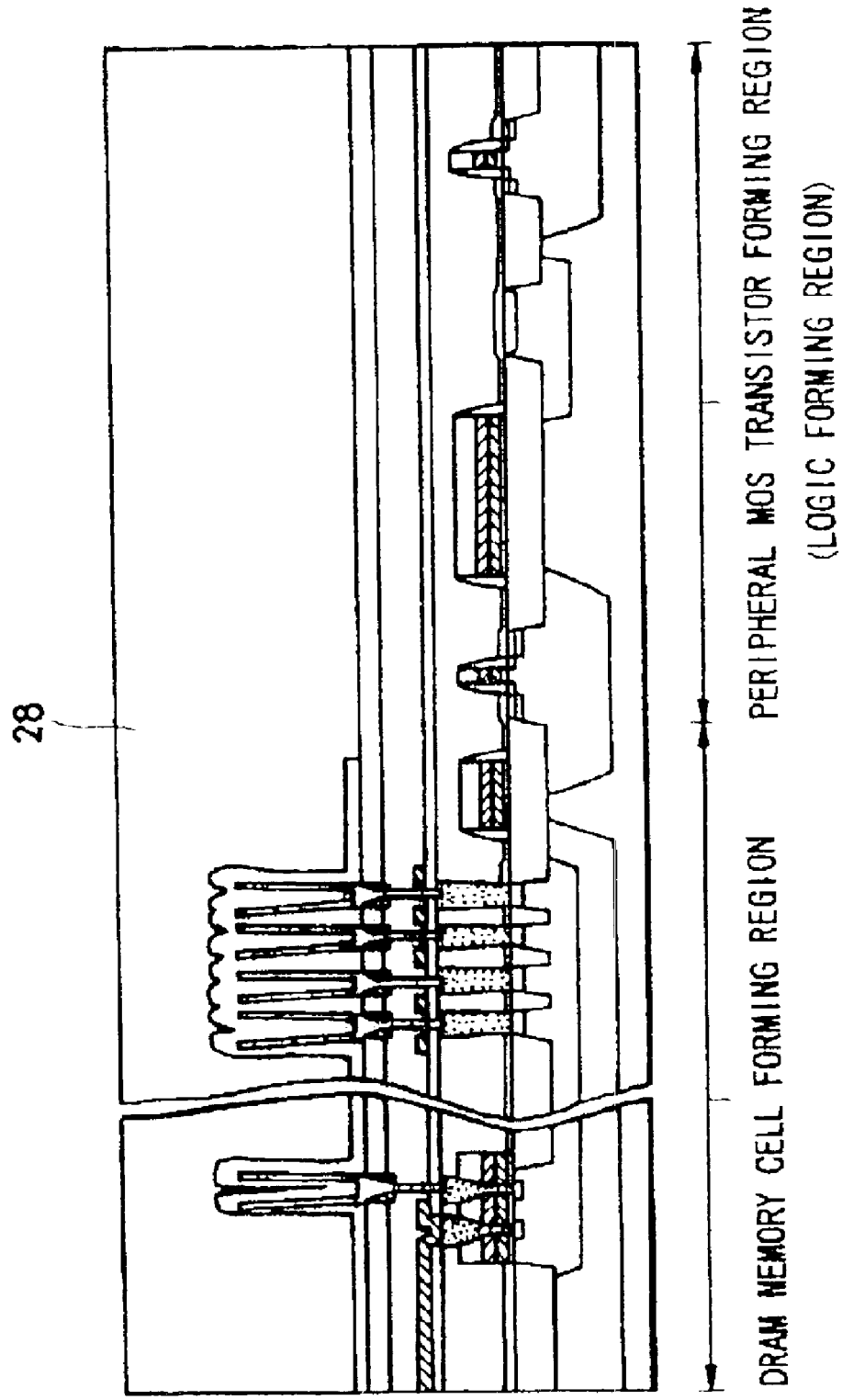
FIG. 27 is a cross-section of the device during one embodiment of the manufacturing method of the invention (step 20)

As shown in FIG. 27, after stacking the fourth inter-insulating film 28 made of a silicon oxide film to a thickness of 500 nm to 2500 nm (1500 nm is shown), it is partly removed and smoothed by CMP or etch-back technique so that a thickness of 100 nm to 1000 nm (1000 nm is shown) of the fourth inter-layer insulating film remains on the capacitors.

Figure 28:
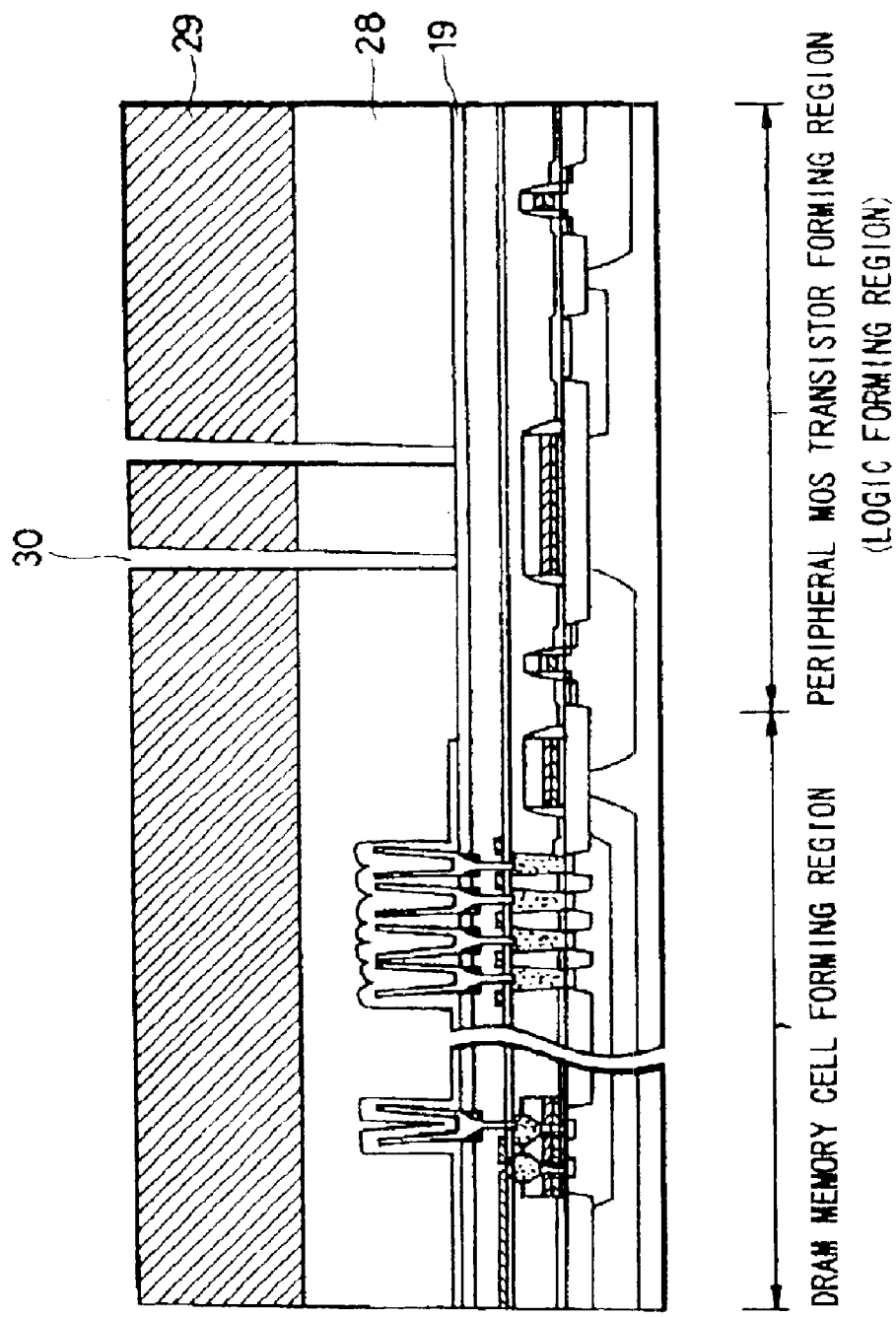
FIG. 28 is a cross-section of the device during one embodiment of the manufacturing method of the invention (step 21)

As shown in FIG. 28, a photo resist aperture pattern 29 is selectively made on the fourth inter-insulating film 28.

In the embodiment shown here, contact holes 30 are first opened onto the gate electrode wiring in the peripheral MOS transistor forming region. In this process for etching the fourth inter-layer insulating film 28, the etching is once interrupted on the second etching stopper layer 19 after removing the fourth inter-layer insulating film 28 by an etching condition making a selectivity relative to the second etching stopper layer 19.

Figure 29:
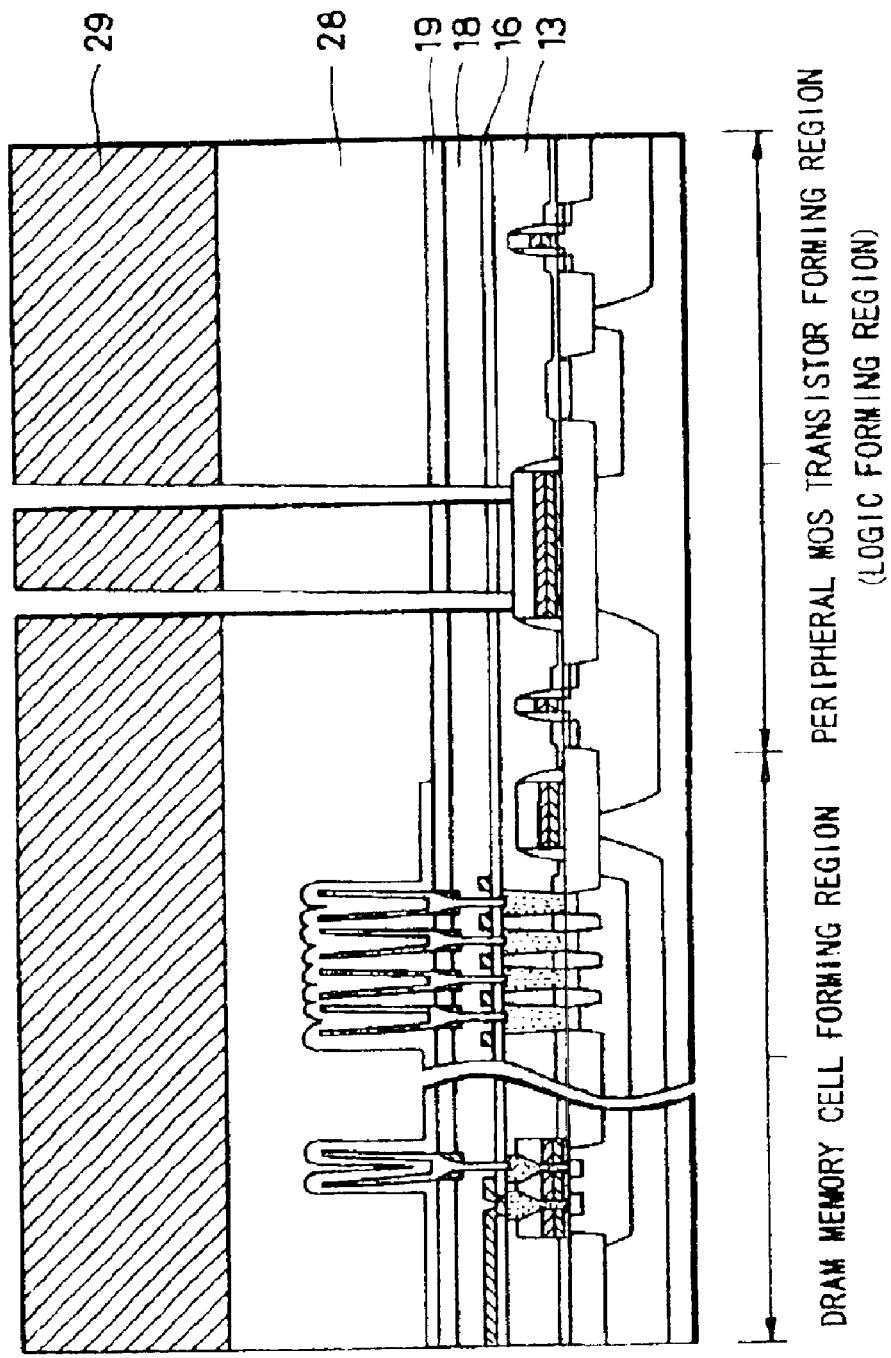
FIG. 29 is a cross-section of the device during one embodiment of the manufacturing method of the invention (step 22)

As shown in FIG. 29, the second etching stopper layer 19 is etched, and the third inter-layer insulating film 18, second inter-layer insulating film 16 and first inter-insulating film 13 are sequentially etched. In this process, the etching is once interrupted on the first etching stopper layer after the first inter-layer insulating film 13 by using an etching condition making a selectivity relative to the first etching stopper layer.

Figure 30:
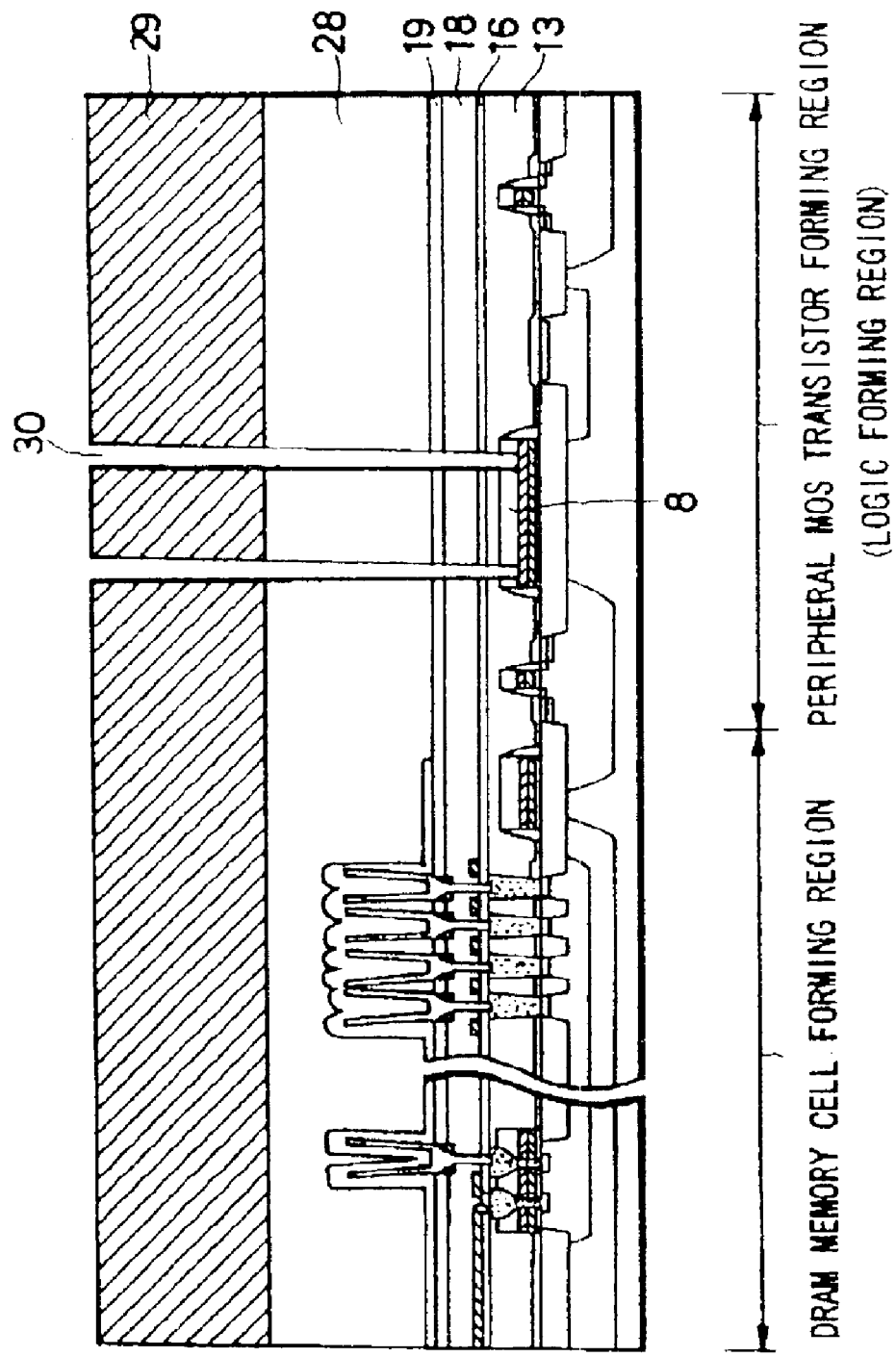
FIG. 30 is a cross-section of the device during one embodiment of the manufacturing method of the invention (step 23)

As shown in FIG. 30, the first etching stopper layer 13 is etched, and the offset film of the gate electrodes 8 in the peripheral MOS transistor forming region is removed by etching to make the contact holes 30 on the gate electrodes 8. The offset film may be a silicon nitride film or silicon oxide film, for example.

Figure 39:
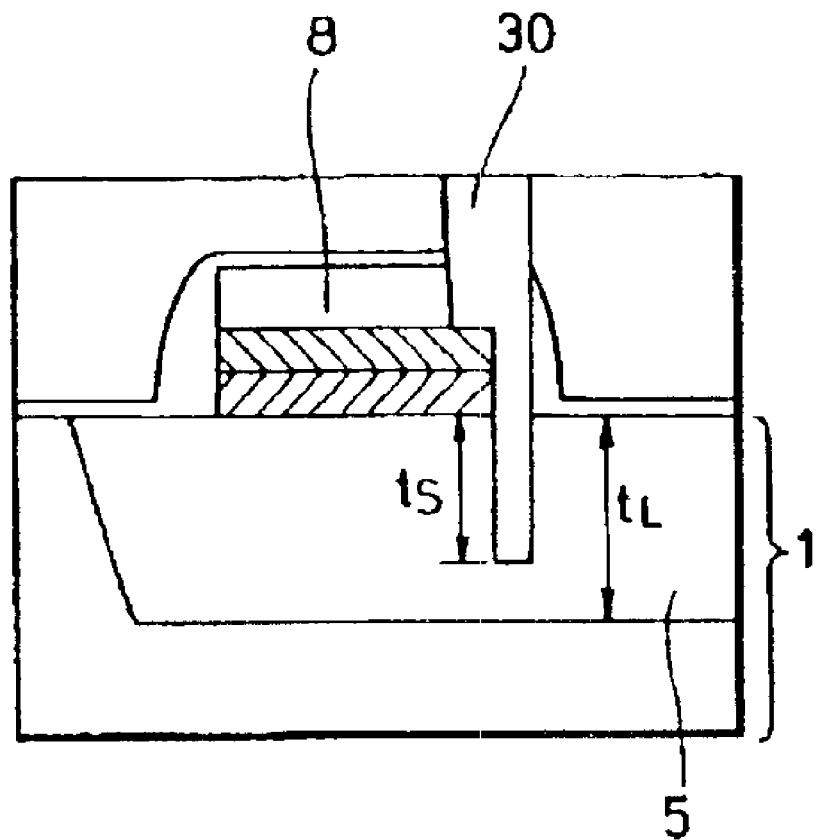
FIG. 39 is a cross-section of the device of another embodiment of the invention.

FIG. 39 shows the effect of reducing excavation of the device isolation insulating film 5 in a structure according to the invention, in which the electrode layer (not shown) formed inside the contact holes 30 extending through the etching stopper layer is connected onto a boundary between the gate electrode 8 and the side wall insulating film formed on a side wall of the gate electrode 8. In FIG. 39, $t_s$ is the depth of the electrode bottom formed on the device isolation insulating film 4, and $t_L$ is the depth of the bottom of the device isolation insulating film 5.

Figure 31:
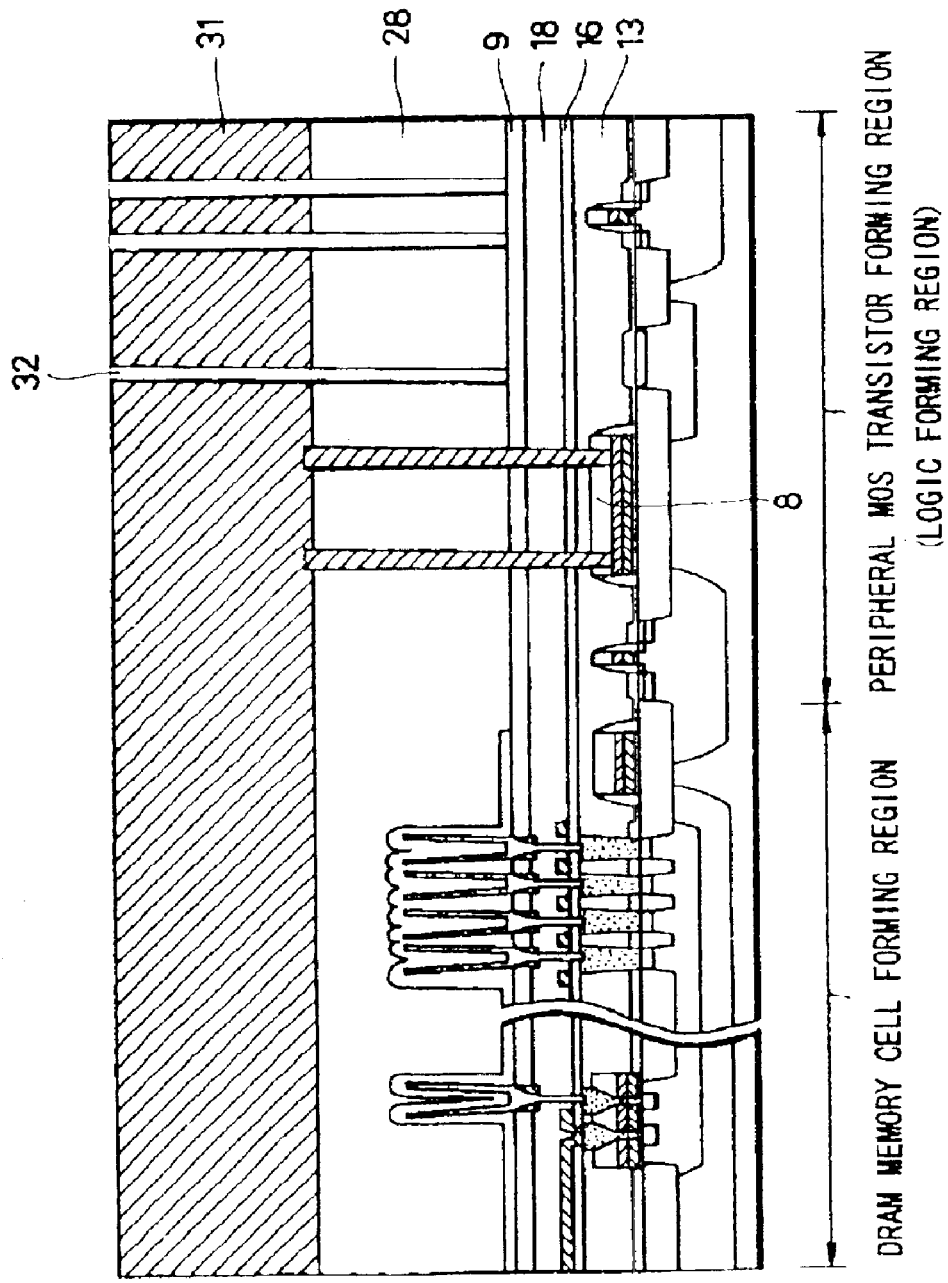
FIG. 31 is a cross-section of the device during one embodiment of the manufacturing method of the invention (step 24)

As shown in FIG. 31, a photo resist aperture pattern 31 is selectively formed on the fourth inter-layer insulating film 28.

In this embodiment contact holes 32 are opened on the impurity diffusion layer in the peripheral MOS transistor forming region, subsequently to contacts 30 onto the wiring layer for gate electrodes 8 in the peripheral MOS transistor forming region. In this process, the contact holes 30 formed above the gate electrode 8 are buried with the photo resist 31. When the fourth inter-layer insulating film 28 is etched, the etching is once stopped on the second etching stopper 19 after removing the fourth inter-layer insulating film 28 by using an etching condition exhibiting a selectivity relative to the second etching stopper layer 19.

Figure 32:
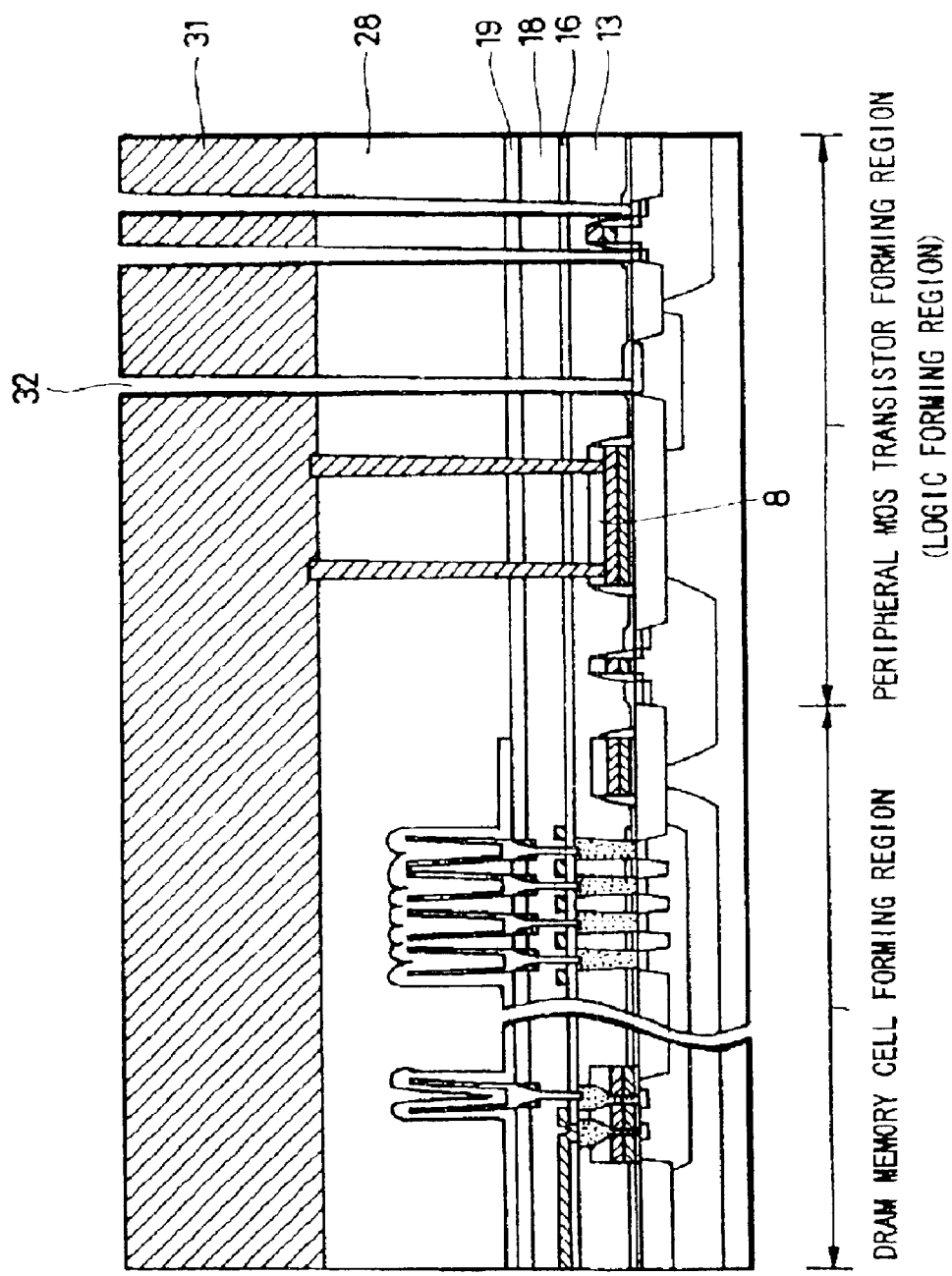
FIG. 32 is a cross-section of the device during one embodiment of the manufacturing method of the invention (step 25)

As show in FIG. 32, the second etching stopper layer 19 is etched, and the third inter-layer insulating film 18, second inter-layer insulating film 16 and first inter-layer insulating film 13 are sequentially etched. In this process, the etching is once stopped on the first etching stopper layer after removing the first inter-layer insulating film 13 by using an etching condition exhibiting a selectivity relative to the first etching stopper layer.

Figure 33:
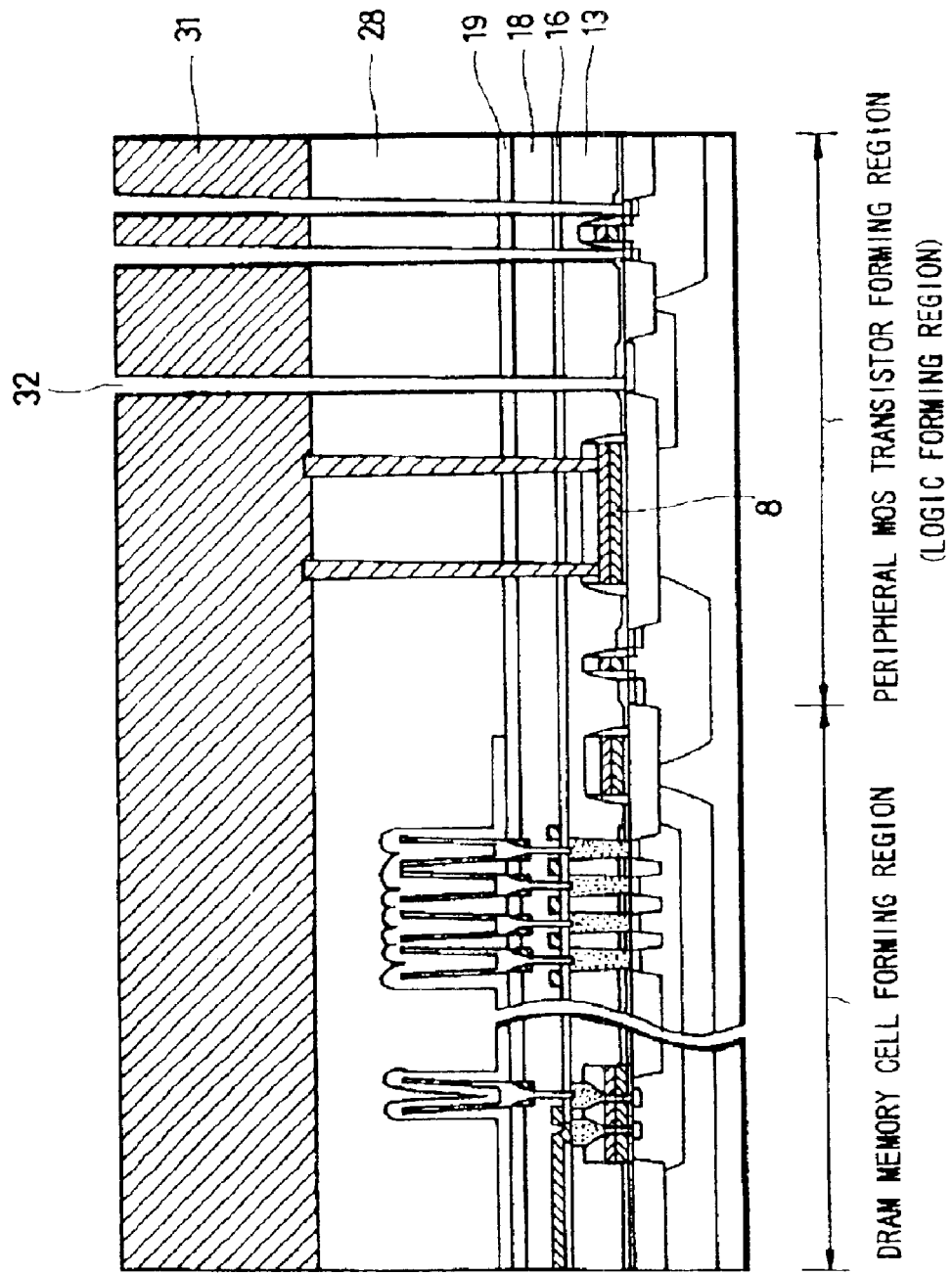
FIG. 33 is a cross-section of the device during one embodiment of the manufacturing method of the invention (step 26)

As shown in FIG. 33, the first etching stopper layer is etched to make contact holes 32 above the impurity diffusion layers in the peripheral MOS transistor forming region.

Figure 34:
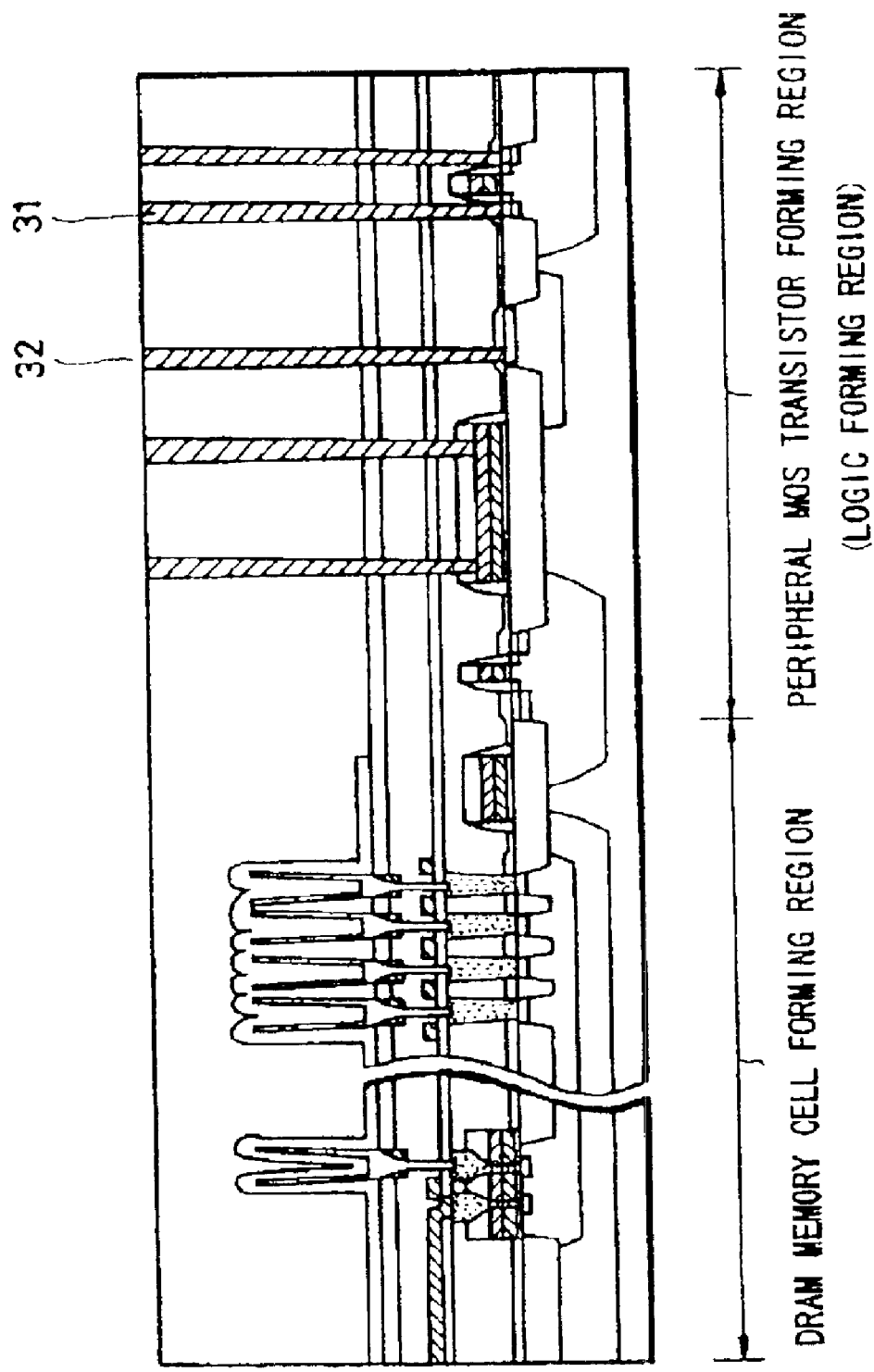
FIG. 34 is a cross-section of the device during one embodiment of the manufacturing method of the invention (step 27)

As shown in FIG. 34, a titanium layer of a thickness from 10 nm to 100 nm (20 nm is shown), for example, and a titanium nitride layer to be used as a barrier metal of a thickness from 10 nm to 50 nm (20 nm is shown), for example, are formed inside the contact hole 32 by sputtering or CVD. After that, a tungsten layer 33 to be used as first metal electrodes is stacked to a thickness of 100 nm to 500 nm (300 nm is shown), for example, by sputtering or CVD. Subsequently, the first metal electrodes 33 are removed from the remainder region to maintain it only inside the contact holes 32 by CMP or all-area etch-back technique. If the first metal electrodes 33 are originally formed selectively inside the contact holes 32 by using a technique like selective CVD, the etch-back or CMP step can be omitted.

Figure 35:
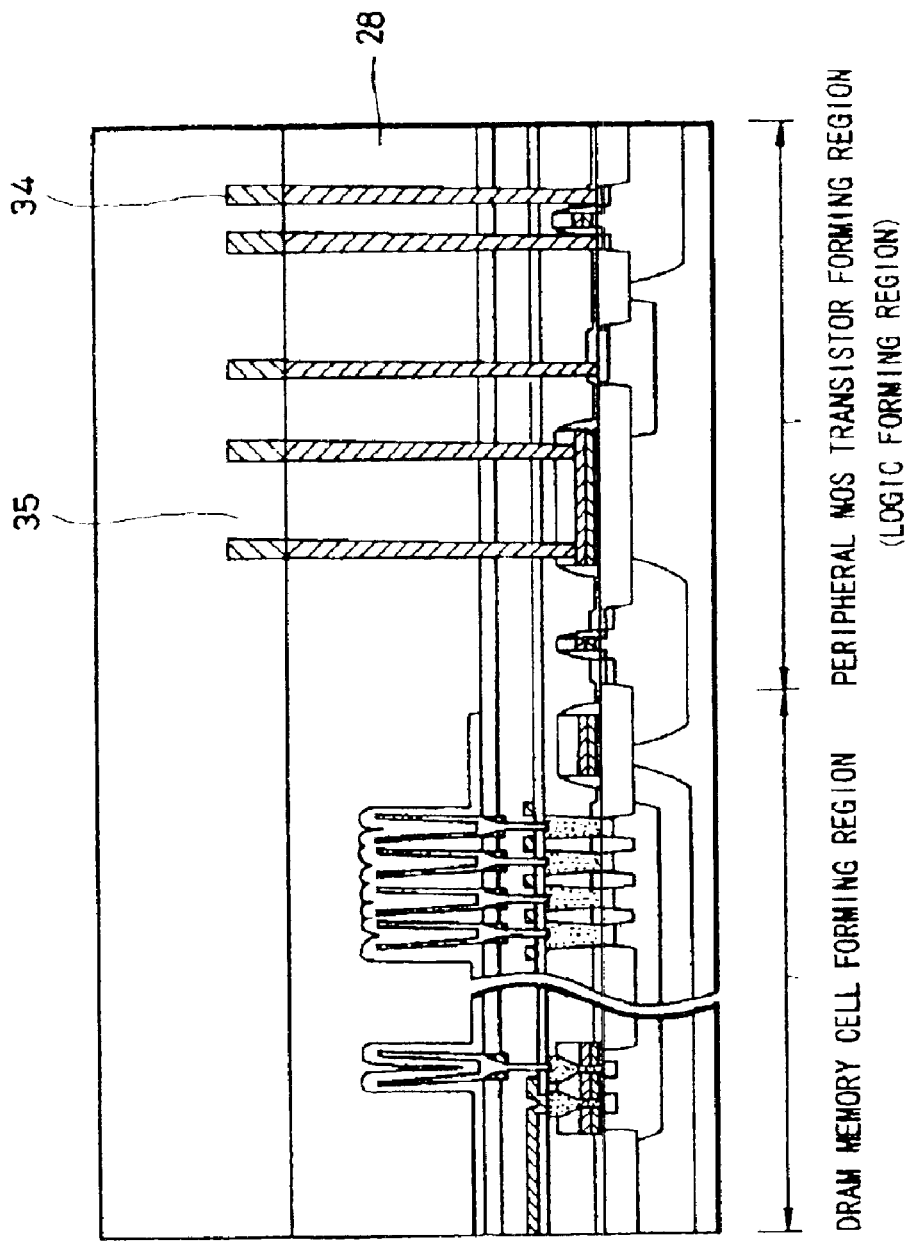
FIG. 35 is a cross-section of the device during one embodiment of the manufacturing method of the invention (step 28)

As shown in FIG. 35, a first-layer metal wiring layer 34 to be electrically connected to the first metal electrodes 33 is formed. Stacked as the first-layer metal wiring layer 34 are, for example: a titanium layer of a thickness from 3 nm to 50 nm; a titanium nitride film to be used as a barrier metal of a thickness from 10 nm to 50 nm (10 nm is shown); an aluminum wiring layer which is 200 nm to 800 nm thick (400 nm is shown) and contains copper; a titanium layer of a thickness from 3 nm to 10 nm (5 nm is shown); and a titanium nitride film of a thickness from 10 nm to 100 nm (70 nm is shown), for example, by sputtering or CVD. The aluminum wiring layer containing copper may be replaced with another material such as aluminum wiring or copper wiring, for example. After forming a silicon oxide film to be used as a fifth inter-layer insulating film 35 with a thickness of 500 nm to 2000 nm (2000 nm is shown) on the first-layer metal wiring layer 34, it is smoothed by etch-back process using CMP.

Figure 36:
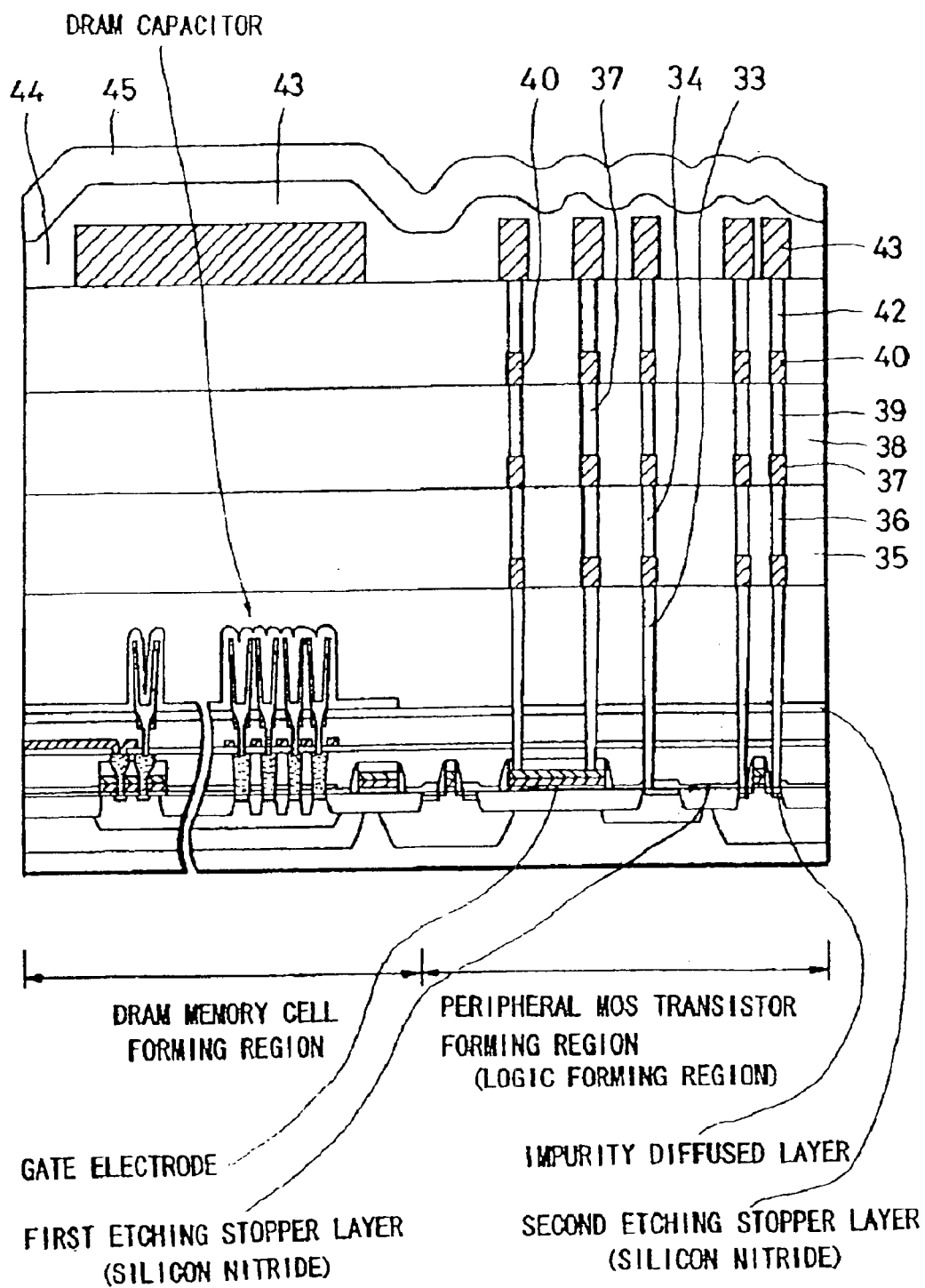
FIG. 36 is a cross-section of the device during one embodiment of the manufacturing method of the invention (step 29)

FIG. 36 shows a cross-sectional configuration of the device under a step subsequent to the step shown in FIG. 35. As shown in FIG. 36, similarly to formation of the first metal electrodes 33, first-layer metal wiring layer 34 and fifth inter-layer insulating film 35, second metal electrodes 35, second-layer metal wiring layer 37, sixth inter-layer insulating film 38, third metal electrodes 39, third-layer metal wiring layer 40, seventh inter-layer insulating film 41, fourth metal electrodes 42, fourth-layer metal wiring layer 43, and eighth inter-layer insulating film 44 are sequentially stacked. After stacking a silicon nitride film with a thickness from 500 nm to 1500 nm (700 nm is shown), for example, as an overcoat film 45, apertures (not shown) are selectively formed in portions of the fourth-layer metal wiring layer 43 to be used as pads.

In the embodiment shown here, heretofore explained is a method configured to separately open the contact holes onto the gate electrode layer in the peripheral MOS transistor forming region and the contact holes above the impurity diffusion layer. However, they can be opened simultaneously. When they are opened separately, the order of the opening steps may be first opening from above the impurity diffusion layer and subsequently opening above the gate electrode wiring.

Figure 38:
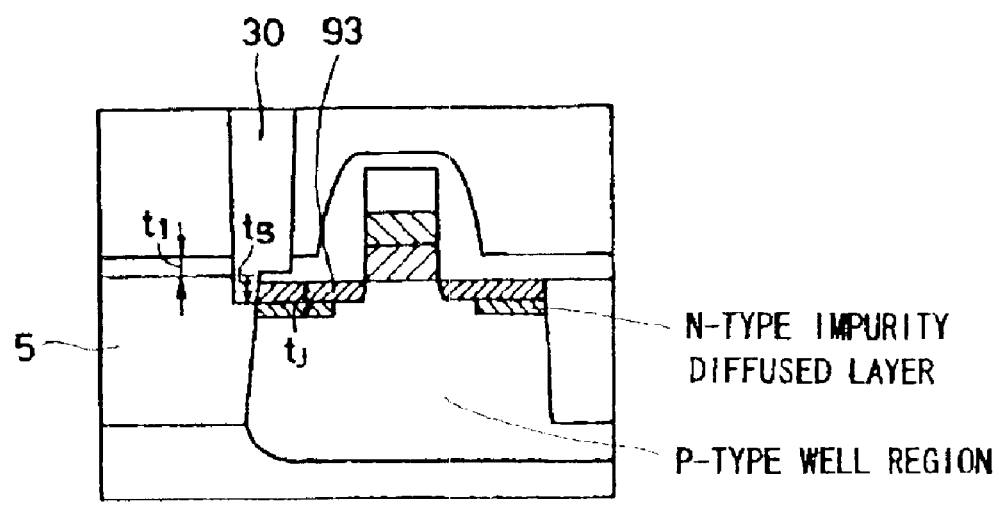
FIG. 38 is a cross-section of the device of one embodiment of the invention.

According to the embodiment of the invention, as shown in FIG. 38, even when the aperture portions to be buried with electrode layers for connection to metal wiring layers are formed above boundaries between the impurity diffusion layers and the device isolation insulating film, for example, since the etching is controlled (once stopped) by the second etching stopper layer and the first etching stopper layer, depth $t_s$ of excavation of the device isolation insulating film never becomes larger than the junction depth $t_j$ of the impurity diffusion layer. Therefore, junction leakage can be reduced. Thickness $t_1$ of the first etching stopper layer is the minimum thickness enough to bury the DRAM memory cells. Therefore, the thickness $t_1$ of the first etching stopper layer becomes larger than the excavation $t_s$ of the device isolation insulating film corresponding to the over-etching amount in the etching process of the first etching stopper layer.

Figure 1:
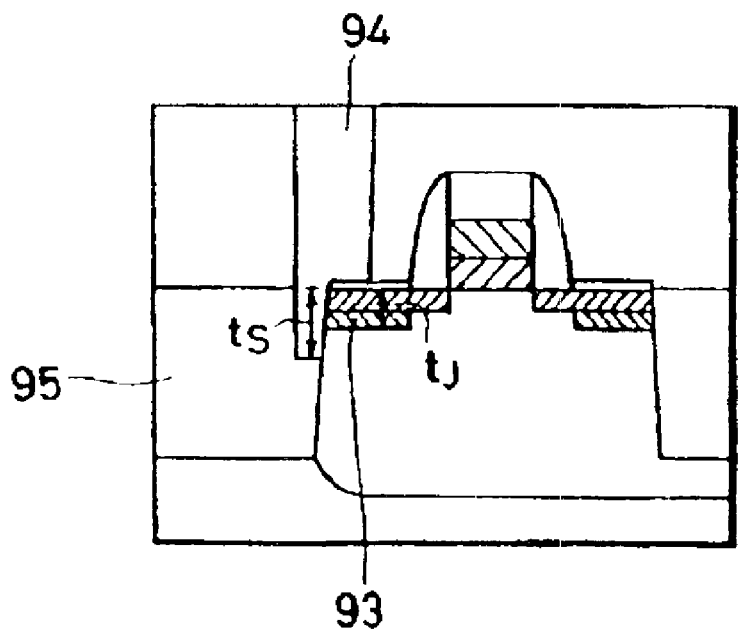
FIG. 1 is a cross-section of a conventional semiconductor device.

As a comparative example, a technique not employing the configuration and method of the present invention is explained with reference to FIG. 1. As shown in FIG. 1, if excavation $t_s$ of the device isolation insulating film is larger than the junction depth $t_j$ of the impurity diffusion layer, the impurity diffusion layer and a well region are short-circuited through the electrode layer connected to the metal wiring layer.

According to the embodiment of the invention, as shown in FIG. 39, even when the apertures buried with the electrode layer connected to the metal wiring layer are formed on the boundary between the gate electrode layer and the side wall insulating film, for example, since the etching is controlled by the second etching stopper layer and the first etching stopper layer, excavation $t_s$ never becomes larger than the depth $t_L$ of the device isolation insulating film.

Figure 2:
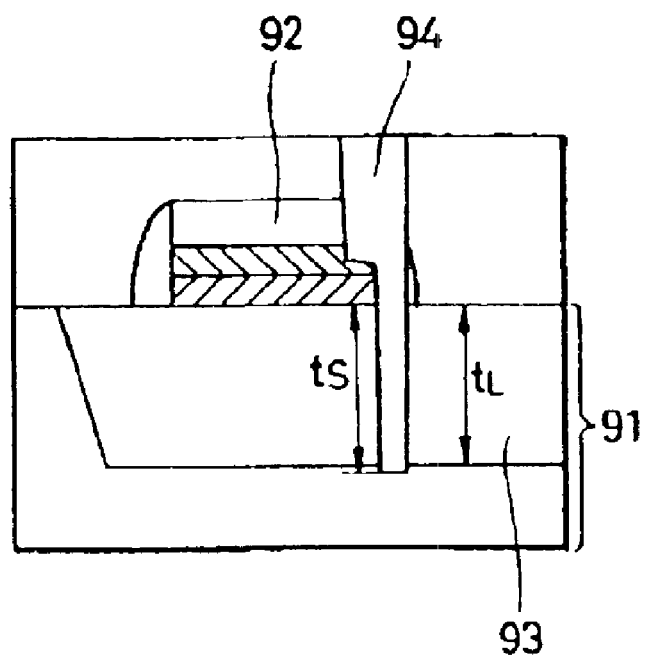
FIG. 2 is a cross-section of a conventional semiconductor device.
Figure 3A:
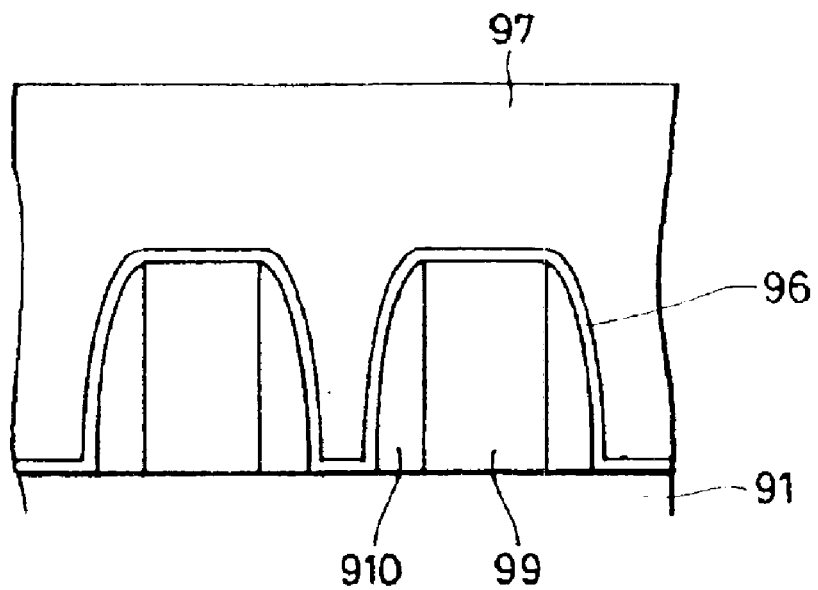
FIGS. 3A and 3B are cross-sections of a conventional semiconductor device.
Figure 3B:
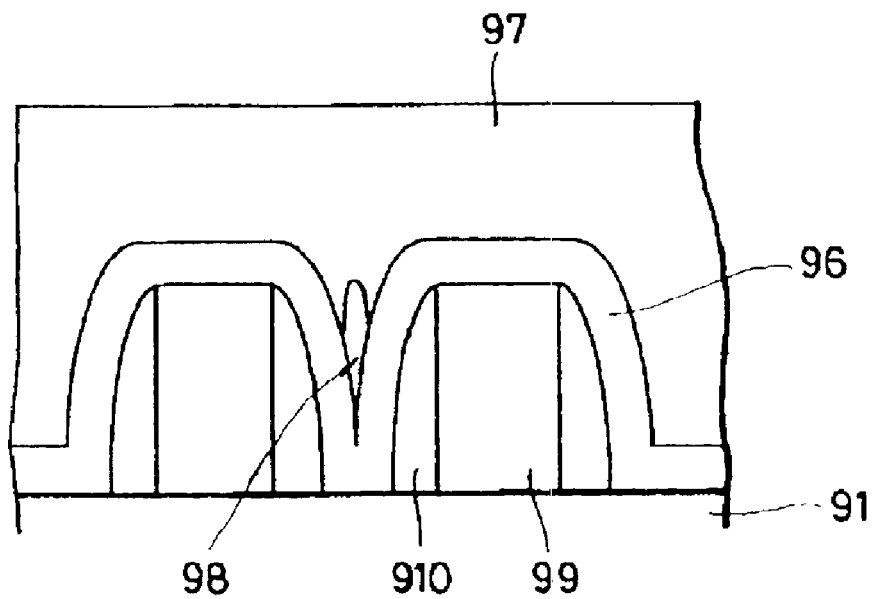

As a comparative example, a technique not employing the structure and method according to the invention is explained with reference to FIG. 2. As shown in FIG. 2, if excavation $t_s$ of the device isolation insulating film is larger than the depth $t_L$ of the device isolation insulating film, the gate electrode and a well region are short-circuited through the electrode layer connected to the metal wiring layer.

Although the invention has been explained above by way of embodiments thereof, the invention can be modified in various modes not limited to those embodiments. For example, as to the peripheral MOS transistor, explanation has been made for taking a MOS transistor forming a logic circuit connected to a memory function by forming it around a memory cell. However, the invention is not limited to such configuration, and similar effects can be obtained with any MOS transistors such as MOS transistor forming a part of the function of DRAM itself outside a memory cell or MOS transistor forming a DRAM cell, for example, in which levels of its components are relatively low unlike the DRAM memory portion.

Further, regarding the position for making the second etch-back stopper film, it may be any of three positions by (1) a method of making it between the inter-layer insulating film formed directly above the word line and the inter-layer insulating film formed in the portion of the bit line; (2) a method of making it before formation of the capacitor (on the inter-layer insulating film formed in the portion of the bit line); and (3) a method of making it after formation of the capacitor (on the inter-layer insulating film formed in the portion of the bit line).

Additionally, although the foregoing embodiments have been explained as burying voids between gates of adjacent memory cell transistors (word line), the invention is advantageously applicable to burying recesses formed between various patterns which are patterned by anisotropic etch-back technique similarly to gate electrodes, wiring layers, etc. other than word lines, and its application is not limited to spaces between word lines.

Further, regarding the material of the etch-back stopper, any appropriate material can be used taking the inter-layer insulating film used and the etchant gas used into consideration. Typically, however, it should be recommended to use an insulating film. When a conductive film is used, it is indispensable to remove it after it is used as an etching stopper film. However, its removal is not easy, and even with all efforts it may remain non-removed at portion with a level difference or side portions of side walls, and the remaining conductive film may cause short-circuiting in an later step. Additionally, even when selecting a material usable as an etching stopper from insulating film materials, in order to use it inside microminiaturized recent semiconductor devices, it is preferably selected from materials having low dielectric constants, not to degrade their high-speed performances and to enable a decrease of the inter-wiring capacitance.

In addition to the embodiments heretofore explained, other major embodiments of the invention are summarized below.

(1) A semiconductor device includes a DRAM memory cell and a peripheral MOS transistor. An insulating film is formed as a first etching stopper layer to cover a surface including a gate electrode of the peripheral MOS transistor. A second etching stopper layer is formed in at least one of upper and lower levels of a capacitor section of said DRAM memory cell. The impurity diffusion layer and said gate electrode of said peripheral MOS transistor are connected to a metal wiring layer formed in an upper level of said capacitor section of said DRAM memory cell by an electrode layer extending through the first etching stopper layer and the second etching stopper. At least one of such impurity diffusion layers is connected to the electrode layer at a boundary between the impurity diffusion layer and a device isolation insulating film. Depth of a bottom portion of the electrode layer formed on the device isolation insulating film from a surface of the impurity diffusion layer is shorter than one of junction depth of the impurity diffusion layer and thickness of the first etching stopper layer.

(2) A semiconductor device includes a DRAM memory cell and a peripheral MOS transistor. An insulating film is formed as a first etching stopper layer to cover a surface including a gate electrode of the peripheral MOS transistor.

A second etching stopper layer is formed in at least one of upper and lower levels of a capacitor section of the DRAM memory cell. The impurity diffusion layer and the gate electrode of the peripheral MOS transistor are connected to a metal wiring layer formed in an upper level of the capacitor section of the DRAM memory cell by an electrode layer extending through the first etching stopper layer and the second etching stopper. At least one of such impurity diffusion layers is connected to the electrode layer at a boundary between the impurity diffusion layer and a device isolation insulating film. Depth of a bottom portion of said electrode layer formed on said device isolation insulating film from a surface of the impurity diffusion layer is shorter than thickness of the first etching stopper layer.

(3) A semiconductor device includes a DRAM memory cell and a peripheral MOS transistor. An insulating film is formed as a first etching stopper layer to cover a surface including a gate electrode of the peripheral MOS transistor. A second etching stopper layer is formed in at least one of upper and lower levels of a capacitor section of the DRAM memory cell. The impurity diffusion layer and the gate electrode of the peripheral MOS transistor are connected to a metal wiring layer formed in an upper level of the capacitor section of the DRAM memory cell by an electrode layer extending through the first etching stopper layer and the second etching stopper. A side wall forming layer of said peripheral MOS transistor and the first etching stopper layer are stacked to form a multi-layered film on a word transistor in a region for the DRAM memory cell. The multi-layered film of the side wall forming layer of the peripheral MOS transistor and the first etching stopper layer has a thickness of ¼ to ½ of the minimum distance between word transistors in the region for the DRAM memory cell.

(4) A semiconductor device includes a DRAM memory cell and a peripheral MOS transistor. An insulating film is formed as a first etching stopper layer to cover a surface including a gate electrode of the peripheral MOS transistor. A second etching stopper layer is formed in at least one of upper and lower levels of a capacitor section of the DRAM memory cell. The impurity diffusion layer and the gate electrode of the peripheral MOS transistor are connected to a metal wiring layer formed in an upper level of the capacitor section of the DRAM memory cell by an electrode layer extending through the first etching stopper layer and the second etching stopper. A side wall forming layer of the peripheral MOS transistor and the first etching stopper layer are stacked to form a multi-layered film on a word transistor in a region for the DRAM memory cell. The multi-layered film of the side wall forming layer of the peripheral MOS transistor and the first etching stopper layer has a thickness of ¼ to ⅓ of the minimum distance between word transistors in the region for the DRAM memory cell.

(5) In the semiconductor device including a DRAM memory cell and a peripheral MOS transistor summarized in (3) above, an insulating film is formed as a first etching stopper layer to cover a surface including a gate electrode of the peripheral MOS transistor. A second etching stopper layer is formed in at least one of upper and lower levels of a capacitor section of the DRAM memory cell. A side wall forming layer of the peripheral MOS transistor and the first etching stopper layer are stacked to form a multi-layered film on a word transistor in a region for the DRAM memory cell. The multi-layered film of the side wall forming layer of the peripheral MOS transistor and the first etching stopper layer has a thickness of ¼ to ½ of the minimum distance between word transistors in the region for the DRAM memory cell.

(6) A semiconductor device includes a DRAM memory cell and a peripheral MOS transistor. An insulating film is formed as a first etching stopper layer to cover a surface including a gate electrode of the peripheral MOS transistor. A second etching stopper layer is formed in at least one of upper and lower levels of a capacitor section of the DRAM memory cell. The impurity diffusion layer and the gate electrode of the peripheral MOS transistor are connected to a metal wiring layer formed in an upper level of the capacitor section of the DRAM memory cell by an electrode layer extending through the first etching stopper layer and the second etching stopper. At least one of gate electrodes of the peripheral MOS transistor is connected to the electrode layer extending through the etching stopper layers at a boundary between the gate electrode and a side wall insulating film formed on a side wall of the gate electrode. Depth of a bottom portion of the electrode layer formed on the side wall insulating film a surface of the device isolation insulating film is shorter than the depth of the bottom portion of the device isolation insulating film.

(7) In the semiconductor device including a DRAM memory cell and a peripheral MOS transistor summarized in (1) above, thickness of the second etching stopper layer is thicker than the thickness of the first etching stopper layer.

(8) In the semiconductor device including a DRAM memory cell and a peripheral MOS transistor summarized in (2) above, thickness of the second etching stopper layer is thicker than the thickness of the first etching stopper layer.

(9) In the semiconductor device including a DRAM memory cell and a peripheral MOS transistor summarized in (3) above, thickness of the second etching stopper layer is thicker than the thickness of the first etching stopper layer.

(10) In the semiconductor device including a DRAM memory cell and a peripheral MOS transistor summarized in (4) above, thickness of the second etching stopper layer is thicker than the thickness of the first etching stopper layer.

(11) In the semiconductor device including a DRAM memory cell and a peripheral MOS transistor summarized in (5) above, thickness of the second etching stopper layer is thicker than the thickness of the first etching stopper layer.

(12) In the semiconductor device including a DRAM memory cell and a peripheral MOS transistor summarized in (6) above, thickness of the second etching stopper layer is thicker than the thickness of the first etching stopper layer.

(13) A manufacturing method of a semiconductor having a DRAM memory cell and a peripheral MOS transistor comprises the steps of: making a word transistor of the aid DRAM memory cell and the peripheral MOS transistor on a semiconductor substrate having formed a device isolation insulating film and device forming regions; stacking an inter-layer insulating film different from the first etching stopper layer on the first etching stopper layer to smooth the entirety by burying a space between word transistors of the DRAM memory cells; forming a second etching stopper layer on the inter-layer insulating film; forming a capacitor of the DRAM memory cell on the second etching stopper layer; forming an insulating film on the capacitor; forming an aperture on the insulating film by etching, and interrupting the etching at the second etching stopper layer; removing the second etching stopper layer and the inter-layer insulating film from the aperture by etching, and interrupting the etching at the first etching stopper layer; removing the first etching stopper layer from the aperture by etching, forming at least one of such apertures on a boundary between the impurity diffusion layer and the device isolation insulating film, and adjusting the depth of the bottom of the aperture from an upper surface of the device isolation insulating film smaller than the junction depth of the impurity diffusion layer; forming an electrode layer inside the aperture; and forming a metal wiring layer connected to the electrode layer.

(14) A manufacturing method of a semiconductor having a DRAM memory cell and a peripheral MOS transistor comprises the steps of: making a word transistor of the DRAM memory cell and the peripheral MOS transistor on a semiconductor substrate having formed a device isolation insulating film and device forming regions; stacking an inter-layer insulating film different from the first etching stopper layer on the first etching stopper layer to smooth the entirety by burying a space between word transistors of the DRAM memory cells; forming a second etching stopper layer on the inter-layer insulating film; forming a capacitor of the DRAM memory cell on the second etching stopper layer; forming an insulating film on the capacitor; forming an aperture on the insulating film by etching, and interrupting the etching at the second etching stopper layer; removing the second etching stopper layer and the inter-layer insulating film from the aperture by etching, and interrupting the etching at the first etching stopper layer; removing the first etching stopper layer from the aperture by etching, forming at least one of such apertures on a boundary between the impurity diffusion layer and the device isolation insulating film, and adjusting the depth of the bottom of the aperture from an upper surface of the device isolation insulating film smaller than a depth of the first stopper layer; forming an electrode layer inside the aperture; and forming a metal wiring layer connected to the electrode layer.

(15) A manufacturing method of a semiconductor having a DRAM memory cell and a peripheral MOS transistor comprises the steps of: making a gate electrode of a word transistor of the DRAM memory cell and a gate electrode of the peripheral MOS transistor on a semiconductor substrate having formed a device isolation insulating film and device forming regions; stacking an insulating film which covers the gate electrode of the word transistor of the DRAM memory cell and the gate electrode of said peripheral MOS transistor and becomes a side wall forming layer, then conducting anisotropic of the side wall forming region only in a region for making the peripheral MOS transistor to form a side wall on a gate side wall of the peripheral MOS transistor and to maintain the side wall forming layer in a region for making the DRAM memory cell; forming an insulating film to be used as a first etching stopper layer on an impurity diffusion region and a gate electrode in the region of the peripheral MOS transistor region such that thickness of a multi-layered film of the side wall forming layer and the first etching stopper layer becomes a thickness of ¼ to ½ of the minimum distance between word transistors of the DRAM memory cells; stacking an inter-layer insulating film different from the first etching stopper layer on the first etching stopper layer to smooth the entirety by burying a space between word transistors of the DRAM memory cell; forming a second etching stopper layer on said inter-layer insulating film; forming a capacitor of the DRAM memory cell on the second etching stopper layer; forming an insulating film on the capacitor; forming an aperture on the insulating film by etching, and interrupting the etching at the second etching stopper layer; removing the second etching stopper layer and the inter-layer insulating film from the aperture by etching, and interrupting the etching at the first etching stopper layer; removing the first etching stopper layer from the aperture by etching; forming an electrode layer; inside the aperture; and forming a metal writing layer connected to the electrode layer.

(16) In the manufacturing method of a semiconductor having a DRAM memory cell and a peripheral MOS transistor summarized in (15) above, the insulating film to be used as the first etching stopper layer is adjusted in thickness such that The multi-layered film of the side wall forming layer of the peripheral MOS transistor and the first etching stopper layer has a thickness of ¼ to ⅓ of the minimum distance between word transistors in the region for the DRAM memory cell.

(17) A manufacturing method of a semiconductor having a DRAM memory cell and a peripheral MOS transistor comprises the steps of: making a word transistor of the DRAM memory cell and the peripheral MOS transistor on a semiconductor substrate having formed a device isolation insulating film and device forming regions; stacking an inter-layer insulating film different from the first etching stopper layer on the first etching stopper layer to smooth the entirety by burying a space between word transistors of the DRAM memory cells; forming a second etching stopper layer on the inter-layer insulating film; forming a capacitor of the DRAM memory cell on said second etching stopper layer; forming an insulating film on the capacitor; forming an aperture on the insulating film by etching, and interrupting the etching at the second etching stopper layer; removing the second etching stopper layer and the inter-layer insulating film from the aperture by etching, and interrupting the etching at the first etching stopper layer; removing the first etching stopper layer from the aperture by etching, forming at least one of such apertures on a boundary between the gate electrode and the side wall insulating film, and adjusting the depth of the bottom of the aperture formed on the side wall insulating film from an upper surface of the device isolation insulating film smaller than depth of the device isolation insulating film; forming an electrode layer inside the aperture; and forming a metal wiring layer connected to the electrode layer.

(18) A manufacturing method of a semiconductor having a DRAM memory cell and a peripheral MOS transistor comprises the steps of: making a word transistor of the DRAM memory cell and the peripheral MOS transistor on a semiconductor substrate having formed a device isolation insulating film and device forming regions; forming an insulating film to be used as a first etching stopper layer on an impurity diffusion region and a gate electrode in the region of the peripheral MOS transistor region; stacking an inter-layer insulating film different from the first etching stopper layer on the first etching stopper layer to smooth the entirety by burying a space between word transistors of the DRAM memory cell; forming a second etching stopper layer on the inter-layer insulating film; forming a capacitor of the DRAM memory cell on the second etching stopper layer; forming an insulating film on the capacitor; forming a first aperture on the insulating film to the gate electrode of the peripheral MOS transistor, and once interrupting the etching at the second etching stopper layer; removing the second etching stopper layer and the inter-insulating film from the first aperture, and once stopping the etching at the first etching stopper layer; removing the first etching stopper layer from the first aperture by etching; forming a second aperture on the insulating film on the capacitor and on an impurity diffusion region of the peripheral MOS transistor, and once stopping the etching at the second etching stopper layer; removing the second etching stopper layer and the inter-layer insulating film from the second aperture, and once stopping the etching at the etching stopper layer; removing the first etching stopper layer from the second aperture by etching; forming an electrode layer in the first aperture and the second aperture; and forming a metal wiring layer connected to the electrode layer.

(19) A manufacturing method of a semiconductor having a DRAM memory cell and a peripheral MOS transistor comprises the steps of: making a word transistor of the DRAM memory cell and the peripheral MOS transistor on a semiconductor substrate having formed a device isolation insulating film and device forming regions; forming an insulating film to be used as a first etching stopper layer on an impurity diffusion region and a gate electrode in the region of the peripheral MOS transistor region; stacking an inter-layer insulating film different from the first etching stopper layer on the first etching stopper layer to smooth the entirety by burying a space between word transistors of the DRAM memory cell; forming a second etching stopper layer on the inter-layer insulating film; forming a capacitor of the DRAM memory cell on the second etching stopper layer; forming an insulating film on the capacitor; forming a first aperture on the insulating film to the gate electrode of the peripheral MOS transistor, and once interrupting the etching at the second etching stopper layer; removing the second etching stopper layer and the inter-insulating film from the first aperture, and once stopping the etching at the first etching stopper layer; removing the first etching stopper layer from the first aperture; forming a second aperture on the insulating film on the capacitor and on an impurity diffusion region of the peripheral MOS transistor, and once stopping the etching at the second etching stopper layer; removing the second etching stopper layer and the inter-layer insulating film from the second aperture, and once stopping the etching at the etching stopper layer; removing the first etching stopper layer from the second aperture; forming an electrode layer in the second aperture; and forming a metal wiring layer connected to the electrode layer.

(20) A manufacturing method of a semiconductor having a DRAM memory cell and a peripheral MOS transistor comprises the steps of: making a word transistor of the DRAM memory cell and the peripheral MOS transistor on a semiconductor substrate having formed a device isolation insulating film and device forming regions; forming an insulating film to be used as a first etching stopper layer on an impurity diffusion region and a gate electrode in the region of the peripheral MOS transistor region; stacking an inter-layer insulating film different from the first etching stopper layer on the first etching stopper layer to smooth the entirety by burying a space between word transistors of the DRAM memory cell; forming a second etching stopper layer on the inter-layer insulating film; forming an insulating film removable by isotropic etching on the second etching stopper layer; selectively forming an aperture in the insulating film removable by isotropic etching, and forming a capacitor lower electrode of the DRAM memory cell inside a guide aperture; removing the insulating film removable by isotropic etching, using the second etching stopper layer on a stopper of isotropic etching; forming a capacitor dielectric film and a capacitor upper electrode on the capacitor lower electrode; forming an insulating film on the capacitor upper electrode; forming an aperture on the insulating film, and once stopping the etching at the second etching stopper layer; removing the second etching stopper layer and the inter-layer insulating film from the aperture by etching, and once stopping the etching at the first etching stopper layer; removing the first etching stopper layer from the aperture by etching; forming an electrode layer in the aperture; and forming a metal wiring layer connected to the electrode layer.

(21) A manufacturing method of a semiconductor having a DRAM memory cell and a peripheral MOS transistor comprises the steps of: making a gate electrode of a word transistor of the DRAM memory cell and a gate electrode of the peripheral MOS transistor on a semiconductor substrate having formed a device isolation insulating film and device forming regions; forming an insulating film to be used as a first etching stopper layer on an impurity diffusion region and a gate electrode in the region of the peripheral MOS transistor region; stacking an inter-layer insulating film different from the first etching stopper layer on the first etching stopper layer to smooth the entirety by burying a space between word transistors of the DRAM memory cell; forming an aperture in the inter-layer insulating film formed on the DRAM memory cell, and forming an electrode layer connecting to an impurity diffusion region of the DRAM memory cell; forming an inter-layer insulating film covering the electrode layer, and forming a second etching stopper layer on the inter-insulating film; forming an aperture in a location of the second etching stopper layer on the electrode layer connecting to the impurity diffusion region of the DRAM memory cell; forming an etching mask having a smaller contact hole diameter than the aperture by forming a side wall on side walls of the aperture, and forming an aperture on the electrode layer connecting to the impurity diffusion region of the DRAM memory cell by etching using the etching mask; forming a DRAM capacitor connected to the impurity diffusion region of the DRAM memory cell through the aperture on the electrode layer; forming an insulating film on the capacitor; forming an aperture in the insulating film on the capacitor, and in that process, once stopping the etching at the second etching stopper layer; removing the second etching stopper layer and the inter-insulating film from the aperture, and once stopping the etching at the first etching stopper layer; removing the first etching stopper layer from the aperture by etching; forming an electrode layer in the aperture; and forming a metal wiring layer connected to the electrode layer.

(22) A manufacturing method of a semiconductor having a DRAM memory cell and a peripheral MOS transistor comprises the steps of: making a word transistor of the DRAM memory cell and the peripheral MOS transistor on a semiconductor substrate having formed a device isolation insulating film and device forming regions; forming an insulating film to be used as a first etching stopper layer on an impurity diffusion region and a gate electrode in the region of the peripheral MOS transistor region; stacking an inter-layer insulating film different from the first etching stopper layer on the first etching stopper layer to smooth the entirety by burying a space between word transistors of the DRAM memory cell; forming an aperture in the inter-layer insulating film formed on the DRAM memory cell, and forming an electrode layer connecting to an impurity diffusion region of the DRAM memory cell; forming an inter-layer insulating film covering the electrode layer; forming a second etching stopper layer on the inter-insulating film; forming an aperture in a location of the second etching stopper layer on the electrode layer connecting to the impurity diffusion region of the DRAM memory cell; forming an etching mask having a smaller contact hole diameter than the aperture by forming a side wall on side walls of the aperture, and forming an aperture on the electrode layer connecting to the impurity diffusion region of the DRAM memory cell by etching using the etching mask; forming a DRAM capacitor connected to the impurity diffusion region of the DRAM memory cell through the aperture; forming a capacitor dielectric film and a capacitor upper electrode on a capacitor lower electrode, and removing at least a part of the second etching stopper layer in the etching process of the capacitor upper electrode; form a third etching stopper layer on the capacitor lower electrode of the DRAM memory cell; forming an insulating film on the third etching stopper layer; forming an aperture on the insulating film, and once stopping the etching at the third etching stopper layer; removing the third etching stopper layer and the inter-layer insulating film from the aperture, and once stopping the etching at the first etching stopper layer; removing the first etching stopper layer from the aperture; forming an electrode layer in the aperture; and forming a metal wiring layer connected to the electrode layer.

As described above, the semiconductor device and its manufacturing method according to invention can prevent over-etching of a semiconductor substrate and can prevent or minimize junction leakage by stopping an etching at a multi-layered etching stopper layer optimizing its respective component layers in thickness.

By the use of a burying process of DRAM cells which uses etching stopper layers optimized in thickness, generation of voids, which typically occurs in DRAM cells upon burying spaces between word transistors with an inter-layer insulating layer, can be prevented. Therefore, self-aligned contacts in DRAM cells can be made reliably without inviting short-circuit via voids.

The etching stopper formed under a DRAM cell can be commonly used as an etching mask upon making contacts connecting DRAM cell capacitors and a substrate, and this contributes to significant reduction of process steps.

Further, The etching stopper under the DRAM cell can be commonly used also as an etching stopper upon making a cylinder-type capacitor, and this contributes to much more reduction of process steps.

The etching stopper formed under the DRAM cell functions to prohibit moisture from entering from the inter-layer insulating film above the DRAM cell. Therefore, a trench under the DRAM cell can be stabilized in property.

What is claimed is:

1. A semiconductor device including a DRAM memory cell and a peripheral MOS transistor, comprising:
    a first etching stopper layer covering at least one of an impurity diffusion layer and a gate electrode of said peripheral MOS transistor;
    a second etching stopper layer formed above at least a portion of said first etching stopper layer and separated from said first etching stopper layer by a distance;
    at least one of said impurity diffusion layer and said gate electrode of said peripheral MOS transistor being connected to a metal wiring layer formed in an upper level of a capacitor section of said DRAM memory cell by an electrode layer extending through said first etching stopper layer and said second etching stopper layer;
    said impurity diffusion layer being connected to said electrode layer at a boundary between said impurity diffusion layer and a device isolation insulating film;
    wherein a bottom portion of said electrode layer formed on said device isolation insulating film measured from a surface of said impurity diffusion layer has a length shorter than one of a junction depth of said impurity diffusion layer and a thickness of said first etching stopper layer.

2. A semiconductor device including a DRAM memory cell and a peripheral MOS transistor, comprising:
    a first etching stopper layer covering at least one of an impurity diffusion region and a gate electrode of said peripheral MOS transistor region;
    a second etching stopper layer formed above at least a portion of said first etching stopper layer and separated from said first etching stopper layer by a distance;
    at least one of said impurity diffusion layer and said gate electrode of said peripheral MOS transistor being connected to a metal wiring layer formed in an upper level of a capacitor section of said DRAM memory cell by an electrode layer extending through said first etching stopper layer and said second etching stopper layer;
    said impurity diffusion layer being connected to said electrode layer at a boundary between said impurity diffusion layer and a device isolation insulating film;
    wherein a bottom portion of said electrode layer formed on said device isolation insulating film measured from a surface of said impurity diffusion layer has a length shorter than a junction depth of said impurity diffusion layer.

3. A semiconductor device including a DRAM memory cell and a peripheral MOS transistor, comprising:
    a first etching stopper layer covering at least one of an impurity diffusion region and a gate electrode of said peripheral MOS transistor region;
    a second etching stopper layer formed above at least a portion of said first etching stopper layer and separated from said first etching stopper layer by a distance;
    at least one of said impurity diffusion layer and said gate electrode of said peripheral MOS transistor being connected to a metal wiring layer formed in an upper level of a capacitor section of said DRAM memory cell by an electrode layer extending through said first etching stopper layer and said second etching stopper;
    said impurity diffusion layer being connected to said electrode layer at a boundary between said impurity diffusion layer and a device isolation insulating film;
    wherein a bottom portion of said electrode layer formed on said device isolation insulating film measured from a surface of said impurity diffusion layer has a length shorter than a thickness of said first etching stopper layer.

4. A semiconductor device including a DRAM memory cell and a peripheral MOS transistor, comprising:
    a first etching stopper layer covering at least one of an impurity diffusion region and a gate electrode of said peripheral MOS transistor region;
    a second etching stopper layer formed above at least a portion of said first etching stopper layer and separated from said first etching stopper layer by a distance; and
    an electrode layer connected to a bit line of said DRAM memory cell through said second etching stopper layer;
    wherein a bottom portion of said electrode layer measured from a surface of said device isolation insulating film has a length shorter than a thickness of said device isolation insulating film.

5. A semiconductor device including a DRAM memory cell and a peripheral MOS transistor, comprising:
    a first etching stopper layer covering at least one of an impurity diffusion region and a gate electrode of said peripheral MOS transistor region;
    a second etching stopper layer formed above at least a portion of said first etching stopper layer and separated from said first etching stopper layer by a distance; and
    an electrode layer connected to a bit line of said DRAM memory cell through said second etching stopper layer;
    wherein a bottom portion of an electrode layer measured from a surface of said impurity diffusion region has a length shorter than a junction depth of said impurity diffusion region.

6. A semiconductor device comprising:

a device isolation insulating film including a unitary impurity diffusion layer;

a peripheral MOS transistor having a gate electrode mounted in communication with the impurity diffusion layer;

a first etching stopper layer covering the gate electrode of the peripheral MOS transistor;

a DRAM memory cell having a capacitor section;

a second etching stopper layer formed on the capacitor section of said DRAM memory cell; and an electrode layer connecting said unitary impurity diffusion layer and the gate electrode to a metal wiring layer formed in the capacitor section of the DRAM memory cell, said electrode layer extending through said first etching stopper layer and said second etching stopper layer, and adjoining said unitary impurity diffusion layer at a boundary between said unitary impurity diffusion layer and the device isolation insulating film;

wherein a bottom portion of said electrode layer has a length shorter than at least one of a junction depth of said unitary impurity diffusion layer and a thickness of said first etching stopper layer.

7. A semiconductor device as set forth in claim 6 wherein the bottom portion of said electrode layer has a length shorter than the junction depth of said impurity diffusion layer.

8. A semiconductor device as set forth in claim 7 wherein the bottom portion of said electrode layer has a length shorter than a thickness of said device isolation insulating film.

9. A semiconductor device as set forth in claim 7 wherein the bottom portion of said electrode layer has a length shorter than the thickness of said first etching stopper layer.

10. A semiconductor device as set forth in claim 7 wherein the bottom portion of said electrode layer has a length shorter than a thickness of said device isolation insulating film.

11. A semiconductor device as set forth in claim 6 wherein the bottom portion of said electrode layer has a length shorter than the thickness of said first etching stopper layer.

12. A semiconductor device as set forth in claim 6 further comprising a plurality of insulating films between said first etching stopper layer and said second etching stopper layer.

13. A semiconductor device as set forth in claim 6 further comprising a plurality of insulating films formed on said second etching stopper layer.

14. A semiconductor device including a DRAM memory cell and a peripheral MOS transistor, said device comprising:

a device isolation insulating film including a unitary impurity diffusion layer;

a first etching stopper layer covering a gate electrode of the peripheral MOS transistor;

a second etching stopper layer formed in a capacitor section of said DRAM memory cell; and an electrode connecting said impurity diffusion layer and the gate electrode to a metal wiring layer in the capacitor section of the DRAM memory cell, said electrode extending through said first etching stopper layer and said second stopper layer, and adjoining said impurity diffusion layer and the device isolation insulating film;

wherein a bottom portion of said electrode has a length shorter than at least one of a junction depth of said impurity diffusion layer and a thickness of said first etching stopper layer.

15. A semiconductor device comprising:

a device isolation insulating film including a unitary impurity diffusion layer;

a peripheral MOS transistor having a gate electrode mounted in communication with said impurity diffusion layer;

a first etching stopper layer covering at least the gate electrode of the peripheral MOS transistor;

a DRAM memory cell having a capacitor section;

a second etching stopper layer formed on the capacitor section of said DRAM memory cell; and an electrode layer connecting said unitary impurity diffusion layer and the gate electrode to a metal wiring layer formed in the capacitor section of the DRAM memory cell, said electrode layer extending through said first etching stopper layer and said second etching stopper layer, and adjoining said impurity diffusion layer at a boundary between said unitary impurity diffusion layer and the device isolation insulating film;

wherein a bottom portion of said electrode layer has a length shorter than at least one of a junction depth of said unitary impurity diffusion layer and a thickness of said first etching stopper layer; and wherein the distance between said first etching stopper layer and said second stopper layer is substantially uniform above at least a portion of said impurity diffusion layers.

16. A semiconductor device comprising:

a device isolation insulating film including a unitary impurity diffusion layer;

a peripheral MOS transistor having a gate electrode mounted in communication with said impurity diffusion layer;

a first etching stopper layer covering at least the gate electrode of the peripheral MOS transistor;

a DRAM memory cell having a capacitor section;

a second etching stopper layer formed on the capacitor section of said DRAM memory cell; and an electrode layer connecting said unitary impurity diffusion layer and the gate electrode to a metal wiring layer formed in the capacitor section of the DRAM memory cell, said electrode layer extending through said first etching stopper layer and said second etching stopper layer, and adjoining said impurity diffusion layer at a boundary between the unitary impurity diffusion layer and the device isolation insulating film;

wherein a bottom portion of said electrode layer has a length shorter than at least one of a junction depth of said unitary impurity diffusion layer and a thickness of said first etching stopper layer; and wherein the distance between said first etching stopper layer and said second stopper layer is substantially uniform above at least a portion of the gate electrode.

* * * * *

UNITED STATES PATENT AND TRADEMARK OFFICE
CERTIFICATE OF CORRECTION

PATENT NO. : 6,909,132 B2  Page 1 of 1
APPLICATION NO. : 10/350420
DATED : June 21, 2005
INVENTOR(S) : Ikuo Yoshihara and Wataru Futo It is certified that error appears in the above-identified patent and that said Letters Patent is hereby corrected as shown below:

Title Page

Item (75), replace "Wataro" with --Wataru--

Item (73) replace "Sony Corporation, Tokyo (JP)" with --Sony Corporation, Tokyo (JP) and Fujitsu Limited, Kanagawa (JP)--

Signed and Sealed this

Twenty-fourth Day of April, 2007

JON W. DUDAS
*Director of the United States Patent and Trademark Office*